US012568628B2

(12) United States Patent
Yamazaki et al.

(10) Patent No.: US 12,568,628 B2
(45) Date of Patent: Mar. 3, 2026

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Takayuki Ikeda, Atsugi (JP); Tatsuya Onuki, Atsugi (JP); Hitoshi Kunitake, Isehara (JP); Yasuhiro Jinbo, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 378 days.

(21) Appl. No.: 18/024,823

(22) PCT Filed: Sep. 16, 2021

(86) PCT No.: PCT/IB2021/058437
§ 371 (c)(1),
(2) Date: Mar. 6, 2023

(87) PCT Pub. No.: WO2022/069986
PCT Pub. Date: Apr. 7, 2022

(65) Prior Publication Data
US 2023/0320100 A1 Oct. 5, 2023

(30) Foreign Application Priority Data
Oct. 2, 2020 (JP) ................................. 2020-167679

(51) Int. Cl.
*H10B 51/20* (2023.01)
*H10B 53/20* (2023.01)

(52) U.S. Cl.
CPC ............. *H10B 51/20* (2023.02); *H10B 53/20* (2023.02)

(58) Field of Classification Search
CPC ........ H10B 51/20; H10B 53/20; H10B 51/30; H10B 51/10; H10D 30/021; H10D 30/67; H10D 30/701
(Continued)

(56) References Cited

U.S. PATENT DOCUMENTS 9,129,861 B2 9/2015 Seol et al.
9,257,572 B2 2/2016 Seol et al.
(Continued)

FOREIGN PATENT DOCUMENTS

CN 104659207 A 5/2015
CN 110832640 A 2/2020
(Continued)

OTHER PUBLICATIONS

International Search Report (Application No. PCT/IB2021/058437) Dated Nov. 30, 2021.
(Continued)

*Primary Examiner* — Fernando Hidalgo
(74) *Attorney, Agent, or Firm* — Eric J. Robinson; Robinson Intellectual Property Law Office, P.C.

(57) ABSTRACT

A memory device having large memory capacity is provided. A highly reliable memory device is provided. A semiconductor device includes a first conductive layer extending in a first direction, a structure body extending in a second direction intersecting with the first direction, a first insulating layer, and a second insulating layer. The structure body includes a functional layer, a semiconductor layer, a third insulating layer, and a second conductive layer. In an intersection portion of the first conductive layer and the structure body, the third insulating layer, the semiconductor layer, and the functional layer are placed concentrically around the second conductive layer in this order. The first insulating layer and the second insulating layer are stacked (Continued)

in the second direction. The functional layer and the first conductive layer are placed between the first insulating layer and the second insulating layer. The second conductive layer, the third insulating layer, and the semiconductor layer include a portion positioned inside a first opening provided in the first insulating layer and a portion positioned inside a second opening provided in the second insulating layer.

10 Claims, 32 Drawing Sheets

(58) Field of Classification Search
USPC ........................................................ 365/145
See application file for complete search history.

(56) References Cited

U.S. PATENT DOCUMENTS

| | | | |
|---|---|---|---|
| 9,269,721 B2 | 2/2016 | Seol et al. | |
| 9,287,167 B2 | 3/2016 | Seol et al. | |
| 9,356,044 B2 | 5/2016 | Seol et al. | |
| 9,362,487 B2 | 6/2016 | Inumiya et al. | |
| 9,466,613 B2 | 10/2016 | Seol et al. | |
| 9,478,560 B2 | 10/2016 | Seol et al. | |
| 10,593,693 B2 | 3/2020 | Yamazaki et al. | |
| 10,600,469 B2 | 3/2020 | Kimura et al. | |
| 10,651,195 B2 | 5/2020 | Lee et al. | |
| 10,665,604 B2 | 5/2020 | Kimura et al. | |
| 10,978,480 B2 | 4/2021 | Lee et al. | |
| 11,335,812 B2 | 5/2022 | Yamazaki et al. | |
| 11,374,012 B2 | 6/2022 | Asami | |
| 11,568,944 B2 | 1/2023 | Onuki et al. | |
| 11,682,667 B2 * | 6/2023 | Yamazaki | H10D 84/83 257/401 |
| 2004/0145024 A1 * | 7/2004 | Chen | H10B 43/30 257/E21.663 |
| 2014/0070290 A1 | 3/2014 | Inumiya et al. | |

| | | | |
|---|---|---|---|
| 2015/0054058 A1 | 2/2015 | Seol et al. | |
| 2015/0325586 A1 | 11/2015 | Seol et al. | |
| 2016/0071879 A1 | 3/2016 | Seol et al. | |
| 2019/0019801 A1 * | 1/2019 | Yoo | H01L 21/02189 |
| 2020/0203339 A1 | 6/2020 | Yamazaki et al. | |
| 2021/0312970 A1 | 10/2021 | Onuki et al. | |
| 2022/0020413 A1 * | 1/2022 | Tang | G11C 11/2255 |
| 2022/0068967 A1 | 3/2022 | Yamazaki et al. | |
| 2022/0102379 A1 * | 3/2022 | Liao | H10B 51/30 |
| 2022/0262438 A1 | 8/2022 | Yamazaki et al. | |
| 2022/0262858 A1 | 8/2022 | Yamazaki et al. | |
| 2022/0328487 A1 | 10/2022 | Kimura et al. | |
| 2022/0328516 A1 | 10/2022 | Yamazaki et al. | |
| 2022/0350571 A1 | 11/2022 | Yamazaki et al. | |
| 2022/0367509 A1 | 11/2022 | Yamazaki et al. | |
| 2022/0375521 A1 | 11/2022 | Yamazaki et al. | |
| 2022/0375956 A1 | 11/2022 | Kunitake et al. | |
| 2022/0399355 A1 | 12/2022 | Tsuda et al. | |
| 2022/0399370 A1 | 12/2022 | Sawai et al. | |
| 2022/0406347 A1 | 12/2022 | Yamazaki et al. | |
| 2023/0044659 A1 | 2/2023 | Godo et al. | |
| 2023/0065351 A1 | 3/2023 | Godo et al. | |

FOREIGN PATENT DOCUMENTS

| | | | |
|---|---|---|---|
| EP | 3483935 A | 5/2019 | |
| JP | 2014-053571 A | 3/2014 | |
| JP | 2015-099923 A | 5/2015 | |
| JP | 2018-207038 A | 12/2018 | |
| JP | 2019-087748 A | 6/2019 | |
| KR | 2015-0059114 A | 5/2015 | |
| KR | 2020-0019149 A | 2/2020 | |
| WO | WO-2019/003060 | 1/2019 | |

OTHER PUBLICATIONS

Written Opinion (Application No. PCT/IB2021/058437) Dated Nov. 30, 2021.

\* cited by examiner

FTJ_n — 103_n

102_m-1

FTJ_n-1 — 103_n-1

110A

102_4

FTJ_3 — 103_3

A1 — A2

B1 — B2

102_3 — 103_2

FTJ_2

102_2

FTJ_1 — 103_1

FTJ_n
CG_n

FTJ_n-1
CG_n-1

FTJ_3
CG_3

FTJ_2
CG_2

FTJ_1
CG_1

FIG. 17A
Intermediate state
New crystalline phase
| Amorphous | Crystalline | Crystal |
|---|---|---|
| •completely amorphous | •CAAC <br> •nc <br> •CAC <br><br> excluding single crystal and poly crystal | •single crystal <br> •poly crystal |
FIG. 17B
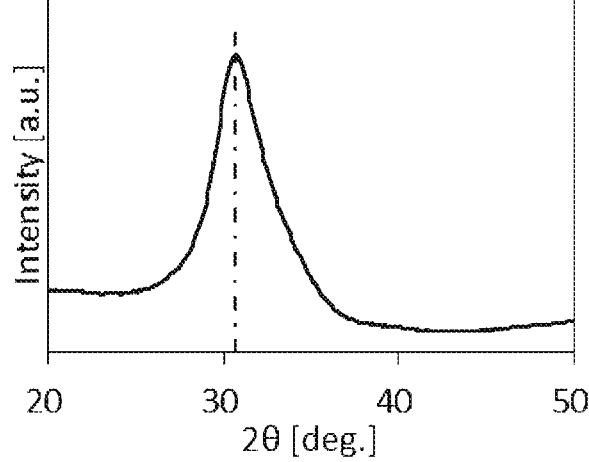
FIG. 17C
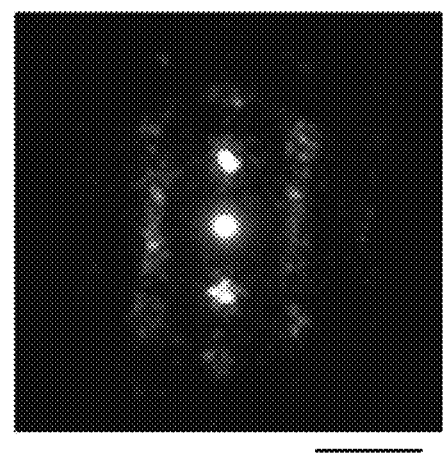
5nm⁻¹

1150A 400
1100

1150A

400

1100

1150B 400b
400a
1100

1150B

400b

400a

1100

1150C

}400b
}1100
}400a

1150C

}400b

}1100

}400a

FIG. 26A
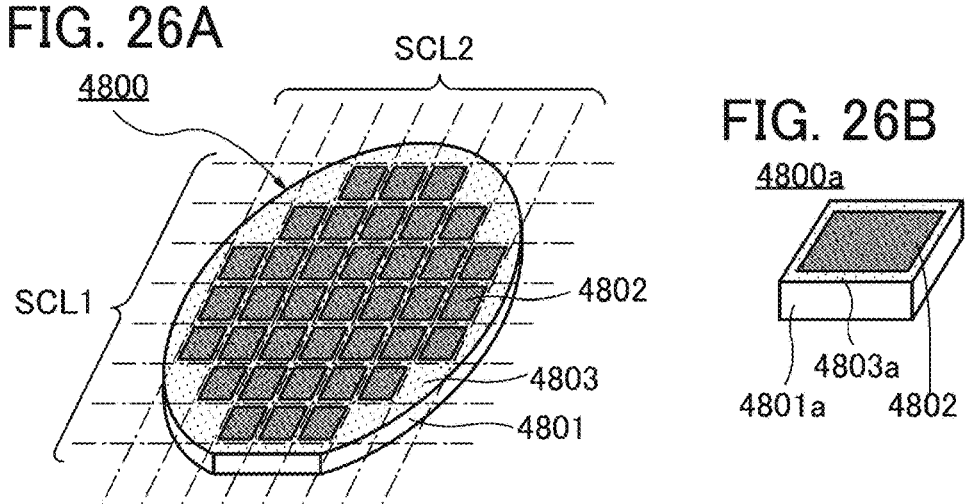
FIG. 26B
FIG. 26C
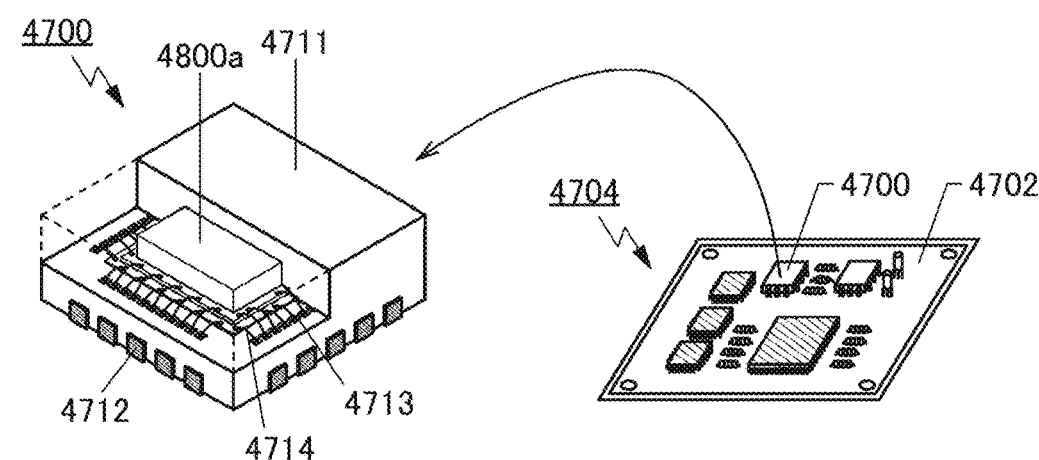
FIG. 26D
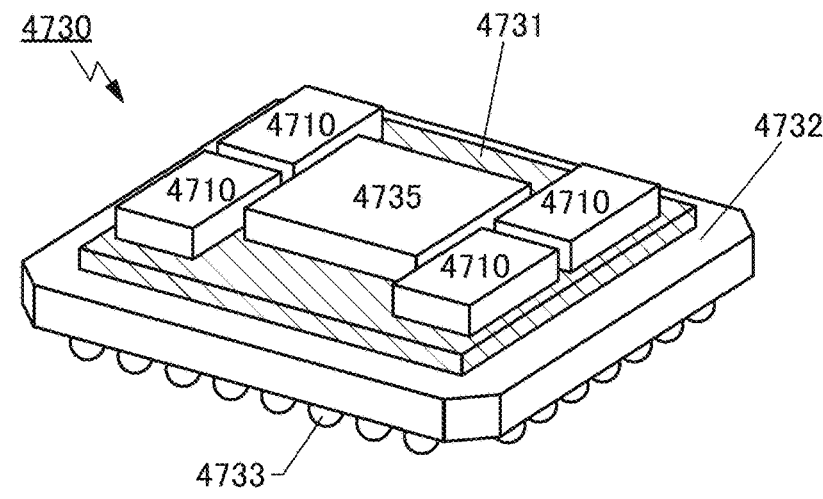

FIG. 27A
5500
5511
5510
4700
FIG. 27B
5900
5905
5902
5901
4700
5904
5903
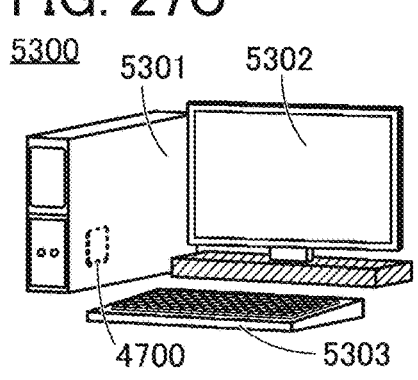
FIG. 27C
5300
5301
5302
4700
5303
FIG. 27D
5800
4700
5801
5802
5803
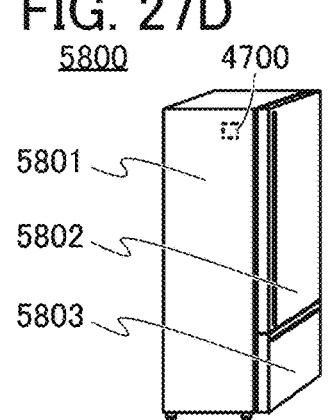
FIG. 27E
5200
5202
5203
4700
5201
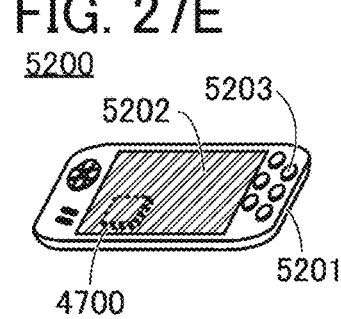
FIG. 27F
7500
7520
4700
7522
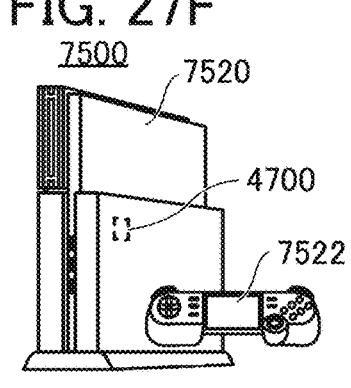
FIG. 27G
5700
4700
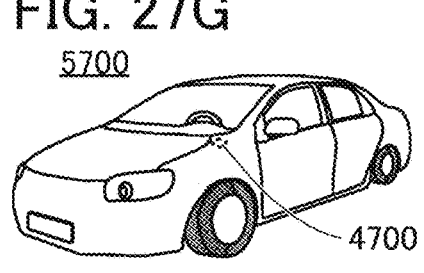
FIG. 27H
6240
6246
6244
4700
6241
6242
6243
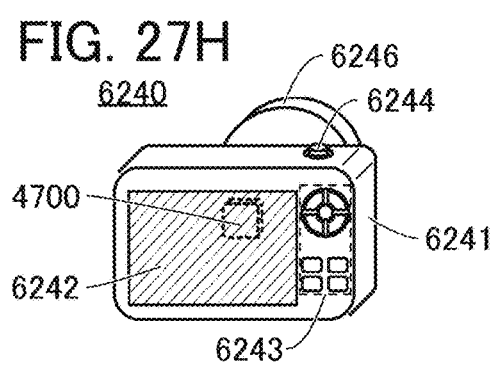
FIG. 27I
6300
4700
6304
6301
6306
6303
6302
6305
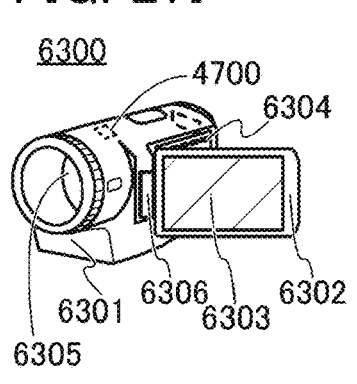
FIG. 27J
5400
5405
5406
5401
4700
5402
5404
5403
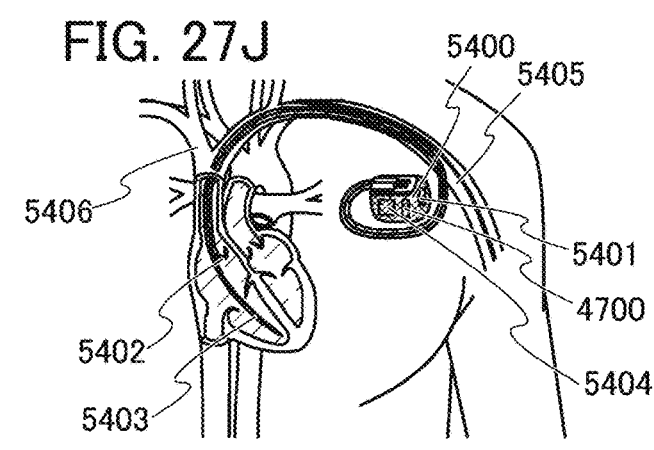

6100

6103   6106   4700

6102   6101   6104

5112   5110

5111

5110   5115

4700   5113

5150

5152

5151

5153   5156   5155   5152

4700

5610   5600   5620

5620   5621   5625   5630   5631   5624   5623

5625   5622   5621   5626   5627   5628   5624   5623   5629

<u>700</u>

IoT end device (endpoint microcomputer)
803

SEMICONDUCTOR DEVICE

TECHNICAL FIELD

One embodiment of the present invention relates to a semiconductor device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, electronic components such as central processing units (CPUs), graphics processing units (GPUs), memory devices, and sensors have been used in various electronic devices such as personal computers, smartphones, and digital cameras; the electronic components have been improved in various aspects such as miniaturization and low power consumption.

Memory devices with large memory capacity are especially required because the amount of data handled in the aforementioned electronic devices and the like has increased. As an example of a way to increase the memory capacity, Patent Document 1 and Patent Document 2 disclose a three-dimensional NAND memory element using a metal oxide in a channel formation region.

REFERENCES

Patent Documents

[Patent Document 1] PCT International Publication No. 2019/3060

[Patent Document 2] Japanese Published Patent Application No. 2018-207038

SUMMARY OF THE INVENTION

Problems to be Solved by the Invention

An object of one embodiment of the present invention is to provide a novel memory device. An object of one embodiment of the present invention is to provide a highly reliable memory device. An object of one embodiment of the present invention is to provide a memory device having large memory capacity. An object of one embodiment of the present invention is to at least reduce at least one of problems of the conventional technique.

Note that the description of these objects does not preclude the existence of other objects. One embodiment of the present invention does not have to achieve all of these objects. Objects other than these can be derived from the description of the specification, the drawings, the claims, and the like.

Means for Solving the Problems

One embodiment of the present invention is a semiconductor device including a first conductive layer extending in a first direction, a structure body extending in a second direction intersecting with the first direction, a first insulating layer, and a second insulating layer. The structure body includes a functional layer, a semiconductor layer, a third insulating layer, and a second conductive layer. In an intersection portion of the first conductive layer and the structure body, the third insulating layer, the semiconductor layer, and the functional layer are placed concentrically around the second conductive layer in this order. The first insulating layer and the second insulating layer are stacked in the second direction. The functional layer and the first conductive layer are placed between the first insulating layer and the second insulating layer. The second conductive layer, the third insulating layer, and the semiconductor layer include a portion positioned inside a first opening provided in the first insulating layer and a portion positioned inside a second opening provided in the second insulating layer.

Another embodiment of the present invention is a semiconductor device including a first conductive layer extending in a first direction, a structure body extending in a second direction intersecting with the first direction, a first insulating layer, and a second insulating layer. The structure body includes a functional layer, a third conductive layer, and a fourth insulating layer. In an intersection portion of the first conductive layer and the structure body, the third conductive layer and the functional layer are placed concentrically around the fourth insulating layer in this order. The first insulating layer and the second insulating layer are stacked in the second direction. The functional layer and the first conductive layer are placed between the first insulating layer and the second insulating layer. The third conductive layer and the fourth insulating layer include a portion positioned inside a first opening provided in the first insulating layer and a portion positioned inside a second opening provided in the second insulating layer.

Another embodiment of the present invention is a semiconductor device including a first conductive layer and a fourth conductive layer extending in a first direction, a structure body extending in a second direction intersecting with the first direction, a first insulating layer, a second insulating layer, and a fifth insulating layer. The structure body includes a first portion and a second portion. The first portion includes a functional layer, a semiconductor layer, a third insulating layer, and a second conductive layer. The second portion includes a sixth insulating layer, the semiconductor layer, the third insulating layer, and the second conductive layer. In an intersection portion of the first conductive layer, the fourth conductive layer, and the structure body, the third insulating layer, the semiconductor layer, and the functional layer are placed concentrically around the second conductive layer in this order in the first portion. Furthermore, in the intersection portion, the third insulating layer, the semiconductor layer, and the sixth insulating layer are placed concentrically around the second conductive layer in this order in the second portion. The functional layer and the first conductive layer are placed between the first insulating layer and the second insulating layer. The fourth conductive layer is placed between the second insulating layer and the fifth insulating layer. The second conductive layer, the third insulating layer, and the semiconductor layer include a portion positioned inside a first opening provided in the first insulating layer, a portion positioned inside a second opening provided in the second insulating layer, and a portion positioned inside a third opening provided in the fifth insulating layer.

In any of the above, a seventh insulating layer is preferably included. In that case, the seventh insulating layer is preferably placed between the first insulating layer and the second insulating layer. Furthermore, the seventh insulating layer is preferably provided in contact with a top surface, a bottom surface, and a side surface of the functional layer.

In any of the above, an eighth insulating layer is preferably included. In that case, the eighth insulating layer is preferably placed between the semiconductor layer and the functional layer. The eighth insulating layer preferably includes silicon and nitrogen. The eighth insulating layer is preferably placed concentrically around the second conductive layer or the fourth insulating layer.

In any of the above, the first direction is preferably orthogonal to the second direction.

In any of the above, the intersection portion preferably functions as a memory cell.

In any of the above, the semiconductor layer preferably includes at least one of indium and zinc.

In any of the above, the functional layer preferably exhibits ferroelectricity or anti-ferroelectricity.

In any of the above, the functional layer preferably includes one or both of hafnium oxide and zirconium oxide.

Effect of the Invention

According to one embodiment of the present invention, a novel memory device can be provided. According to one embodiment of the present invention, a highly reliable memory device can be provided. According to one embodiment of the present invention, a memory device having large memory capacity can be provided. According to one embodiment of the present invention, at least one of problems of the conventional technique can be at least reduced.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 6A is a cross-sectional view of a memory string. FIG. 6B is a circuit diagram of the memory string.

FIG. 14A is a cross-sectional view of a memory string. FIG. 14B is a circuit diagram of the memory string.

FIG. 17A is a diagram showing the classification of crystal structures. FIG. 17B is a graph showing an XRD spectrum of a CAAC-IGZO film. FIG. 17C is an image showing a nanobeam electron diffraction pattern of a CAAC-IGZO film.

FIG. 26A is a perspective view illustrating an example of a semiconductor wafer, FIG. 26B is a perspective view illustrating an example of a chip, and FIG. 26C and FIG. 26D are perspective views each illustrating an example of an electronic component.

FIG. 27A to FIG. 27J are each a perspective view or a schematic view illustrating an example of an electronic device.

MODE FOR CARRYING OUT THE INVENTION

Figures 1A, 1B:
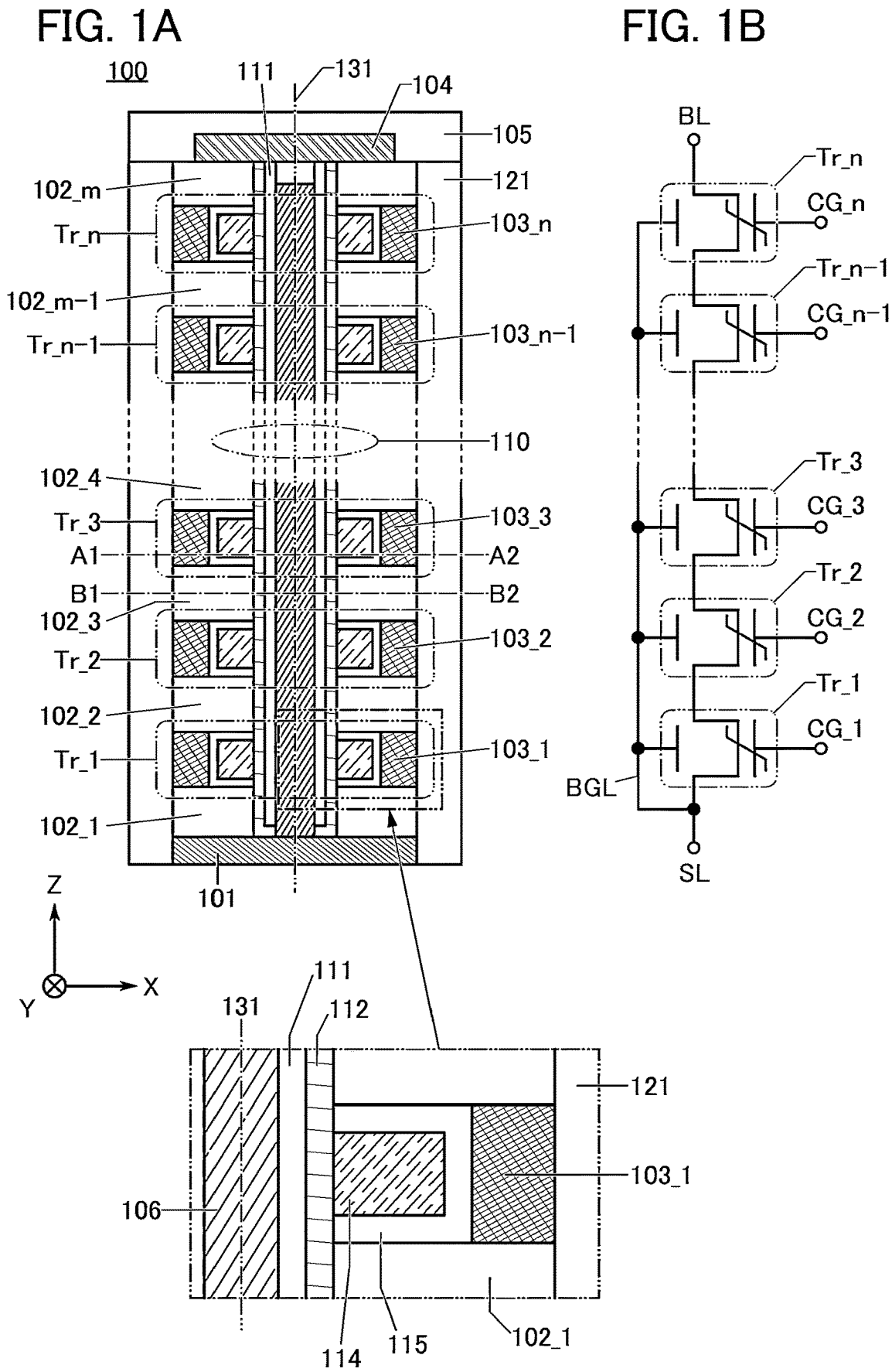
FIG. 1A is a cross-sectional view of a memory string.
FIG. 1B is a circuit diagram of the memory string.

Embodiments will be described below with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

In this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, and the like. An IGFET (Insulated Gate Field Effect Transistor), a thin film transistor (TFT), and the like are in the category of a transistor in this specification.

Functions of a "source" and a "drain" are sometimes replaced with each other when a transistor of opposite polarity is used or when the direction of current is changed in circuit operation, for example. Therefore, the terms "source" and "drain" can be switched in this specification.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

Hereinafter, the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacking order (or formation order) of a stacked body or the like is described, even in the case where a surface on which the stacked body is provided (e.g., a formation surface, a support surface, an adhesion surface, or a planar surface) is positioned above the stacked body in the drawings, the direction and the opposite direction are expressed using "under" and "over", respectively, in some cases.

In this specification and the like, the term "film" and the term "layer" can be interchanged with each other. For example, in some cases, the term "conductive layer" and the term "insulating layer" can be interchanged with the term "conductive film" and the term "insulating film", respectively.

Embodiment 1

In this embodiment, a memory device of one embodiment of the present invention will be described. The memory device of one embodiment of the present invention includes a memory string extending in a direction normal to a formation surface. The memory string has a structure in which a plurality of memory elements (also referred to as memory cells) are lined up in the normal direction. In other words, the memory device of the present invention has a structure in which a plurality of memory elements are stacked in the normal direction. This can increase the amount of data per unit area to achieve larger capacity.

A memory string 100 according to one embodiment of the present invention is described with reference to drawings. The memory string 100 is a semiconductor device that functions as a 3D-NAND memory device. Note that in the drawings, arrows indicating an X direction, a Y direction, and a Z direction are illustrated in some cases. The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases. In this embodiment, a direction perpendicular to a top surface of a conductive layer 101 is the Z direction.

Structure Example 1 of Memory String

Figure 2A:
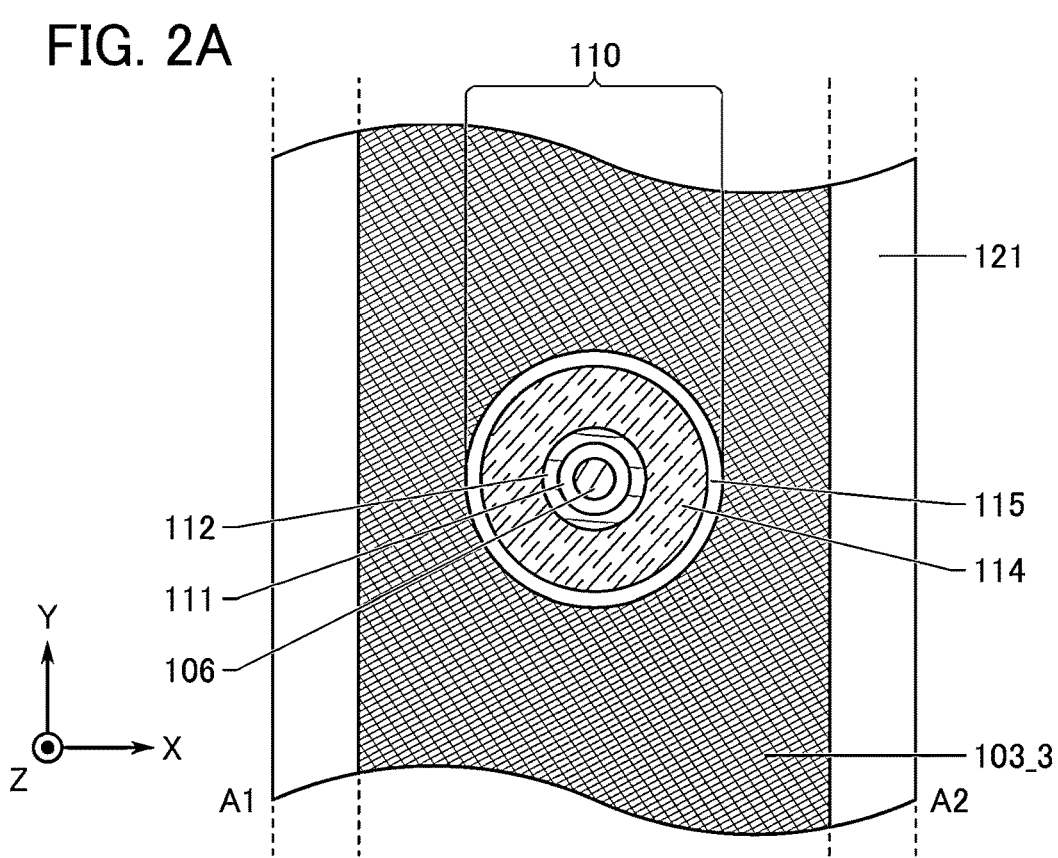
FIG. 2A and FIG. 2B are cross-sectional views of the memory string.
Figure 2B:
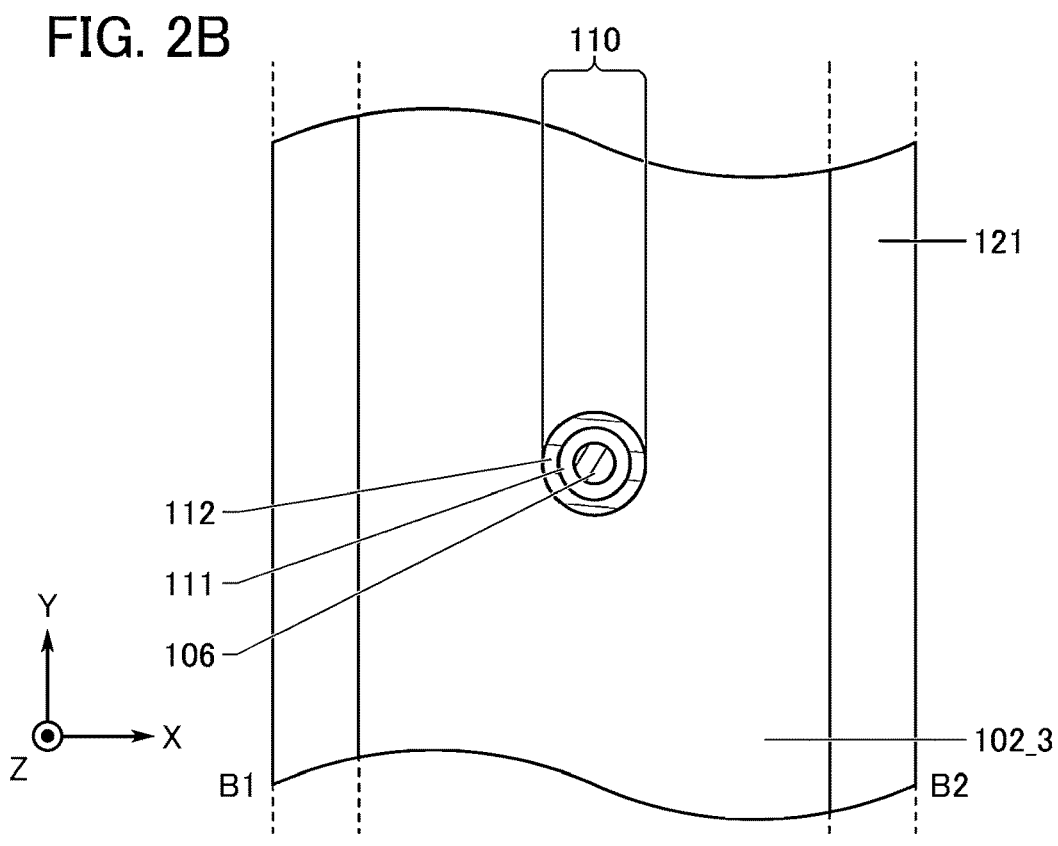

FIG. 1A is a cross-sectional view of the memory string 100 seen from the Y direction. Note that FIG. 1A illustrates a central axis 131 of the memory string 100 extending in the Z direction. FIG. 1B is an equivalent circuit diagram of the memory string 100. The memory string 100 has a structure in which a plurality of transistors Tr are connected in series. FIG. 2A is a cross-sectional view in which a portion A1-A2 represented by a dashed-dotted line in FIG. 1A is seen from the Z direction. FIG. 2B is a cross-sectional view in which a portion B1-B2 represented by a dashed-dotted line in FIG. 1A is seen from the Z direction.

The memory string 100 includes the conductive layer 101 placed above a substrate (not illustrated), m insulating layers 102 (m is an integer greater than or equal to 2), and n conductive layers 103 (n is an integer greater than or equal to 2). The insulating layers 102 and the conductive layers 103 are alternately stacked above the substrate. In FIG. 1A and the like, a first insulating layer 102 is referred to as an insulating layer 102_1, and an m-th insulating layer 102 is referred to as an insulating layer 102_m. Similarly, a first conductive layer 103 is referred to as a conductive layer 103_1, and an n-th conductive layer 103 is referred to as a conductive layer 103_n. Note that in this embodiment and the like, the simple term "insulating layer 102" refers to any insulating layer 102. Similarly, the simple term "conductive layer 103" refers to any conductive layer 103.

The insulating layer 102 and the conductive layer 103 extend in the Y direction. The memory string 100 has a structure in which the insulating layer 102 and the conductive layer 103 are alternately stacked. For example, in FIG. 1A, the insulating layer 102_1 is provided over the conductive layer 101, the conductive layer 103_1 is provided over the insulating layer 102_1, an insulating layer 102_2 is provided over the conductive layer 103_1, a conductive layer 103_2 is provided over the insulating layer 102_2, an insulating layer 102_3 is provided over the conductive layer 103_2, a conductive layer 103_3 is provided over the insulating layer 102_3, and an insulating layer 102_4 is provided over the conductive layer 103_3. In addition, the insulating layer 102_m is provided over the conductive layer 103_n.

In addition, the memory string 100 includes a conductive layer 104, an insulating layer 105, a structure body 110, and an insulating layer 121. The structure body 110 extends along the Z direction. Furthermore, the structure body 110 is provided between the conductive layer 101 and the conductive layer 104 so as to penetrate through the insulating layer 102_1 to the insulating layer 102_m and the conductive layer 103_1 to the conductive layer 103_n. That is, the structure body 110 includes a portion positioned inside an opening provided in the insulating layer 102_1 to the insulating layer 102_m.

The structure body 110 has a columnar structure including a conductive layer 106, an insulating layer 111, a semiconductor layer 112, a functional layer 114, and an insulating layer 115. Specifically, the conductive layer 106 extends along the central axis 131, and the insulating layer 111 is provided adjacent to a side surface of the conductive layer 106. The semiconductor layer 112 is provided adjacent to a side surface of the insulating layer 111. The functional layer 114 is provided adjacent to the semiconductor layer 112. Furthermore, the insulating layer 115 is provided adjacent to the functional layer 114. As illustrated in FIG. 2A and FIG. 2B, the insulating layer 111, the semiconductor layer 112, the functional layer 114, and the insulating layer 115 are provided concentrically outside the conductive layer 106.

The insulating layer 115 is provided along a top surface and a bottom surface of the functional layer 114, and a side surface of the conductive layer 103. Here, the top surface and the bottom surface of the functional layer 114 refer to a pair of surfaces perpendicular to the Z direction. A side surface of the functional layer 114 refers to one or more of surfaces parallel to the Z direction.

Although FIG. 2A and FIG. 2B illustrate the case where the structure body 110 has a circular cross-sectional shape, the cross-sectional shape of the structure body 110 is not limited to a circle. The cross-section of the structure body 110 may have an elliptical shape, a triangular shape, a rectangular shape, or a polygonal shape with five or more corners. The cross-sectional shape of the structure body 110 may have an outline with a curved line or a combination of a straight line and a curved line.

The insulating layer 121 is provided to cover side surfaces of the insulating layer 102_1 to the insulating layer 102_m and the conductive layer 103_1 to the conductive layer 103_n. The conductive layer 104 is provided over the insulating layer 102_m. The conductive layer 101 and the conductive layer 104 are electrically connected to the semiconductor layer 112. The conductive layer 101 is electrically connected to the conductive layer 106. Thus, the conductive layer 106 and the semiconductor layer 112 are electrically connected to each other. In addition, the insulating layer 105 is provided over the insulating layer 102_m, the insulating layer 121, and the conductive layer 104.

A region (an intersection portion) where the structure body 110 and the conductive layer 103 overlap with each other functions as the transistor Tr in a direction perpendicular to the Z direction. Thus, a region (an intersection portion) where the structure body 110 and the conductive layer 103 overlap with each other functions as a memory cell (also referred to as a "memory element") in the direction perpendicular to the Z direction.

The conductive layer 103 functions as a gate of the transistor Tr. The memory string 100 illustrated in FIG. 1A includes n regions (intersection portions) where the structure body 110 and the conductive layer 103 overlap with each other. Thus, the memory string 100 illustrated in FIG. 1A includes n transistors Tr. Accordingly, the memory string 100 illustrated in FIG. 1A includes n memory cells. The conductive layer 106 can function as a back gate of the transistor Tr. Note that the conductive layer 106 is not necessarily provided when not needed. In that case, the central axis 131 is formed to be positioned inside the insulating layer 111.

FIG. 2A corresponds to a cross-sectional view of the transistor Tr in the memory string 100 when seen from the Z direction.

In FIG. 1A, a first transistor Tr is referred to as a transistor Tr_1, and an n-th transistor Tr is referred to as a transistor Tr_n. Note that in this embodiment and the like, the simple term "transistor Tr" refers to any transistor Tr.

In general, a memory cell in which data is stored by holding charge in a charge accumulation layer has a stacked-layer structure of a block layer, a charge accumulation layer, a tunnel layer, and a semiconductor layer. Such a memory cell is sometimes referred to as various names depending on a stacked-layer structure from a control gate to a semiconductor layer. For example, in the case where a control gate, a block layer, a charge accumulation layer, a tunnel layer, and a semiconductor layer are formed using a metal, an oxide, a nitride, an oxide, and a semiconductor, respectively, such a memory cell is referred to as a MONOS (Metal Oxide Nitride Oxide Semiconductor) memory cell.

The transistor Tr according to one embodiment of the present invention functions as a memory cell. The memory string 100 functions as a NAND memory device including n memory cells.

In the memory cell illustrated in FIG. 1A and the like, the tunnel layer is not included as an example. The conductive layer 103 functions as a memory cell control gate. The functional layer 114 functions as a charge accumulation layer and the insulating layer 115 functions as a block layer. That is, the memory cell has a structure in which the block layer is provided on the control gate side.

As illustrated in FIG. 1B, the gate of the transistor Tr is electrically connected to a wiring CG. In FIG. 1B, the wiring CG that is electrically connected to a gate of the transistor Tr_1 is referred to as a wiring CG_1. Part or all of the conductive layer 103 may function as the wiring CG. The wiring CG is also referred to as a "control gate" or a "control gate wiring".

In adjacent transistors Tr among a transistor Tr_2 to a transistor Tr_n–1, a source of one of the adjacent transistors Tr is electrically connected to a drain of the other transistor Tr.

One of a source and a drain of the transistor Tr_1 is electrically connected to a wiring SL, and the other thereof is electrically connected to one of a source and a drain of the transistor Tr_2. One of a source and a drain of the transistor Tr_n is electrically connected to a wiring BL, and the other thereof is electrically connected to one of a source and a drain of the transistor Tr_n–1. The conductive layer 101 is electrically connected to the wiring SL, and the conductive layer 104 is electrically connected to the wiring BL. Note that the conductive layer 101 may function as the wiring SL, and the conductive layer 104 may function as the wiring BL.

The back gate of the transistor Tr (the transistor Tr_1 to the transistor Tr_n) is electrically connected to the wiring SL through a wiring BGL. Note that the conductive layer 106 can function as the wiring BGL.

The functional layer 114 preferably exhibits ferroelectricity, anti-ferroelectricity, or ferrielectricity. In particular, the functional layer 114 preferably exhibits ferroelectricity or ferrielectricity exhibiting spontaneous polarization.

When an electric field is applied to a dielectric, a positively charged portion and a negatively charged portion are generated inside the dielectric. Such a phenomenon is called "polarization". A dielectric in which polarization disappears when an electric field vanishes is called "paraelectric", and a dielectric in which polarization remains even when an electric field vanishes is called "ferroelectric". The property in which polarization remains even when an electric field vanishes is called "ferroelectricity". The polarization that remains even when an electric field vanishes is called spontaneous polarization.

In this specification and the like, a dielectric in which spontaneous polarization occurs is referred to as a ferroelectric in a broad sense. Thus, in this specification and the like, a dielectric exhibiting ferrielectricity (ferrielectric) is included in the ferroelectric in a broad sense unless otherwise specified.

A material that can exhibit ferroelectricity is used for the functional layer 114. Examples of the material that can exhibit ferroelectricity include hafnium oxide, zirconium oxide, and a material in which an element J1 (the element J1 is zirconium (Zr), silicon (Si), aluminum (Al), gadolinium (Gd), yttrium (Y), lanthanum (La), strontium (Sr), or the like) is added to hafnium oxide.

The functional layer 114 may be formed using a piezoelectric ceramic having a perovskite structure such as $PbTiO_x$ (x is a real number greater than 0), barium strontium titanate (BST), strontium titanate, lead zirconate titanate (PZT), strontium bismuth tantalate (SBT), bismuth ferrite (BFO), or barium titanate.

The functional layer 114 may be formed using an organic ferroelectric such as polyvinylidene fluoride (also referred to as "PVDF") or a copolymer of vinylidene fluoride (also referred to as "VDF") and trifluoroethylene (also referred to as "TrFE").

As the material that can exhibit ferroelectricity, a mixture or compound containing a plurality of materials selected from the above-described materials can be used, for example. Alternatively, the functional layer 114 can have a stacked-layer structure of a plurality of materials selected from the above-described materials.

Among the above materials that can exhibit ferroelectricity, hafnium oxide (also referred to as "$HfO_x$" or "HO") or a material containing hafnium oxide and zirconium oxide (also referred to as "$HfZrO_x$" or "HZO"), which can exhibit ferroelectricity even when processed into a several-nanometer thin film, is preferable. With the use of HO or HZO, the thickness of the functional layer 114 can be less than or equal to 100 nm, preferably less than or equal to 50 nm, further preferably less than or equal to 20 nm, and still further preferably less than or equal to 10 nm.

In the case where $HfZrO_x$ is used as a material that can exhibit ferroelectricity, an atomic layer deposition (ALD) method, particularly a thermal ALD method is preferably used for deposition. In the case where the material that can exhibit ferroelectricity is deposited by a thermal ALD method, a material that does not contain hydrocarbon (also referred to as Hydro Carbon or HC) is suitably used as a precursor. When the material that can exhibit ferroelectricity contains one or both of hydrogen and carbon, crystallization of the material that can exhibit ferroelectricity might be hindered. Hence, the concentration of one or both of hydrogen and carbon in the material that can exhibit ferroelectricity is preferably reduced by using the precursor that does not contain hydrocarbon as described above. Examples of the precursor that does not contain hydrocarbon include a chlorine-based material. In the case where a material containing hafnium oxide and zirconium oxide ($HfZrO_x$) is used as the material that can exhibit ferroelectricity, $HfCl_4$ and/or $ZrCl_4$ is preferably used as the precursor.

In the case where a film including a material that can exhibit ferroelectricity is deposited, a highly purified intrinsic film having ferroelectricity can be formed by thoroughly eliminating impurities in the film, here, at least one or more of hydrogen, hydrocarbon, and carbon. Note that the highly purified intrinsic film having ferroelectricity and a highly purified intrinsic oxide semiconductor described in a later embodiment are highly compatible with each other in the manufacturing process. This can provide a method for manufacturing a semiconductor device with high productivity.

The material that can exhibit ferroelectricity preferably has a low impurity concentration. In particular, the concentration of hydrogen (H) and carbon (C) is preferably as low as possible. Specifically, the hydrogen concentration of the material that can exhibit ferroelectricity is preferably lower than or equal to $5 \times 10^{20}$ atoms/cm$^3$, further preferably lower than or equal to $1 \times 10^{20}$ atoms/cm$^3$. The carbon concentration of the material that can exhibit ferroelectricity is preferably lower than or equal to $5 \times 10^{19}$ atoms/cm$^3$, further preferably lower than or equal to $1 \times 10^{19}$ atoms/cm$^3$. On the other hand, a dopant (typically silicon, carbon, or the like) for controlling the polarization state may be added to the material that can exhibit ferroelectricity. In that case, a formation method using a material containing hydrocarbon as a precursor may be used as a way of adding carbon as a dopant.

In the case where $HfZrO_x$ is used as a material that can exhibit ferroelectricity, hafnium oxide and zirconium oxide are preferably deposited by a thermal ALD method alternately so as to have a composition of 1:1.

There is no particular limitation on the crystal structure of the material that can exhibit ferroelectricity. For example, the material that can exhibit ferroelectricity may have one or more crystal structures selected from a tetragonal crystal system, an orthorhombic crystal system, and a monoclinic crystal system. In particular, the material that can exhibit ferroelectricity preferably has an orthorhombic crystal structure, in which case ferroelectricity is exhibited. Alternatively, the material that can exhibit ferroelectricity may have a composite structure including an amorphous structure and a crystal structure.

The material that can exhibit ferroelectricity only needs to have a crystal structure that has no centrosymmetry and can exhibit polarity. Hence, the material can have a crystal system other than a tetrahedral crystal system without limitation to an orthorhombic crystal system.

Figure 3:
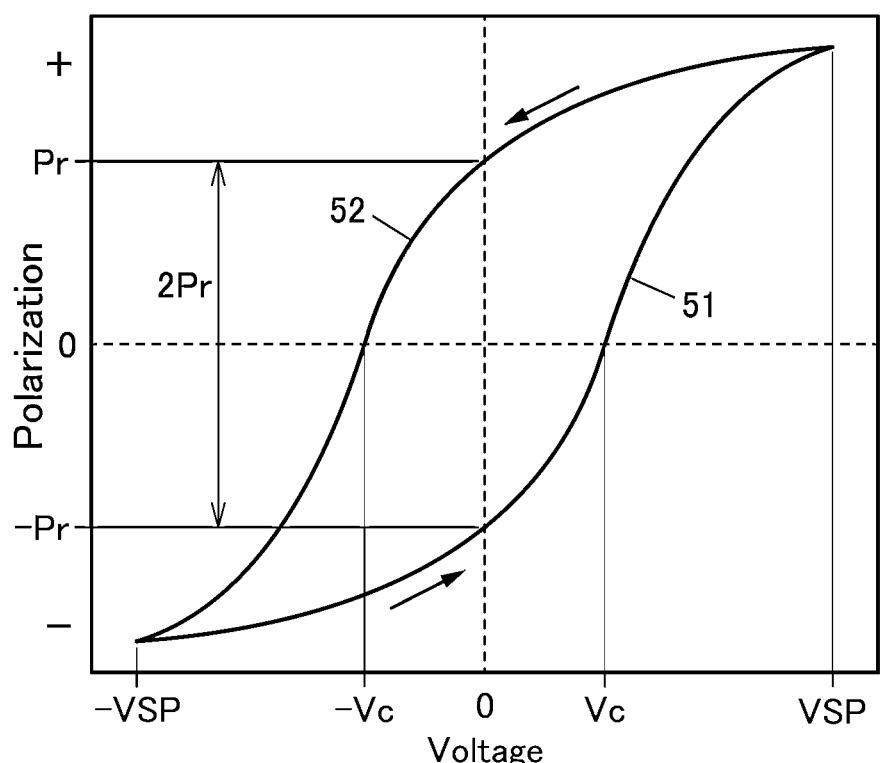
FIG. 3 is a graph showing an example of hysteresis characteristics.

In this embodiment or the like, a layer formed using a material that can exhibit ferroelectricity is also referred to as a "ferroelectric layer". The ferroelectric layer has hysteresis characteristics. FIG. 3 is a graph showing an example of hysteresis characteristics. The hysteresis characteristics can be measured using a capacitor including a ferroelectric layer as a dielectric. In FIG. 3, the horizontal axis represents voltage (electric field) applied to the ferroelectric layer. This voltage is a potential difference between one electrode and the other electrode of the capacitor including a ferroelectric layer as a dielectric. The electric field strength can be obtained by dividing the potential difference by the thickness of the ferroelectric layer.

In FIG. 3, the vertical axis represents polarization of the ferroelectric layer. Positive polarization indicates that positive charge in the ferroelectric layer is biased toward one electrode side of the capacitor and negative charge is biased toward the other electrode side of the capacitor. In contrast, negative polarization indicates that negative charge in the ferroelectric layer is biased toward one electrode side of the capacitor and positive charge is biased toward the other electrode side of the capacitor.

The polarization represented by the vertical axis of the graph of FIG. 3 may be positive when negative charge is biased toward one electrode side of the capacitor and positive charge is biased toward the other electrode side of the capacitor, and may be negative when positive charge is biased toward one electrode side of the capacitor and negative charge is biased toward the other electrode side of the capacitor.

As shown in FIG. 3, the hysteresis characteristics of the ferroelectric layer can be represented by a curve 51 and a curve 52. Voltages at the two intersections of the curve 51 and the curve 52 are respectively referred to as a saturation polarization voltage VSP and a saturation polarization voltage −VSP.

When a voltage lower than or equal to −VSP is applied to the ferroelectric layer and then the voltage applied to the ferroelectric layer increases, the polarization of the ferroelectric layer increases along the curve 51. In contrast, when a voltage higher than or equal to VSP is applied to the ferroelectric layer and then the voltage applied to the ferroelectric layer decreases, the polarization of the ferroelectric layer decreases along the curve 52. Note that in some cases, VSP is referred to as a "positive saturation polarization voltage" or a "first saturation polarization voltage", and −VSP is referred to as a "negative saturation polarization voltage" or a "second saturation polarization voltage". The absolute value of the first saturation polarization voltage may be the same as or different from the absolute value of the second saturation polarization voltage.

Here, the voltage at the time when the polarization of the ferroelectric layer changes along the curve 51 to reach 0 is referred to as a coercive voltage Vc. The voltage at the time when the polarization of the ferroelectric layer changes along the curve 52 to reach 0 is referred to as a coercive voltage −Vc. The value of Vc and the value of −Vc are each a value between −VSP and VSP. In some cases, Vc is referred to as a "positive coercive voltage" or a "first coercive voltage", and −Vc is referred to as a "negative coercive voltage" or a "second coercive voltage". The absolute value of the first coercive voltage may be the same as or different from the absolute value of the second coercive voltage.

The polarization of the ferroelectric layer is easily inverted when a voltage higher than the coercive voltage is applied to the ferroelectric layer. In the case where the polarization of the ferroelectric layer functioning as a gate insulating layer in a ferroelectric transistor (FeFET: Ferroelectric FET) is not to be inverted, the voltage applied between a gate and a source (also referred to as a "gate voltage" or "Vg") is set higher than or equal to −Vc and lower than or equal to Vc. The coercive voltage preferably has a large absolute value.

Thus, the difference between a threshold voltage VthD and a threshold voltage VthE of transistors, which have respectively become normally on and normally off by utilizing polarization inversion, is greater than or equal to −Vc and less than or equal to Vc.

The maximum value and the minimum value of polarization when a voltage is not applied to the ferroelectric layer (when the voltage is 0 V) are referred to as "remanent polarization Pr" and "remanent polarization −Pr", respectively. The difference between the absolute values of the remanent polarization Pr and the remanent polarization −Pr is referred to as "remanent polarization 2Pr". A larger remanent polarization 2Pr increases the range of a change in threshold voltage due to polarization inversion. Thus, the remanent polarization 2Pr is preferably as large as possible.

The transistor Tr included in the memory string 100 functions as a ferroelectric transistor. The ferroelectric transistor is a transistor using a ferroelectric for an insulating layer functioning as a gate insulating layer. The threshold voltage of the ferroelectric transistor can be changed when a predetermined voltage or higher is applied to the gate thereof.

With the use of the ferroelectric transistor as the transistor Tr included in the memory string 100, a NAND ferroelectric memory can be achieved. In the memory string 100, the conductive layer 106 may be omitted.

For the semiconductor layer 112 included in the transistor Tr, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

A semiconductor having crystallinity increased by a catalytic element may be used for the semiconductor layer 112. As the catalytic element, an element selected from metal elements such as nickel (Ni), iron (Fe), cobalt (Co), ruthenium (Ru), rhodium (Rh), palladium (Pd), osmium (Os), iridium (Ir), platinum (Pt), copper (Cu), gold (Au), and germanium (Ge) may be used.

For example, the crystallinity may be increased by forming amorphous silicon for the semiconductor layer 112, adding nickel as a catalytic element, and then performing heat treatment. The catalytic element is bound to silicon to form a silicide. The catalytic element is likely to be bound to a portion with a number of defects, such as a portion in an amorphous state. Thus, the catalytic element contained in the silicide reacts with silicon in an amorphous state to form a new silicide. In this manner, crystallization proceeds while the silicide moves. When the catalytic element reaches a semiconductor including an impurity element such as a Group 15 element or a Group 13 element, the catalytic element can be inhibited from diffusing again.

In the case where nickel is added as a catalytic element in the semiconductor layer 112, the concentration of nickel elements might have a gradient in the semiconductor layer 112. For example, a region functioning as a channel of the transistor has a lower nickel concentration than another region (e.g., a source region or a drain region) in some cases. In other words, the source region and the drain region have a higher nickel concentration than the region functioning as the channel in some cases.

The semiconductor layer 112 functions as a semiconductor layer where a channel of the transistor Tr is formed. Stacked semiconductor layers may be used in the transistor Tr. In the case where semiconductor layers are stacked, semiconductor materials having different crystal states may be used or different semiconductor materials may be used.

The transistor Tr is preferably a transistor using an oxide semiconductor, which is a kind of metal oxide, in its semiconductor layer where a channel is formed (such a transistor is also referred to as an "OS transistor"). An oxide semiconductor has a band gap greater than or equal to 2 eV, and thus has an extremely low off-state current. Thus, the power consumption of the memory string 100 can be reduced. Accordingly, the power consumption of a semiconductor device including the memory string 100 can be reduced.

A memory cell including an OS transistor can be referred to as an "OS memory". Furthermore, the memory string 100 including the memory cell can also be referred to as an "OS memory".

The on resistance of the OS transistor can be made smaller than that of a transistor using polycrystalline silicon for its semiconductor layer where a channel is formed. In other words, the conductivity of a body portion can be increased. When the OS transistor is used as the transistor Tr, the operation speed of the memory string 100 can be increased. Note that the body portion here refers to a channel of a transistor included in the memory string or a semiconductor layer that functions as a source/drain (e.g., the semiconductor layer 112).

The transistor using polycrystalline silicon has variation in the threshold voltage caused by a crystal grain boundary, whereas the OS transistor has little influence by a crystal grain boundary and small variation in the threshold voltage. Accordingly, when the OS transistor is used as the transistor Tr, malfunction caused by variation in the threshold voltage can be suppressed in the memory string 100.

The OS transistor operates stably even in a high-temperature environment and has small fluctuation in characteristics. For example, the off-state current hardly increases even in the high-temperature environment. Specifically, the off-state current hardly increases even at an environmental temperature higher than or equal to room temperature and lower than or equal to 200° C. Furthermore, the on-state current is less likely to decrease even in the high-temperature environment. Thus, the memory string 100 including the OS memory achieves stable operation and high reliability even in the high-temperature environment. Moreover, the OS transistor has high breakdown voltage between its source and drain. When the OS transistor is used as a transistor included in the memory string 100, it is possible to achieve the memory string 100 that operates stably and has high reliability even in the high-temperature environment. Accordingly, the reliability of the semiconductor device including the memory string 100 can be increased.

A NAND memory device including the OS memory is referred to as an "OS NAND type" or an "OS NAND memory device". In addition, a 3D-NAND memory device including the OS memory is referred to as a "3D OS NAND type" or a "3D OS NAND memory device". Thus, the memory string 100 according to one embodiment of the present invention can be referred to as a 3D OS NAND memory device.

Figure 4A:
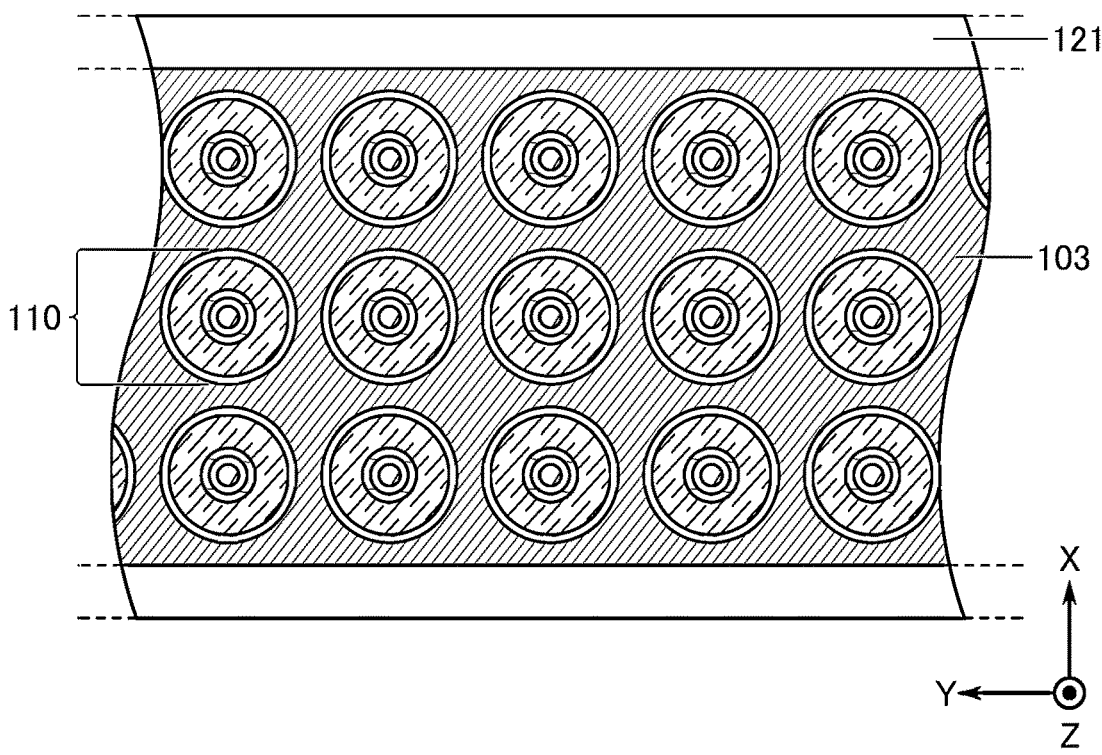
FIG. 4A and FIG. 4B are cross-sectional views of memory strings.
Figure 4B:
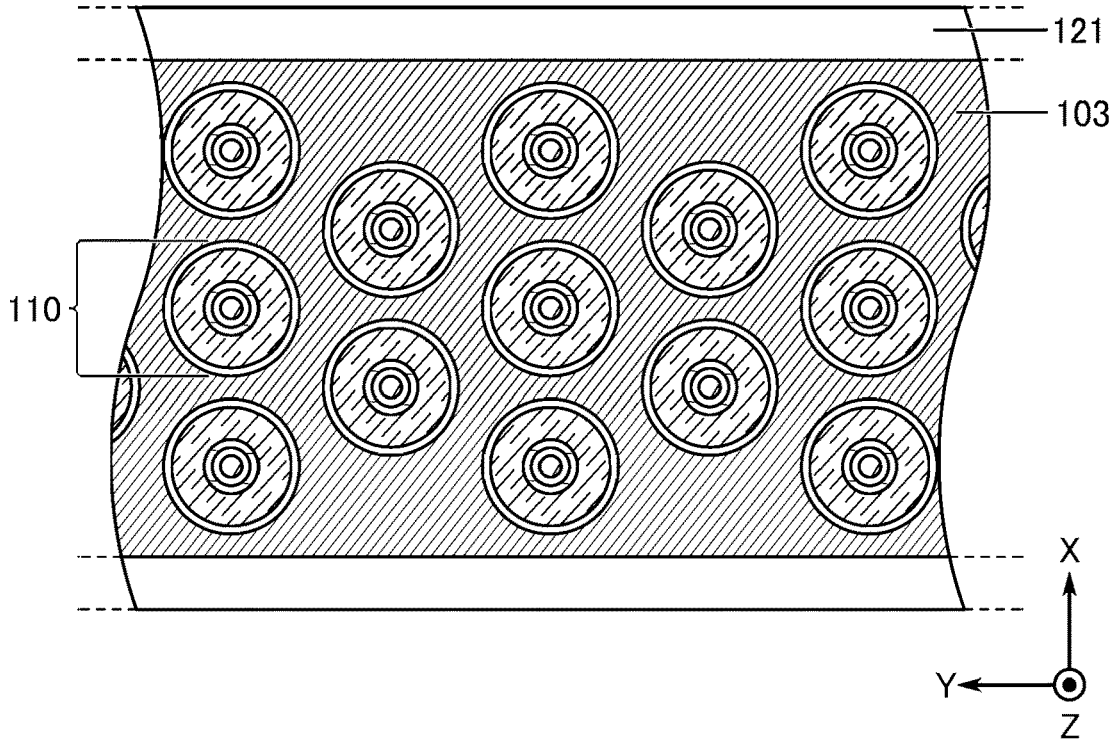

In order to increase the memory capacity of a semiconductor device including the memory string 100, a plurality of memory strings 100 are provided in a grid pattern (see FIG. 4A) or in a staggered arrangement (see FIG. 4B). FIG. 4A and FIG. 4B are each a cross-sectional view corresponding to FIG. 2A.

Modification Example 1

Described below is another structure example of the memory string, which is partly different from the structure described above.

Modification Example 1-1

Figure 5A:
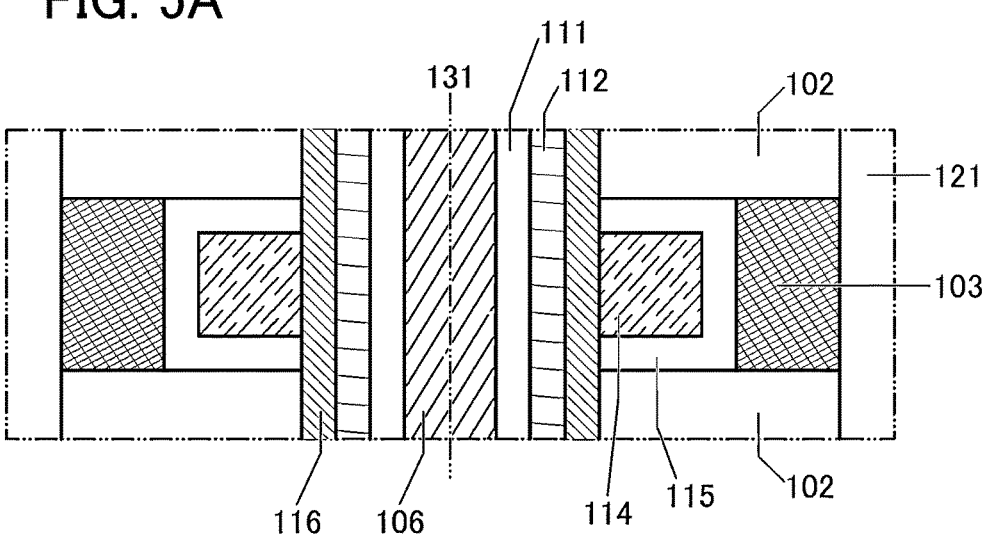
FIG. 5A to FIG. 5C are cross-sectional views of memory strings.

FIG. 5A illustrates a cross-sectional view of part of a memory string.

The structure illustrated in FIG. 5A is different from the structure illustrated as an example in FIG. 1A mainly in including an insulating layer 116.

The insulating layer 116 is provided between the functional layer 114 and the semiconductor layer 112. The insulating layer 116 is placed concentrically around the conductive layer 106.

The insulating layer 116 is preferably formed using a nitride, for example. Examples of the nitride preferably include silicon nitride, silicon nitride oxide, aluminum nitride, aluminum nitride oxide, hafnium nitride, and hafnium nitride oxide. In particular, silicon nitride or silicon nitride oxide, which is a nitride of silicon, is preferably used.

Note that the material for the insulating layer 116 is not limited to the nitride and an insulating material other than the nitride can be used. For example, an oxide such as silicon oxide, silicon oxynitride, aluminum oxide, or aluminum oxynitride may be used.

The provision of the insulating layer 116 can reduce a leakage current flowing from the conductive layer 103 to the semiconductor layer 112. This can reduce the power consumed in driving the memory cell.

Modification Example 1-2

Figure 5B:
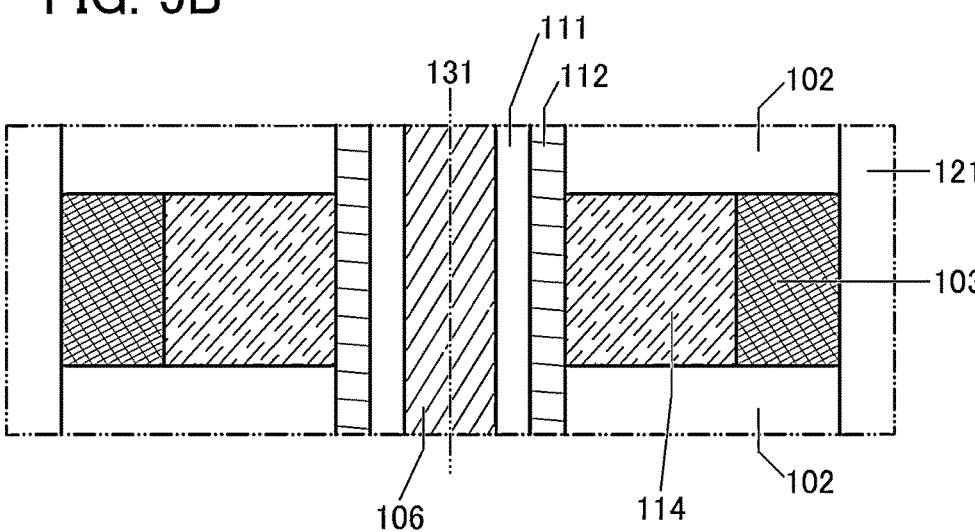

The structure illustrated in FIG. 5B is different from the structure illustrated as an example in FIG. 1A mainly in not including the insulating layer 115.

In FIG. 5B, the top surface and the bottom surface of the functional layer 114 are provided in contact with the insulating layer 102. The side surface of the functional layer 114 is provided in contact with the conductive layer 103.

Since the insulating layer 115 is not provided, it is possible to increase the electric field strength applied to the functional layer 114 when a voltage is applied between the conductive layer 103 and the semiconductor layer 112. This is preferable because a voltage for driving the memory cell can be reduced.

Modification Example 1-3

Figure 5C:
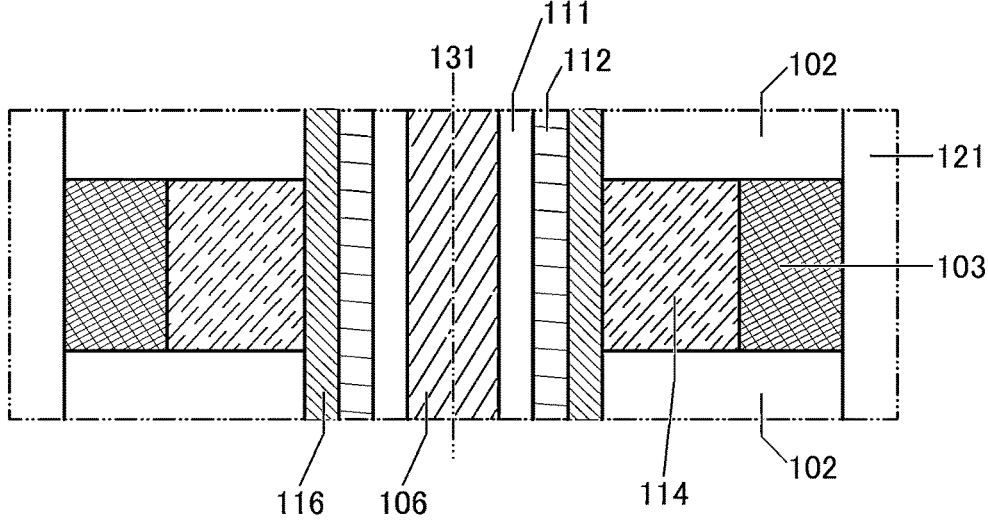

The structure illustrated in FIG. 5C is a structure in which the insulating layer 116 illustrated as an example in FIG. 5A is added to the structure illustrated as an example in FIG. 5B. Such a structure enables the leakage current of the memory cell to be reduced.

Structure Example 2 of Memory String

Figures 6A, 6B:
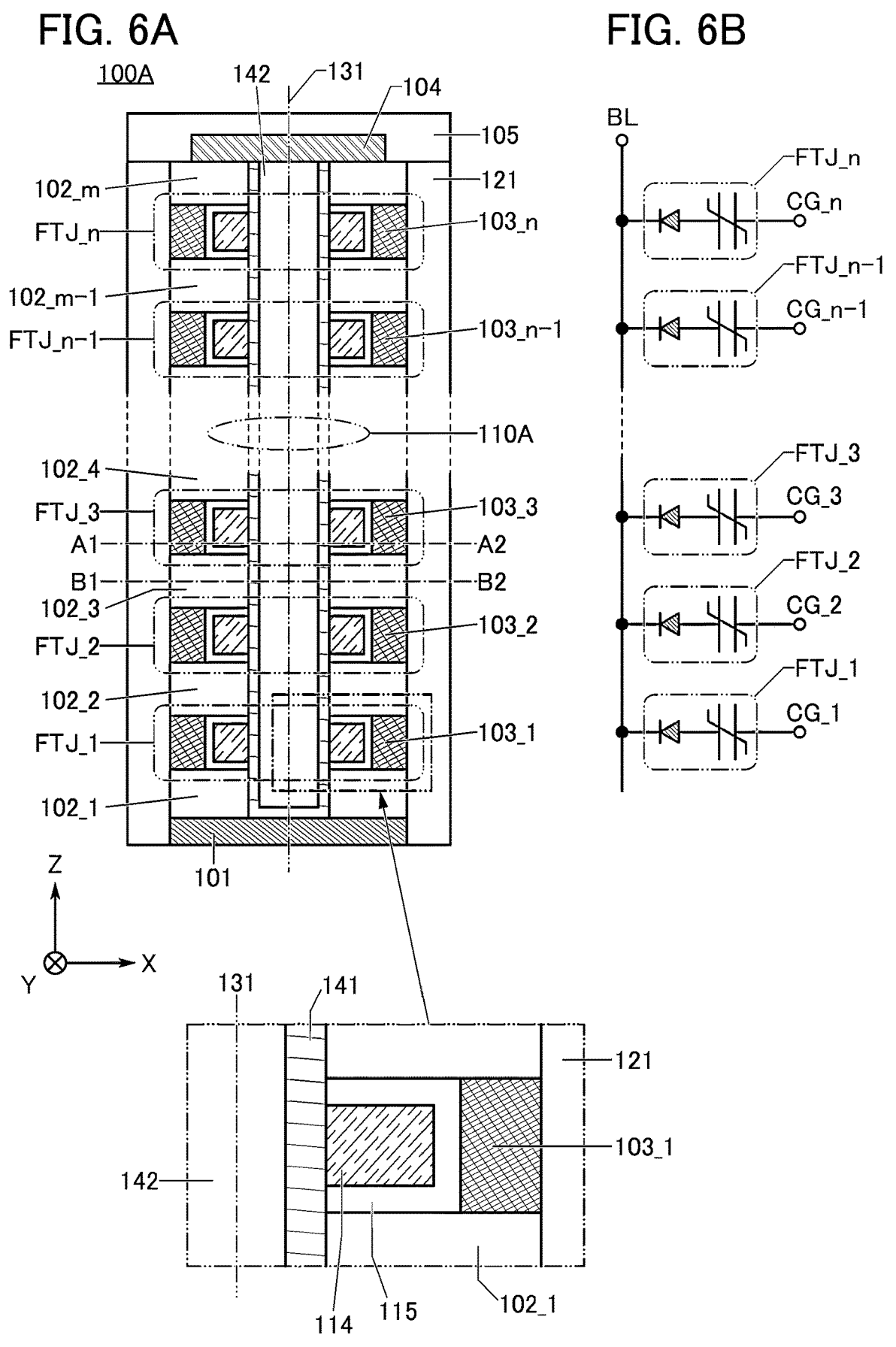

FIG. 6A illustrates a cross-sectional view of a memory string 100A. FIG. 6B is an equivalent circuit diagram of the memory string 100A.

The memory string 100A includes a structure body 110A instead of the structure body 110. The structure body 110A includes a conductive layer 141 and an insulating layer 142 instead of the conductive layer 106, the insulating layer 111, and the semiconductor layer 112 included in the structure body 110. The central axis 131 passes through the insulating layer 142.

The conductive layer 141 is provided adjacent to a side surface of the insulating layer 142. The conductive layer 141 is provided concentrically outside the insulating layer 142.

A region (an intersection portion) where the structure body 110A and the conductive layer 103 overlap with each other functions as a memory element FTJ in a direction perpendicular to the Z direction. FIG. 6A and FIG. 6B show an example in which the memory string 100A includes n stacked memory elements FTJ.

The functional layer 114 is interposed between the conductive layer 141 and the conductive layer 103. The insulating layer 115 is provided between the functional layer 114 and the conductive layer 103. It can thus be said that the memory element FTJ has an MFIM (Metal Ferroelectrics Insulator Metal) structure.

A variety of conductive materials can be used for the conductive layer 141. For example, it is possible to use a single layer or stacked layers of any of conductive films such as a metal film, an alloy film, a conductive oxide film, and a conductive nitride film.

A metal oxide such as In—Sn oxide, In—W oxide, In—W—Zn oxide, In—Ti oxide, In—Ti—Sn oxide, In—Zn oxide, In—Sn—Si oxide, or In—Ga—Zn oxide can also be used for the conductive oxide film.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The memory element FTJ functions as a ferroelectric tunnel junction (FTJ) memory. The FTJ memory is a non-volatile memory element (ferroelectric memory) utilizing a tunnel junction, which is manufactured by using a capacitor (ferroelectric capacitor) including at least a ferroelectric layer. The FTJ memory has features of a small occupied area, being capable of high-speed operation, being capable of non-destructive reading, and the like. In addition, the FTJ memory utilizing a tunnel junction has an element structure with a capacitor function and a diode function, resulting in an increase in density. Thus, a memory device having large memory capacity can be achieved. It can be said that the FTJ memory includes a tunnel junction element including a ferroelectric layer.

The FTJ memory is a memory element utilizing the fact that a current flowing between a pair of electrodes changes with the direction of spontaneous polarization of a ferro-electric. Thus, the FTJ memory can also be referred to as a resistance-change memory.

Modification Example 2

Described below is another structure example that is partly different from the structure of the memory string 100A.

Modification Example 2-1

Figure 7A:
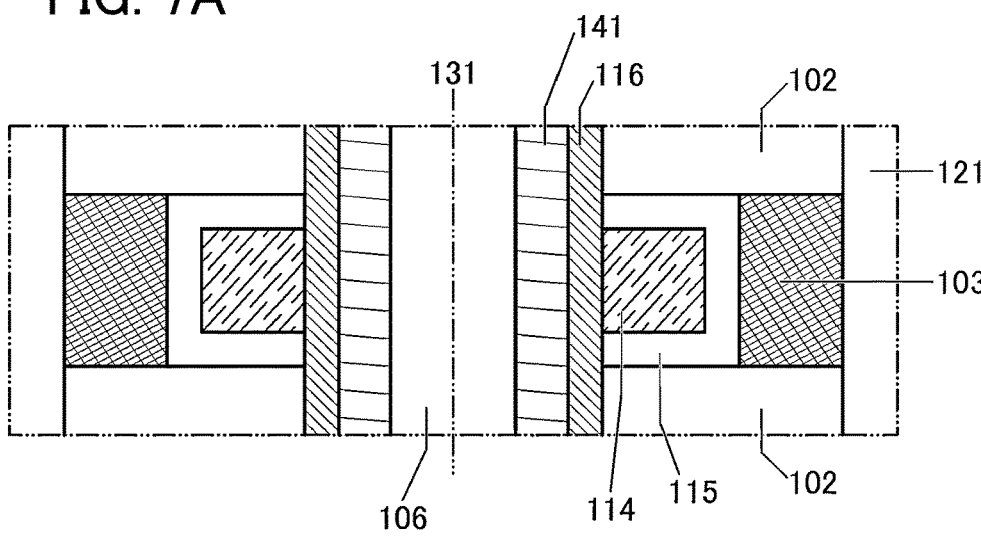
FIG. 7A to FIG. 7C are cross-sectional views of memory strings.

FIG. 7A illustrates a cross-sectional view of part of a memory string.

The structure illustrated in FIG. 7A is an example in which the insulating layer 116 is used in the structure illustrated as an example in FIG. 6A. For the insulating layer 116, Modification example 1-1 described above can be referred to.

The provision of the insulating layer 116 can reduce a leakage current flowing from the conductive layer 103 to the conductive layer 141. This can reduce the power consumed in driving the memory cell.

Modification Example 2-2

Figure 7B:
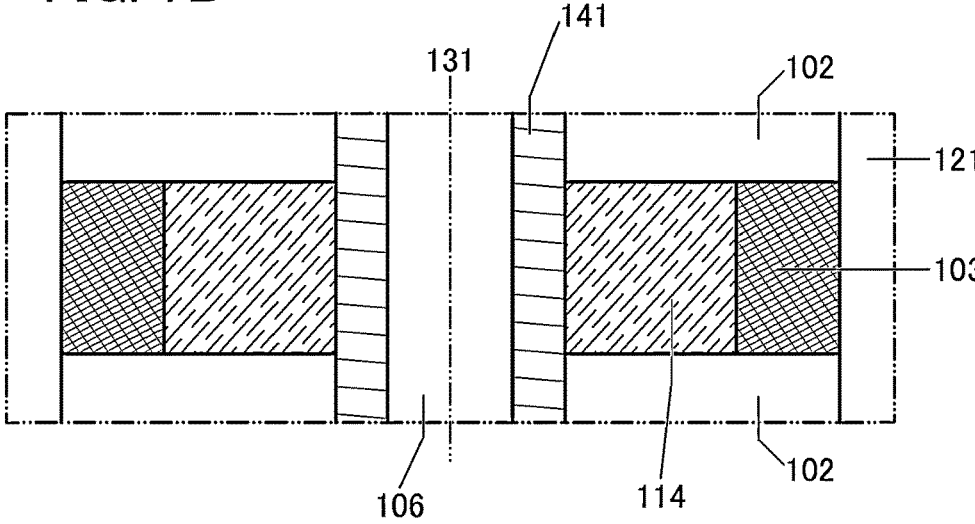

The structure illustrated in FIG. 7B is different from the structure illustrated as an example in FIG. 6A mainly in not including the insulating layer 115.

Since the insulating layer 115 is not provided, simplification of the manufacturing process, reduction in the manufacturing cost, and an improvement in the manufacturing yield can be achieved.

In the case of the structure illustrated in FIG. 7B, conductive materials with different work functions are preferably selected to be used for the conductive layer 103 and the conductive layer 141.

Modification Example 2-3

Figure 7C:
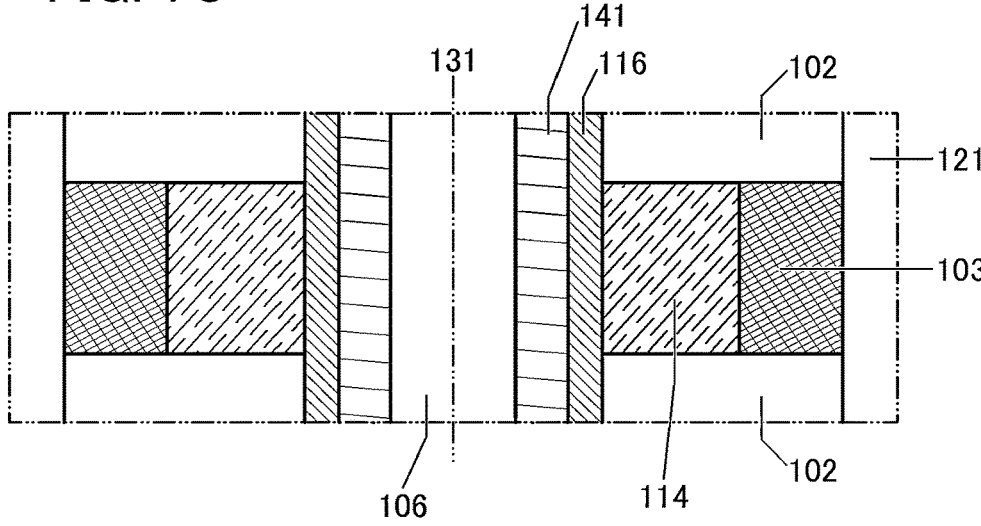

The structure illustrated in FIG. 7C is a structure in which the insulating layer 116 illustrated as an example in FIG. 7A is added to the structure illustrated as an example in FIG. 7B. Such a structure enables the leakage current of the memory cell to be reduced.

Manufacturing Method Example of Memory String

Described below is an example of a method for manufacturing the memory string of one embodiment of the present invention. Description is made here using the memory string 100 illustrated as an example in FIG. 1A.

Figure 8A:
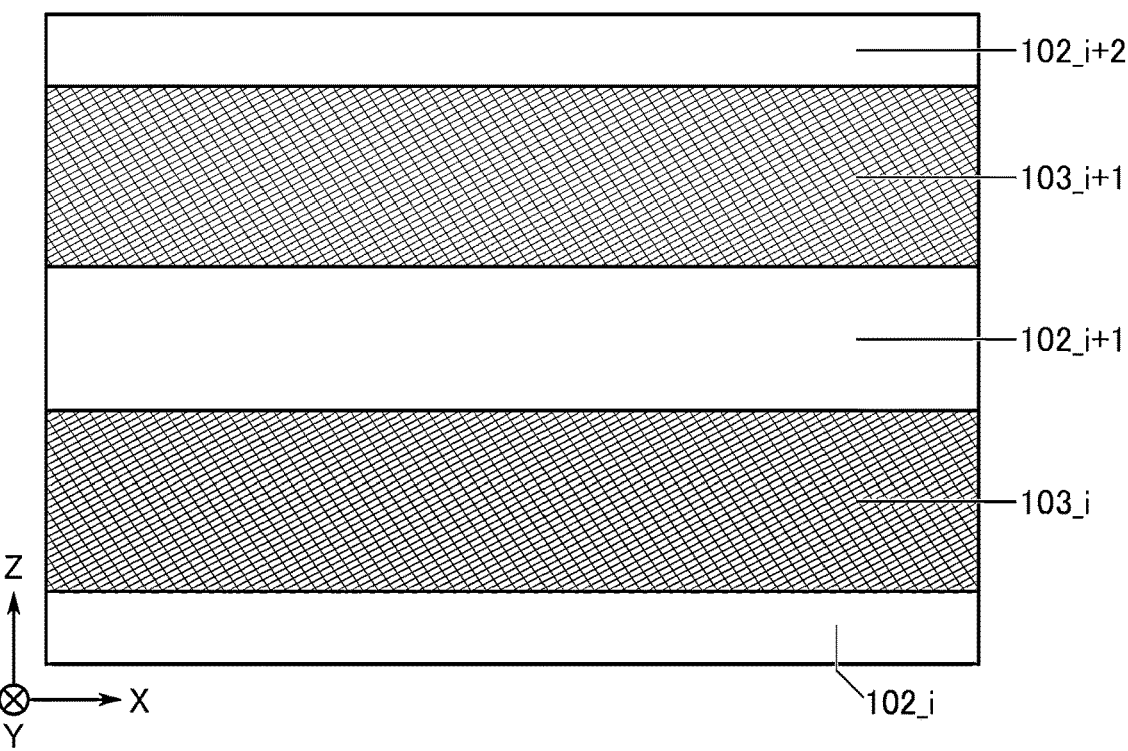
FIG. 8A and FIG. 8B are cross-sectional views illustrating a manufacturing method of a memory string.

First, a stacked body in which the insulating layer 102 and the conductive layer 103 are stacked is manufactured as illustrated in FIG. 8A. An i-th (i is an integer greater than or equal to 1) insulating layer 102_i is placed above a substrate (not illustrated), and a conductive layer 103_i is stacked above the insulating layer 102_i.

The insulating layer 102 is preferably formed using a material with a low concentration of impurities such as water and hydrogen. For example, the amount of hydrogen molecules released from the insulating layer 102 per unit area is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in a thermal desorption spectroscopy (TDS) method in the range of 50° C. to 500° C. An insulating layer from which oxygen is released by heating may be used as the insulating layer 102. Note that a material usable for the insulating layer 102 is not limited to the above description.

Note that the insulating layer 102 may have a stacked-layer structure of a plurality of insulating layers. For example, the insulating layer 102 may be a stack of hafnium oxide and silicon oxynitride. It is also possible to use a stack of silicon oxide and silicon nitride. Among the plurality of insulating layers included in the insulating layer 102, the insulating layer in contact with the conductive layer 103 is preferably formed using an insulating layer that has a function of inhibiting passage of oxygen.

Figure 8B:
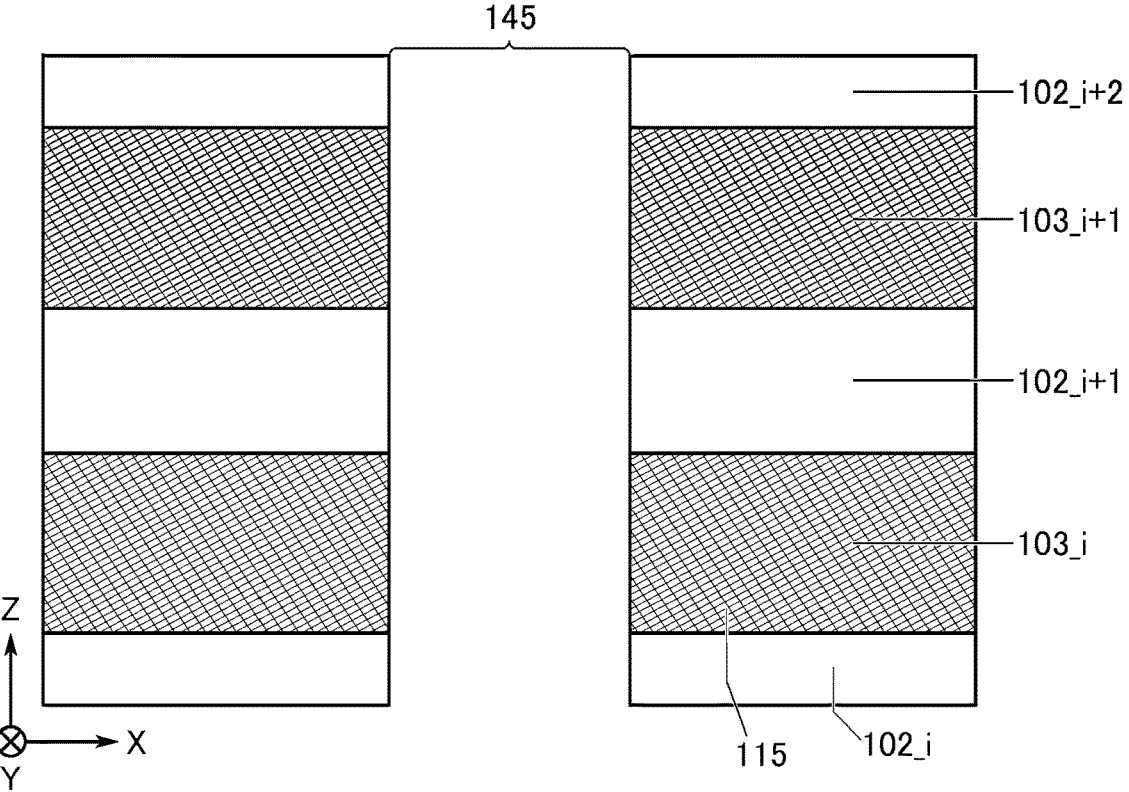

Next, a resist mask is formed over the stacked body, and an opening 145 is formed in the insulating layer 102 and the conductive layer 103 by etching treatment using the resist mask as a mask (see FIG. 8B).

The resist mask can be formed, for example, by a lithography method, a printing method, or an inkjet method as appropriate. Formation of the resist mask by an inkjet method needs no photomask; thus, manufacturing cost can be reduced in some cases. For the etching treatment, either a dry etching method or a wet etching method or both of them may be used. A dry etching method is suitable for microfabrication.

To form a resist mask by a lithography method, a resist is formed first, and then the resist is exposed to light through a photomask. Next, a region exposed to light is removed or left using a developing solution, so that a resist mask is formed.

Etching treatment through the resist mask is performed to process a conductive layer, a semiconductor layer, an insulating layer, or the like into a desired shape. The resist mask is formed, for example, by exposing the resist to KrF excimer laser light, ArF excimer laser light, or EUV (Extreme Ultraviolet) light. A liquid immersion technique may be employed in which a gap between a substrate and a projection lens is filled with a liquid (e.g., water) to perform light exposure. A beam such as an electron beam or an ion beam may be used instead of the above-mentioned light. A photomask is not necessary in the case of using a beam such as an electron beam or an ion beam. The resist mask can be removed by dry etching treatment such as ashing, wet etching treatment, wet etching treatment after dry etching treatment, or dry etching treatment after wet etching treatment.

A hard mask formed of an insulator or a conductor may be used instead of the resist mask. In the case where a hard mask is used, an insulating film or a conductive film that is the hard mask material is formed over a conductive film, a resist mask is formed thereover, and then the hard mask material is etched to form a hard mask with a desired shape.

As a dry etching apparatus for performing etching treatment by a dry etching method, a capacitively coupled plasma (CCP) etching apparatus including parallel plate electrodes can be used, for example. The capacitively coupled plasma etching apparatus including the parallel plate electrodes may have a structure in which high-frequency power is applied to one of the parallel plate electrodes. It is also possible to employ a structure in which different high-frequency powers are applied to one of the parallel plate electrodes. It is also possible to employ a structure in which high-frequency powers with the same frequency are applied to the parallel plate electrodes. It is also possible to employ a structure in which high-frequency powers with different frequencies are applied to the parallel plate electrodes. A dry etching apparatus including a high-density plasma source can be used. As the dry etching apparatus including a high-density plasma source, an inductively coupled plasma (ICP) etching apparatus can be used, for example.

Figure 9A:
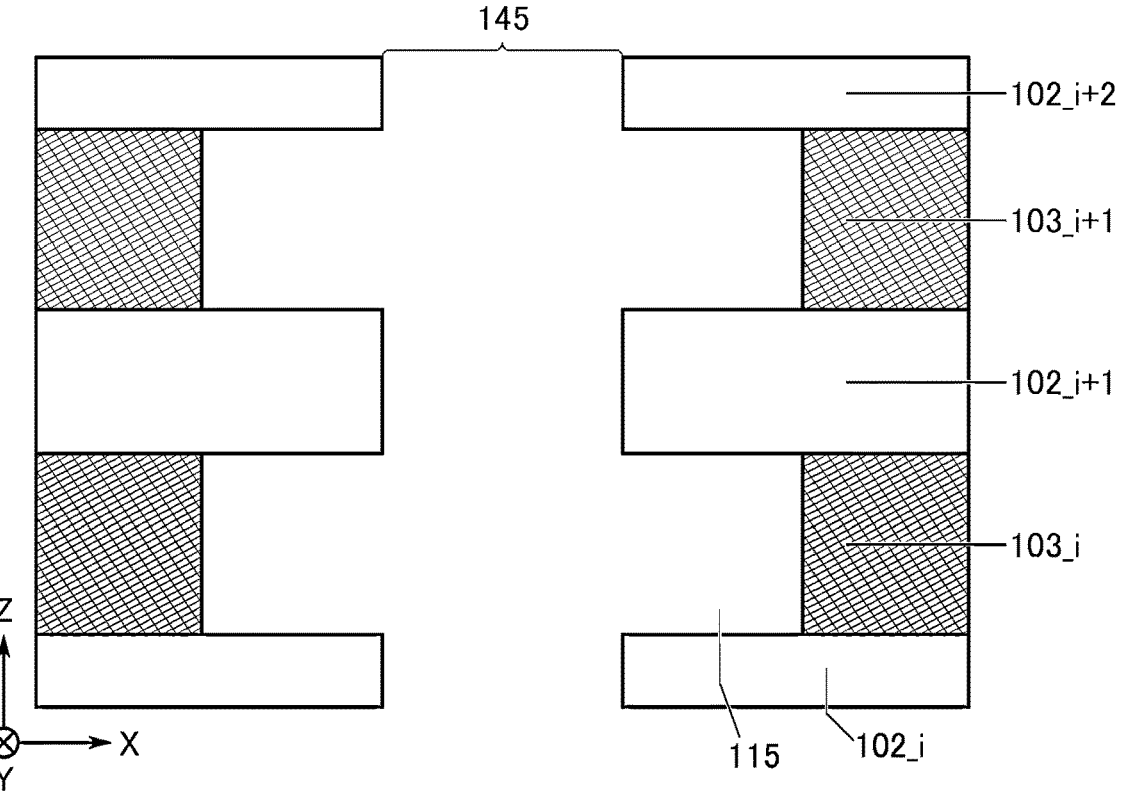
FIG. 9A and FIG. 9B are cross-sectional views illustrating a manufacturing method of a memory string.

Next, part of the conductive layer 103 exposed on a side surface of the opening 145 is etched, whereby the conductive layer 103 is made to recede from the side surface of the opening 145 (see FIG. 9A). The conductive layer 103 is etched under the conditions where the selectivity to the insulating layer 102 can be obtained.

For the etching of the conductive layer 103, an isotropic etching method can be used. For example, wet etching treatment or anisotropic plasma etching treatment can be used. In particular, wet etching treatment is preferably used.

Figure 9B:
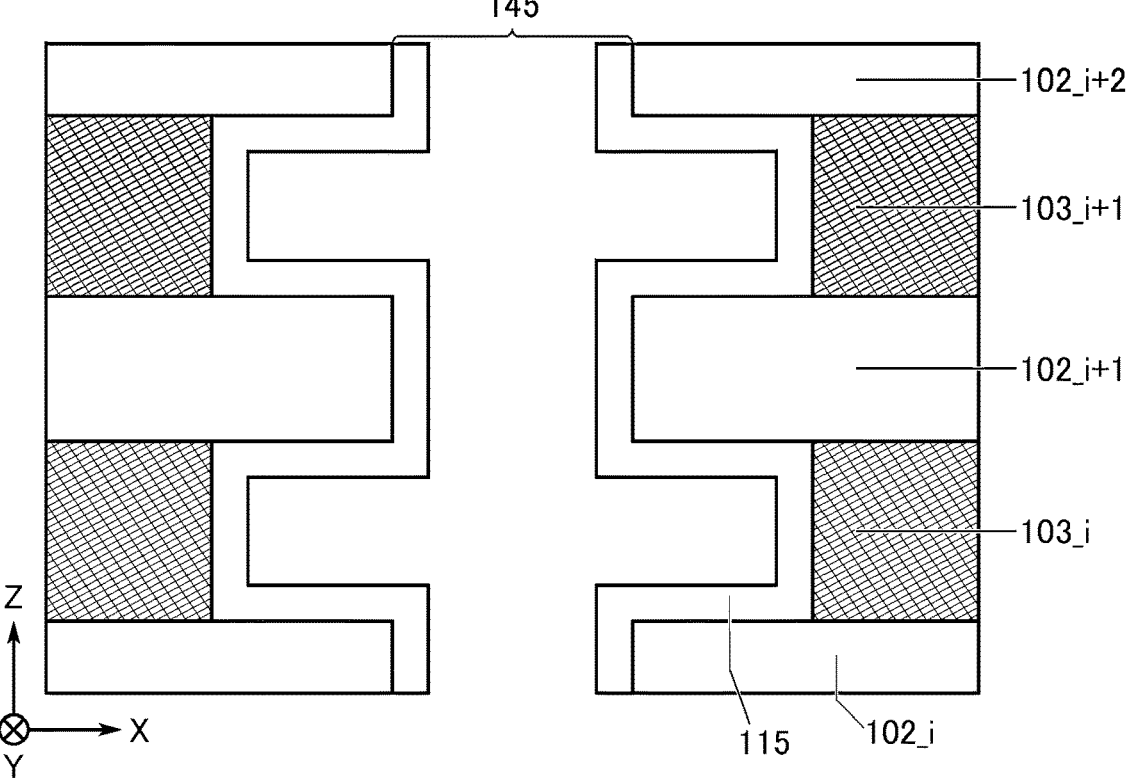

Next, the insulating layer 115 is formed along the side surface of the opening 145 (see FIG. 9(B)). The surfaces of the insulating layer 102 and the conductive layer 103 that are exposed in the opening 145 are covered with the insulating layer 115. For the insulating layer 115, the aforementioned insulating materials, e.g., an insulating material such as silicon nitride or silicon oxide can be used. In particular, silicon nitride is preferably used. Note that the insulating layer 115 may have a stacked-layer structure of a plurality of insulating layers.

Figure 10A:
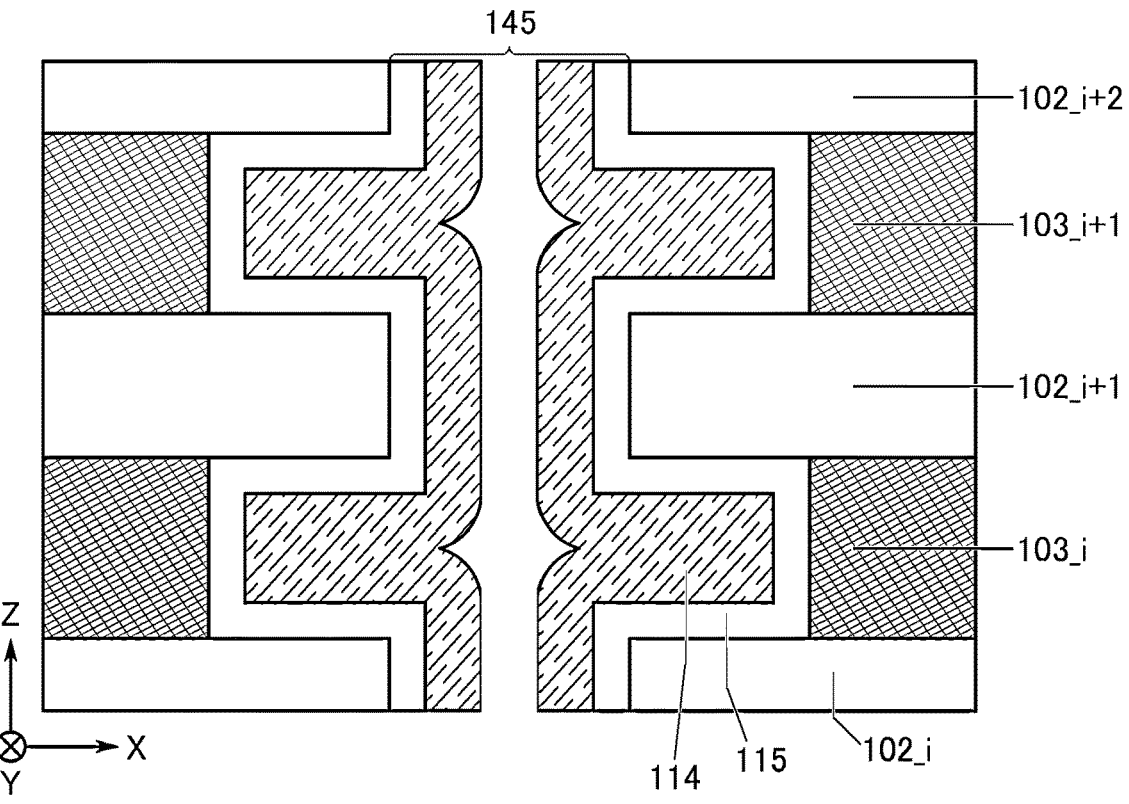
FIG. 10A and FIG. 10B are cross-sectional views illustrating a manufacturing method of a memory string.

Subsequently, the functional layer 114 is formed along the surface of the insulating layer 115 (see FIG. 10A). The functional layer 114 is formed so as to fill depressed portions of a top surface of the insulating layer 115.

The insulating layer 115 and the functional layer 114 are preferably formed by a deposition method achieving high coverage. For example, an ALD method is preferably used for the formation. In particular, deposition by a thermal ALD method makes it possible not only to deposit the insulating layer 115 and the functional layer 114 with favorable coverage, but also to effectively reduce impurities contained in the insulating layer 115 and the functional layer 114.

Next, the insulating layer 115 and the functional layer 114 in the opening 145 are partly etched. The insulating layer 115 and the functional layer 114 are etched in a region other than a portion overlapping with the insulating layer 102 when seen from the Z direction (see FIG. 10B).

Figure 10B:
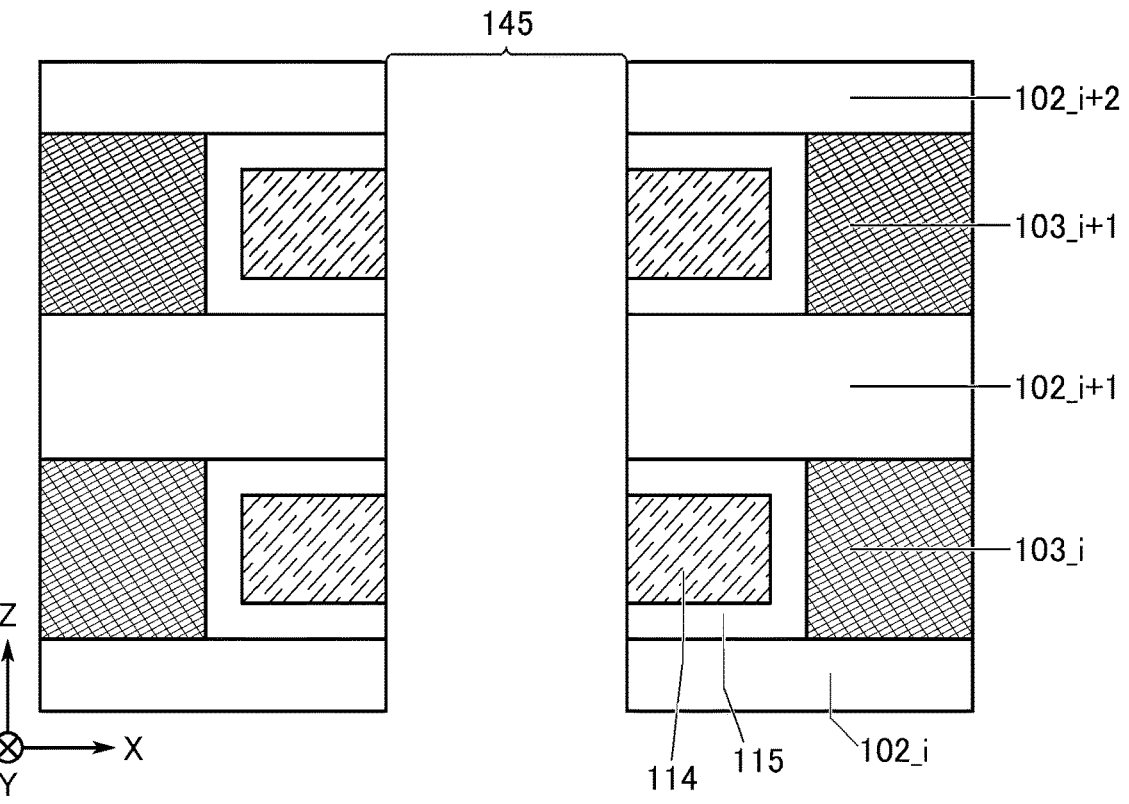

As illustrated in FIG. 10B, the inner wall of the opening 145 is formed by the side surfaces of the insulating layer 102, the insulating layer 115, and the functional layer 114. In that case, etching is preferably performed so as not to make a step between surfaces of the insulating layer 102, the insulating layer 115, and the functional layer 114. As a result, the semiconductor layer 112 or the like can be formed later on a flat surface, inhibiting generation of defects in a film such as the semiconductor layer 112.

Figure 11A:
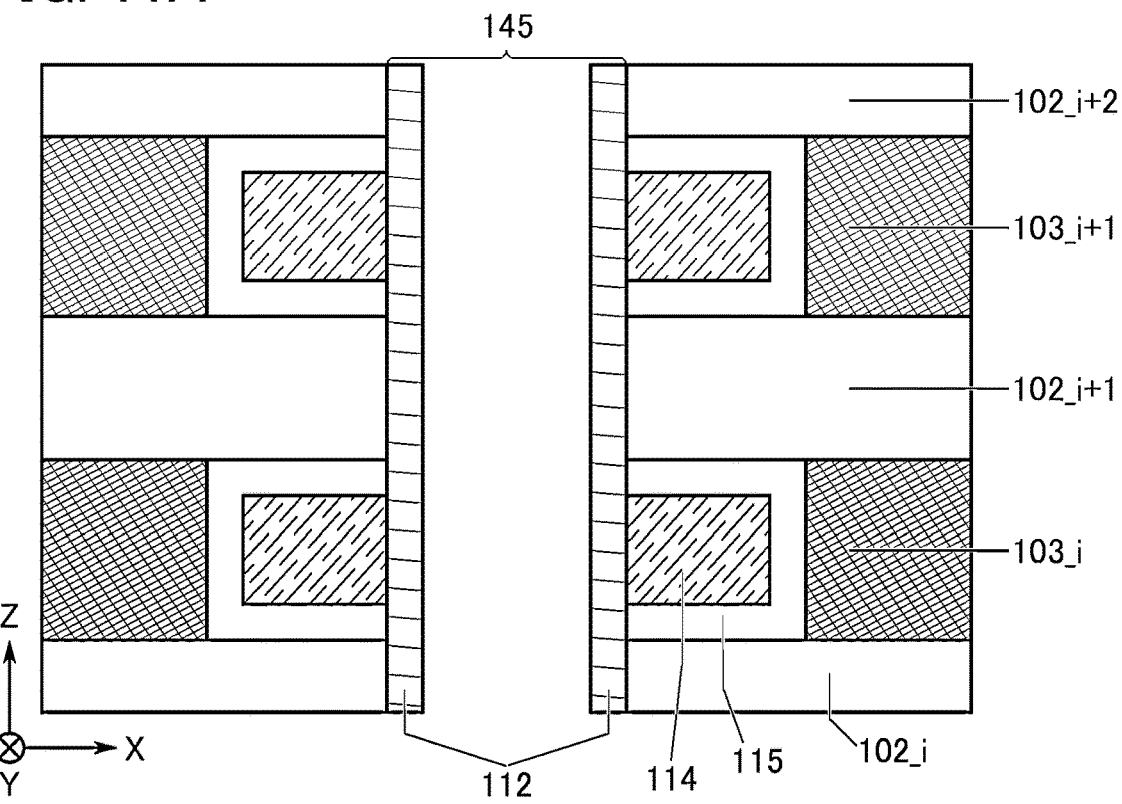
FIG. 11A and FIG. 11B are cross-sectional views illustrating a manufacturing method of a memory string.

Subsequently, the semiconductor layer 112 is formed along the inner wall of the opening 145 (see FIG. 11A). Here, an oxide semiconductor is used here for the semiconductor layer 112.

As a semiconductor material used for the semiconductor layer 112, a metal oxide having a composition In:Ga:Zn=4:2:3, In:Ga:Zn=1:1:1, In:Ga:Zn=5:1:6, In:Ga:Zn=5:1:3, or In:Ga:Zn=10:1:3, or a composition in the neighborhood thereof may be used, for example. As a semiconductor material used for the semiconductor layer 112, a metal oxide having a composition In:Zn=5:1 or In:Zn=10:1, or a composition in the neighborhood thereof may be used. Indium oxide may be used for the semiconductor layer 112.

The semiconductor layer 112 may have a stacked-layer structure of a plurality of layers. For example, the semiconductor layer 112 may be a stack of a metal oxide having a composition In:Ga:Zn=1:3:4, In:Ga:Zn=1:3:2, or In:Ga:Zn=1:1:1, or a composition in the neighborhood thereof and a metal oxide having a composition In:Ga:Zn=4:2:3, In:Ga:Zn=1:1:1, In:Ga:Zn=5:1:6, In:Ga:Zn=5:1:3, or In:Ga:Zn=10:1:3, or a composition in the neighborhood thereof.

Alternatively, the semiconductor layer 112 may have a three-layer structure in which a metal oxide having a composition In:Ga:Zn=4:2:3, In:Ga:Zn=1:1:1, In:Ga:Zn=5:1:6, In:Ga:Zn=5:1:3, or In:Ga:Zn=10:1:3, or a composition in the neighborhood thereof is provided between two metal oxides each having a composition In:Ga:Zn=1:3:4, In:Ga:Zn=1:3:2, or In:Ga:Zn=1:1:1, or a composition in the neighborhood thereof.

In the manufacturing process of the memory cell, heat treatment is preferably performed with the surface of the semiconductor layer 112 exposed. The heat treatment is performed at a temperature higher than or equal to 100° C. and lower than or equal to 600° C., preferably higher than or equal to 350° C. and lower than or equal to 550° C., for example. The heat treatment is performed in a nitrogen gas or inert gas atmosphere or an atmosphere containing an oxidizing gas at 10 ppm or more, 1% or more, or 10% or more. For example, the heat treatment is preferably performed in an oxygen atmosphere. Accordingly, oxygen can be supplied to the semiconductor layer 112 to reduce oxygen vacancies ($V_O$). The heat treatment may be performed under reduced pressure. Alternatively, after heat treatment is performed in a nitrogen gas or inert gas atmosphere, another heat treatment may be performed in an atmosphere containing an oxidizing gas at 10 ppm or more, 1% or more, or 10% or more in order to compensate for released oxygen. Alternatively, after heat treatment is performed in an atmosphere containing an oxidizing gas at ppm or more, 1% or more, or 10% or more, another heat treatment may be successively performed in a nitrogen gas or inert gas atmosphere.

Note that treatment for supplying oxygen (also referred to as "oxygen adding treatment") performed on the semiconductor layer 112 can promote a reaction in which oxygen vacancies in the semiconductor layer 112 are filled with supplied oxygen, i.e., a reaction of "$V_O+O \rightarrow null$". Furthermore, hydrogen remaining in the semiconductor layer 112 reacts with supplied oxygen, so that the hydrogen can be removed as $H_2O$ (dehydration). This can inhibit recombination of hydrogen remaining in the semiconductor layer 112 with oxygen vacancies and formation of $V_OH$.

Oxygen adding treatment can be performed by conducting microwave treatment in an oxygen-containing atmosphere. In that case, high-frequency waves such as microwaves and RF, oxygen plasma, oxygen radicals, and the like are applied to the semiconductor layer 112. The microwave treatment is preferably performed with a microwave treatment apparatus including a power source for generating high-density plasma using microwaves, for example. The microwave treatment apparatus may include a power source for applying RF to the substrate side. The use of high-density plasma enables high-density oxygen radicals to be generated. Application of RF to the substrate (not illustrated) side allows oxygen ions generated by the high-density plasma to be guided into the opening 145 efficiently. The microwave treatment is preferably performed under reduced pressure, and the pressure is set to 60 Pa or higher, preferably 133 Pa or higher, further preferably 200 Pa or higher, and still further preferably 400 Pa or higher. The oxygen flow rate ratio $O_2/(O_2+Ar)$ is lower than or equal to 50%, preferably higher than or equal to 10% and lower than or equal to 30%. The treatment temperature is lower than or equal to 750° C., preferably lower than or equal to 500° C., and is approximately 400° C., for example. After the oxygen plasma treatment, heat treatment may be successively performed without exposure to the air.

The effect of plasma, microwaves, and the like enables $V_OH$ included in the semiconductor layer 112 to be cut off, and hydrogen H to be removed from the semiconductor layer 112. That is, the reaction "$V_OH \rightarrow H+V_O$" and then the reaction "$V_O+O \rightarrow null$" occur in the semiconductor layer 112, whereby the hydrogen concentration in the semiconductor layer 112 can be reduced. As a result, oxygen vacancies and $V_OH$ in the semiconductor layer 112 can be reduced to lower the carrier concentration.

Figure 11B:
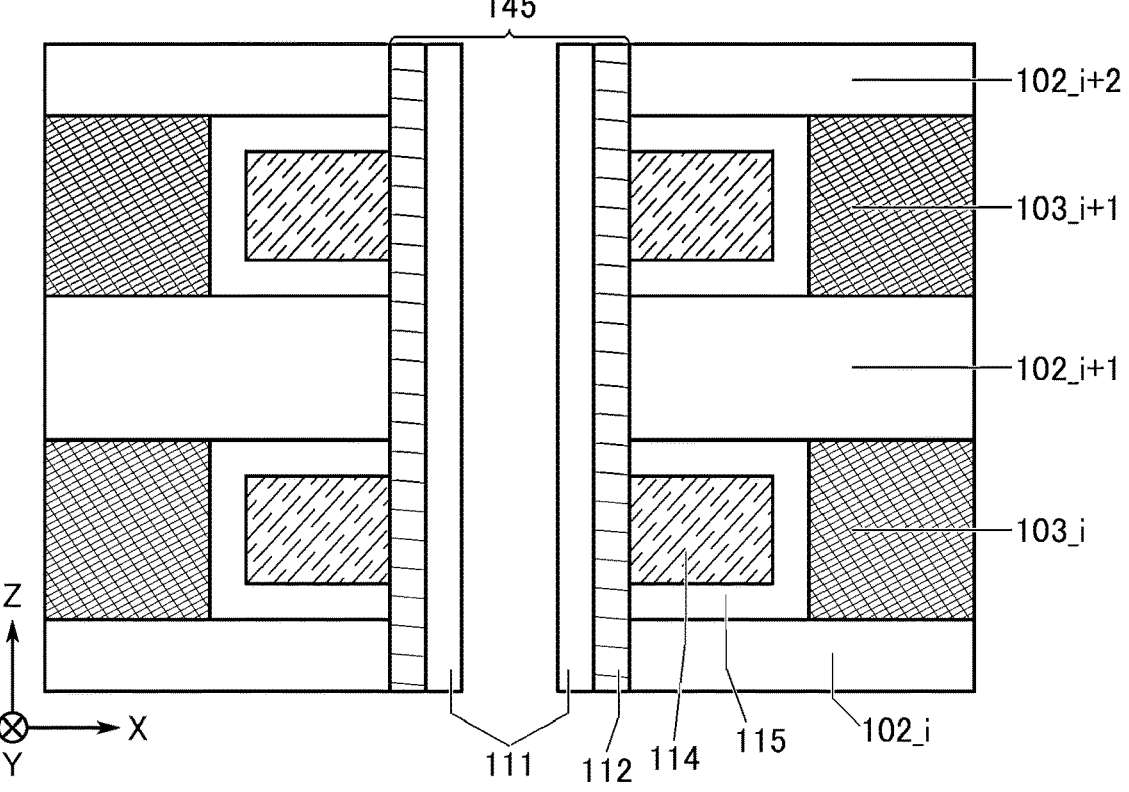

Subsequently, the insulating layer 111 is formed along a side surface of the semiconductor layer 112 (see FIG. 11B). For the insulating layer 111, silicon oxide, silicon oxynitride, or the like can be used as appropriate. When an insulating layer containing oxygen is provided in contact with the semiconductor layer 112, oxygen vacancies in the semiconductor layer 112 can be reduced, leading to an improvement in the reliability of the transistor. Furthermore, oxygen adding treatment may be performed after the formation of the insulating layer 111.

Figure 12A:
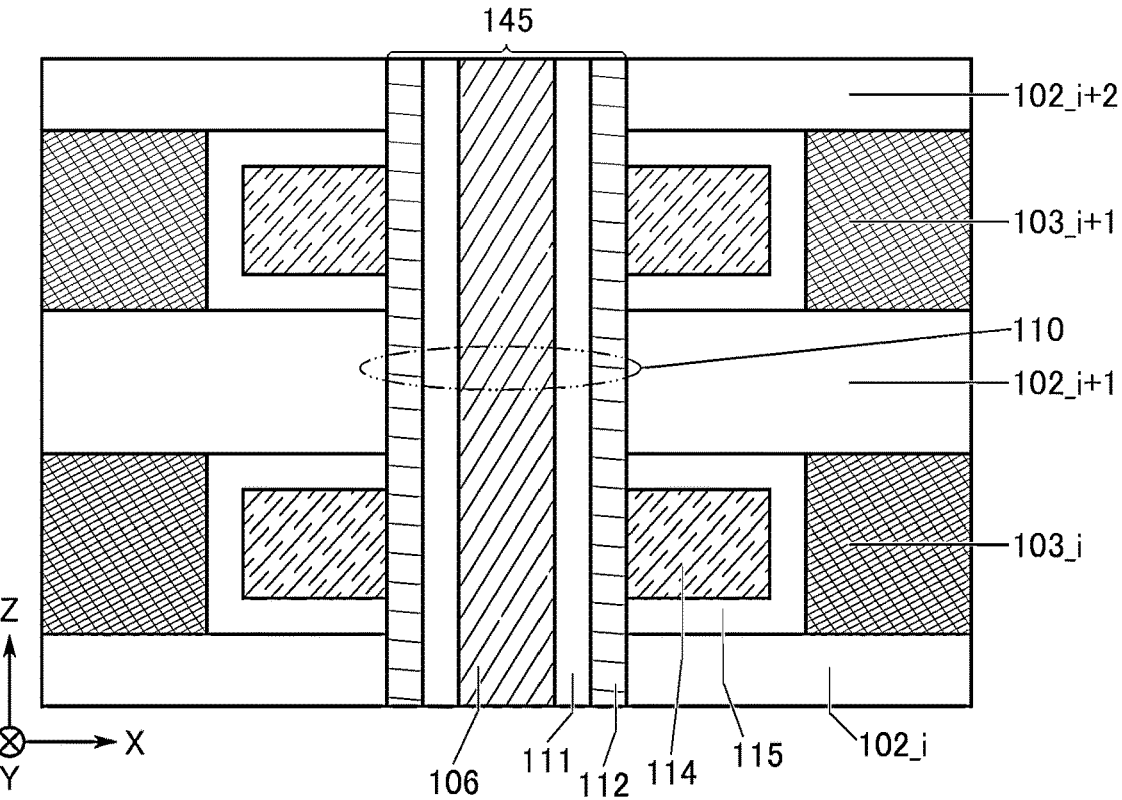
FIG. 12A and FIG. 12B are cross-sectional views illustrating a manufacturing method of a memory string.

Subsequently, the conductive layer 106 is formed along the side surface of the insulating layer 111 (see FIG. 12A). The conductive layer 106 is preferably formed to fill the opening 145.

In the above manner, the semiconductor layer 112, the insulating layer 111, and the conductive layer 106 included in the structure body 110 can be embedded in the opening 145.

Figure 12B:
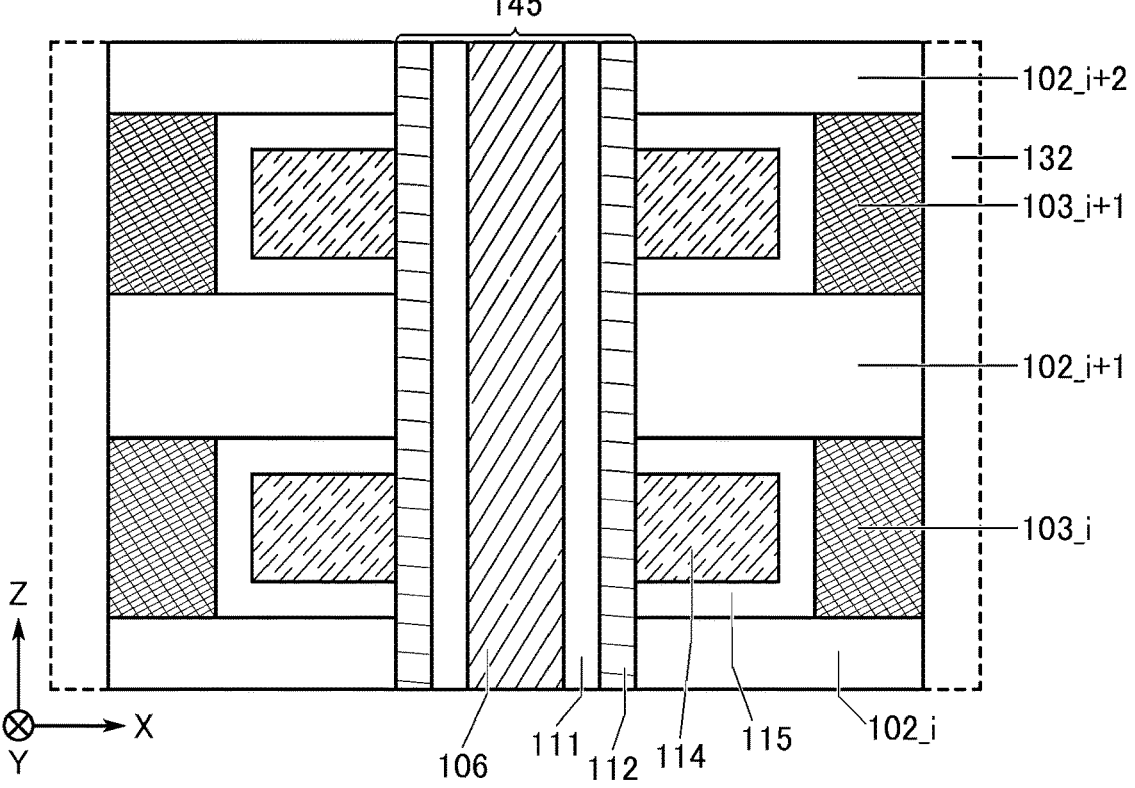

Next, part of the stacked body in a region that does not overlap with the structure body 110 when seen from the Z direction is removed, whereby a region 132 is formed (see FIG. 12B). The region 132 can be formed by a method similar to that for the opening 145. In the region 132, the side surfaces of the insulating layer 102 and the conductive layer 103 are exposed. The region 132 preferably has a band shape that extends in the X direction or the Y direction. Alternatively, the region 132 may have a lattice shape that extends in the X direction and the Y direction.

Figure 13:
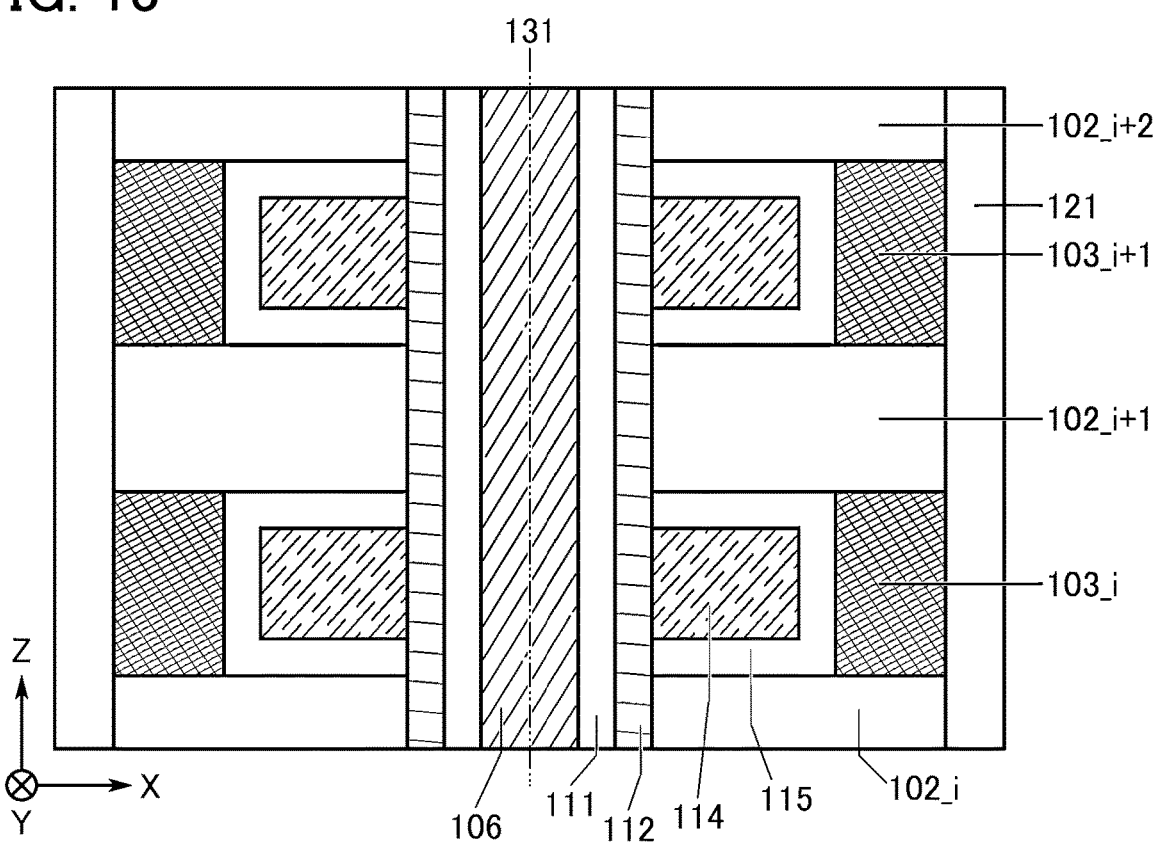
FIG. 13 is a cross-sectional view illustrating a manufacturing method of a memory string.

Next, the insulating layer 121 is formed to fill the region 132 (see FIG. 13). An insulating material having a function of inhibiting passage of impurities such as water and hydrogen is preferably used for the insulating layer 121, for example. For the insulating layer 121, aluminum oxide or the like is used, for example.

Note that the insulating layer 121 may have a stacked-layer structure of a plurality of insulating layers. For example, the insulating layer 121 may be a stack of hafnium oxide and silicon oxynitride. Among the plurality of insulating layers included in the insulating layer 121, the insulating layer in contact with the conductive layer 103 is preferably formed using an insulating layer that has a function of inhibiting passage of oxygen.

In the above manner, the memory string 100 can be manufactured.

Structure Example 3 of Memory String

Described below is another structure example of the memory string, which is partly different from the structure described above.

Structure Example 3-1

Figures 14A, 14B:
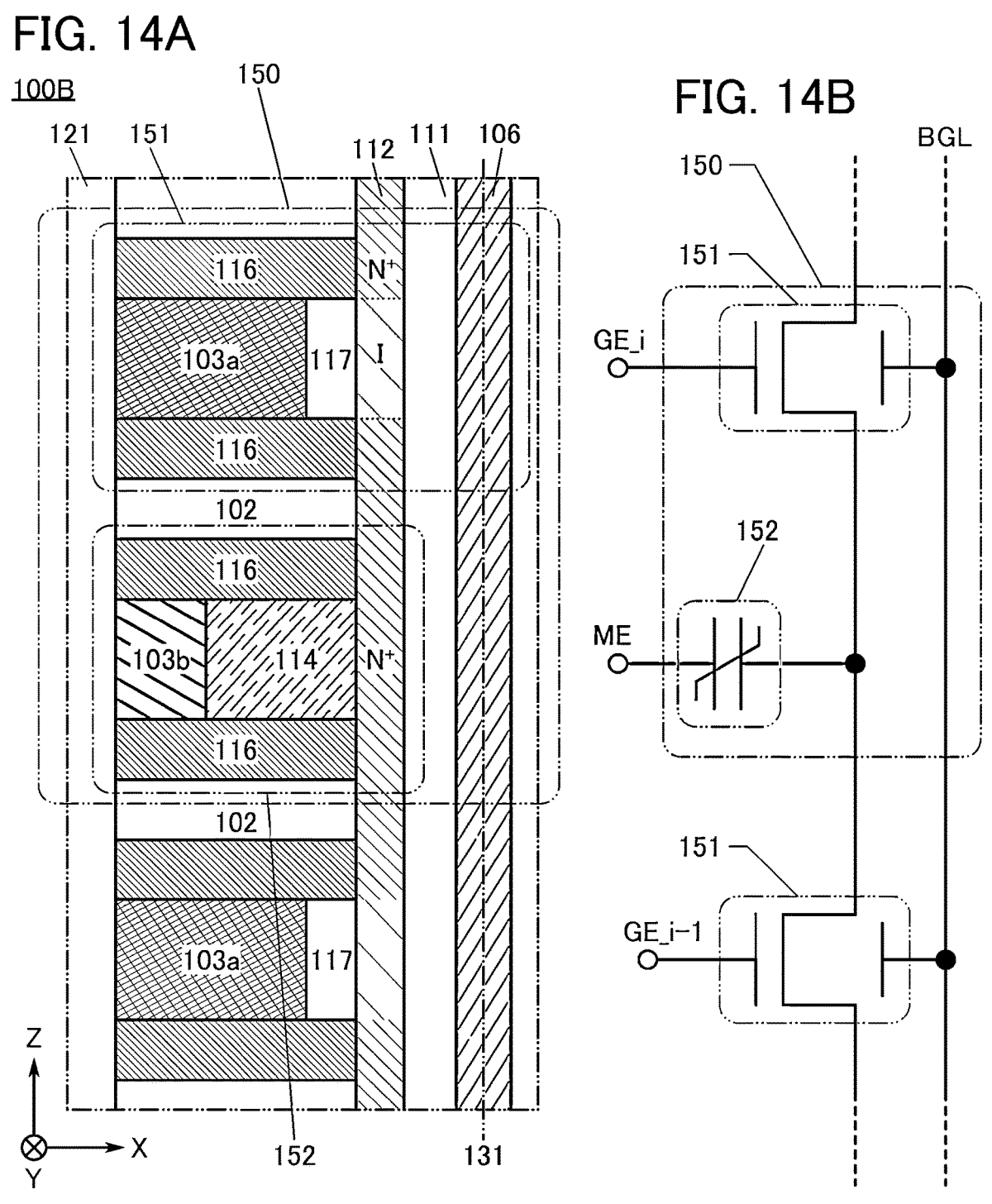

FIG. 14A illustrates a cross-sectional view of a structure of part of a memory string 100B described below as an example. FIG. 14B illustrates an equivalent circuit diagram corresponding to FIG. 14A.

The memory string 100B includes a plurality of memory cells 150, which are stacked in the Z direction with the insulating layer 102 therebetween. The memory cells 150 each include a transistor 151 and a capacitor 152.

The memory cell 150 has a structure including one transistor 151 and one capacitor 152 (also referred to as 1Tr1C). A ferroelectric capacitor using a ferroelectric is used as the capacitor 152. The memory cell 150 can also be referred to as an FeRAM (Ferroelectric Random Access Memory).

The memory string 100B includes the conductive layer 106, the insulating layer 111, the semiconductor layer 112, a conductive layer 103a, a conductive layer 103b, the functional layer 114, the insulating layer 116, an insulating layer 117, and the like.

The transistor 151 includes the conductive layer 103a, the insulating layer 117, the semiconductor layer 112, the insulating layer 111, and the conductive layer 106.

The transistor 151 has a structure in which a pair of gates are provided with the semiconductor layer 112 therebetween. The conductive layer 103a functions as one gate and the conductive layer 106 functions as the other gate. The insulating layer 117 functions as one gate insulating layer and the insulating layer 111 functions as the other gate insulating layer.

The capacitor 152 includes the conductive layer 103b, the functional layer 114, and the semiconductor layer 112.

The capacitor 152 has a structure in which the functional layer 114 is interposed between the conductive layer 103b and the semiconductor layer 112. The conductive layer 103b functions as one electrode and the semiconductor layer 112 functions as the other electrode.

A region of the semiconductor layer 112 that is in contact with the insulating layer 117 functions as a channel formation region (denoted as I) of the transistor 151. A part of the semiconductor layer 112 that is different from the channel formation region is preferably a low-resistance region (denoted as $N^+$) having a lower resistance than the channel formation region.

For example, when an oxide insulating film (preferably, a silicon oxide film) from which oxygen is released by heating is used as the insulating layer 117 in contact with the semiconductor layer 112, oxygen is supplied from the insulating layer 117 to the semiconductor layer 112 by heat in the manufacturing process to compensate for oxygen vacancies in the semiconductor layer 112, so that a high-resistance channel formation region can be selectively formed in the semiconductor layer 112.

The conductive layer 103a and the insulating layer 117 are interposed between a pair of insulating layers 116. The conductive layer 103b and the functional layer 114 are interposed between a pair of insulating layers 116. The insulating layer 102 is provided between adjacent two insulating layers 116.

An opening is provided in each insulating layer 102 and each insulating layer 116. The semiconductor layer 112, the insulating layer 111, and the conductive layer 106 are provided inside the openings.

Insulating films including different materials are preferably used as the insulating layer 116 and the insulating layer 102. In that case, a nitride insulating film and an oxide insulating film are preferably used as the insulating layer 116 and the insulating layer 102, respectively.

FIG. 14A illustrates an example in which the conductive layer 103a and the conductive layer 103b extend in the Y direction. Here, different conductive films are preferably used as the conductive layer 103a and the conductive layer 103b. This allows the transistor 151 and the capacitor 152 to be formed separately. For example, etching is performed first so that the side surface of the conductive layer 103a recedes, whereby the insulating layer 117 is formed. Then, etching is performed so that the side surface of the conductive layer 103b recedes, whereby the functional layer 114 is formed. After that, the semiconductor layer 112, the insulating layer 111, and the conductive layer 106 are formed, which enables the transistor 151 and the capacitor 152 to be formed separately. Note that etching for making the side surface of the conductive layer 103b recede may be performed first.

Structure Example 3-2

Figures 15A, 15B:
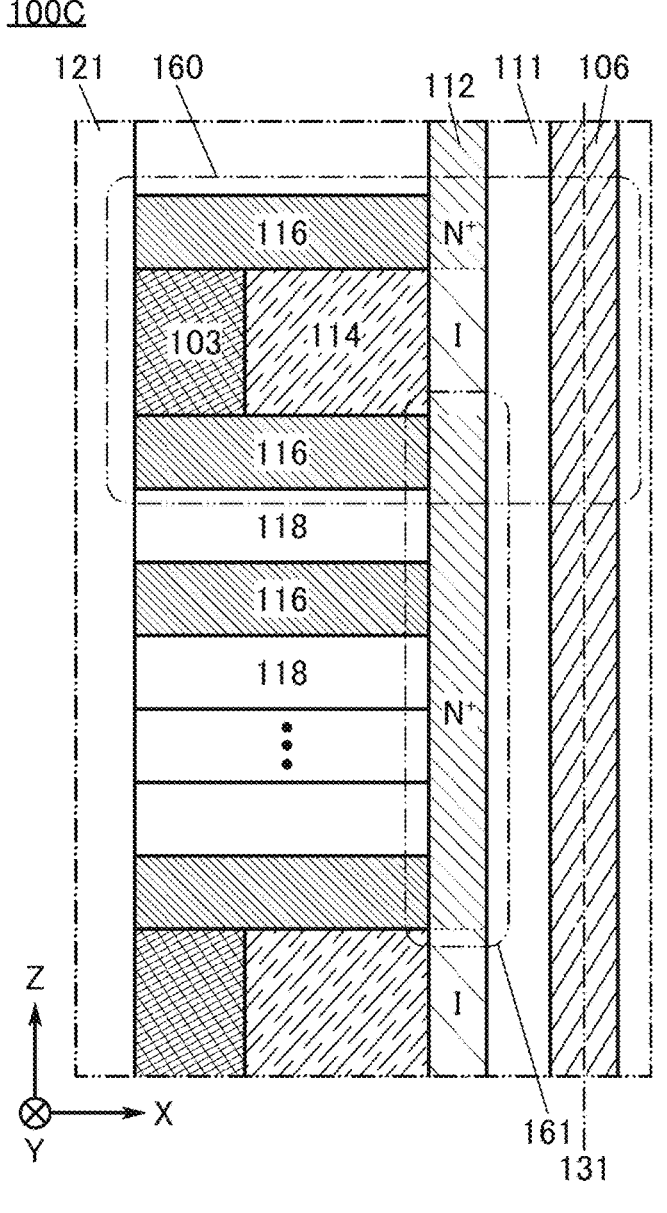
FIG. 15A is a cross-sectional view of a memory string.
FIG. 15B is a circuit diagram of the memory string.

FIG. 15A illustrates a cross-sectional view of a structure of part of a memory string 100C described below as an example. FIG. 15B illustrates an equivalent circuit diagram corresponding to FIG. 15A.

The memory string 100C includes a plurality of transistors 160, which are stacked in the Z direction with the insulating layers 116 and insulating layers 118 therebetween.

The transistor 160 includes a gate insulating layer using a ferroelectric, and can also be referred to as a ferroelectric transistor (FeFET: Ferroelectric FET).

The memory string 100C includes the conductive layer 106, the insulating layer 111, the semiconductor layer 112, the functional layer 114, the conductive layer 103, the insulating layers 116, the insulating layers 118, and the like.

The transistor 160 includes the conductive layer 103, the functional layer 114, the semiconductor layer 112, the insulating layer 111, and the conductive layer 106. The conductive layer 103 functions as one gate and the conductive layer 106 functions as the other gate. The functional layer 114, which has ferroelectricity, functions as one gate insulating layer. The insulating layer 111 functions as the other gate insulating layer.

The conductive layer 103 and the functional layer 114 are interposed between a pair of insulating layers 116. A region in which the insulating layers 116 and the insulating layers 118 are alternately stacked is included between a pair of conductive layers 103 adjacent in the Z direction and a pair of functional layers 114 adjacent in the Z direction.

Part of the semiconductor layer 112 is provided in contact with side surfaces of the insulating layers 116 and the insulating layers 118 in a region where the insulating layers 116 and the insulating layers 118 are alternately stacked. Here, the insulating layers 116 and the insulating layers 118 are preferably formed using materials with different linear thermal expansion coefficients. When the semiconductor layer 112 is thus provided in contact with the two types of insulating layers with different linear thermal expansion coefficients, the semiconductor layer 112 receives different stresses in a part in contact with the insulating layers 116 and a part in contact with the insulating layers 118 by heat applied during the manufacturing process (typically, heat higher than or equal to 200° C. and lower than or equal to 500° C.). As a result, strain energy due to the different stresses is given to the semiconductor layer 112 to cause strain in the semiconductor layer 112, increasing the carrier conductance. That is, a low-resistance region 161 (denoted as $N^+$) can be formed in the region of the semiconductor layer 112 that is in contact with the alternately stacked insulating layers 116 and insulating layers 118.

For example, a nitride insulating film and an oxide insulating film are preferably used as the insulating layer 116 and the insulating layer 118, respectively. For example, silicon nitride can be used for the insulating layer 116 and silicon oxide can be used for the insulating layer 118. Note that the stacking order of the insulating layer 116 and the insulating layer 118 is not limited to this and may be reversed. Alternatively, three or more insulating layers with different linear thermal expansion coefficients may be stacked.

On the other hand, a portion functioning as a channel formation region (denoted as I) of the transistor 160 is interposed between the functional layer 114 and the insulating layer 111. When an oxide insulating film (preferably, a silicon oxide film) from which oxygen is released by heating is used as the insulating layer 111, oxygen is supplied from the insulating layer 111 to the semiconductor layer 112 by heat in the manufacturing process to compensate for oxygen vacancies in the semiconductor layer 112, so that a high-resistance channel formation region can be selectively formed in the semiconductor layer 112.

An opening is provided in each insulating layer 116 and each insulating layer 118. The semiconductor layer 112, the insulating layer 111, and the conductive layer 106 are provided inside the openings.

Structure Example 3-3

Figures 16A, 16B:
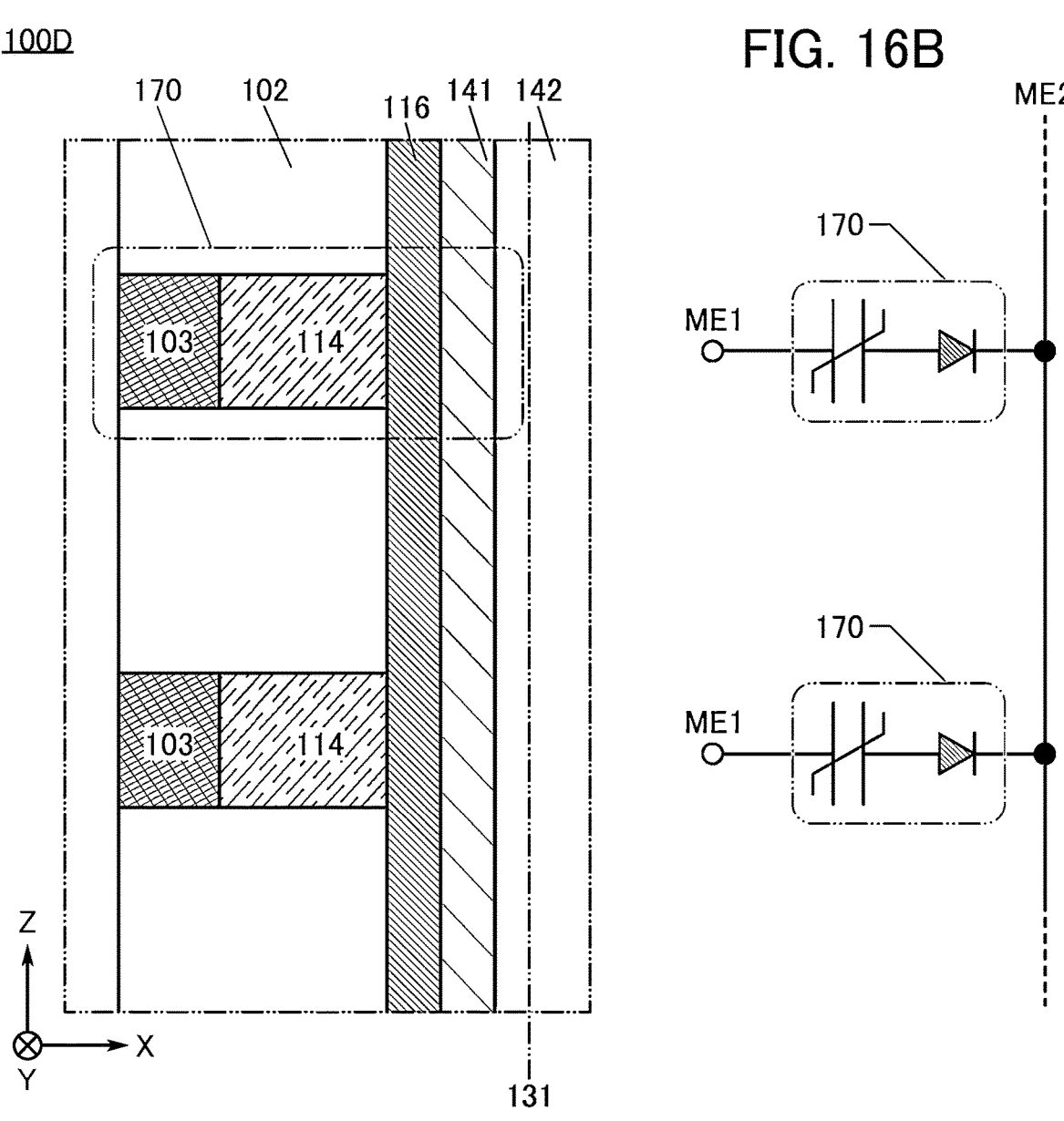
FIG. 16A is a cross-sectional view of a memory string.
FIG. 16B is a circuit diagram of the memory string.

FIG. 16A illustrates a cross-sectional view of a structure of part of a memory string 100D described below as an example. FIG. 16B illustrates an equivalent circuit diagram corresponding to FIG. 15A.

The memory string 100D includes a plurality of memory elements 170, which are stacked in the Z direction with the insulating layer 102 therebetween.

The memory element 170 has a structure in which a ferroelectric and the insulating layer 116 are interposed between a pair of electrodes. The memory element 170 can also be referred to as a ferroelectric tunnel junction (FTJ) memory.

The memory string 100D includes the conductive layer 103, the functional layer 114, the insulating layer 116, the conductive layer 141, the insulating layer 142, and the like. Note that the insulating layer 142 is not necessarily provided when not needed. In that case, the central axis 131 is formed to be positioned inside the conductive layer 141.

The memory element 170 includes the conductive layer 103, the functional layer 114, the insulating layer 116, and the conductive layer 141. The conductive layer 103 functions as one electrode and the conductive layer 141 functions as the other electrode. The conductive layer 103 corresponds to part of a wiring ME1 in FIG. 16B, and the conductive layer 141 corresponds to part of a wiring ME2.

In the memory element 170, the same conductive material can be used for the conductive layer 103 and the conductive layer 141. Note that different conductive materials may be used for these layers.

For the insulating layer 116, the above description of Modification example 1-1 can be referred to. For example, silicon nitride or silicon nitride oxide can be used for the insulating layer 116.

The conductive layer 103 and the functional layer 114 are interposed between a pair of insulating layers 102. At least one insulating layer 102 is provided between a pair of adjacent conductive layers 103 and adjacent functional layers 114. The insulating layer 102 may be a single layer or a stacked-layer film.

An opening is provided in each insulating layer 102. The insulating layer 116, the conductive layer 141, and the insulating layer 142 are provided inside the openings.

The above is the description of Structure example 3 of the memory string.

[Constituent Material of Memory Cell]

Next, constituent materials that can be used for the memory string 100 and the like are described.

<Substrate>

The memory string 100 can be provided over a substrate. An insulator substrate, a semiconductor substrate, or a conductor substrate is used as the substrate, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon or germanium as a material and a compound semiconductor substrate containing silicon carbide, silicon germanium, gallium arsenide, indium phosphide, zinc oxide, gallium oxide, gallium nitride (GaN), or the like. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate containing a metal nitride and a substrate containing a metal oxide. Other examples include an insulator substrate provided with a conductor or a semiconductor, a semiconductor substrate provided with a conductive layer or an insulating layer, and a conductor substrate provided with a semiconductor layer or an insulating layer. Alternatively, these substrates provided with elements may be used. Examples of the element provided for the substrate include a capacitor, a resistor, a switching element, a light-emitting element, and a memory element.

<Insulating Layer>

For an insulating layer, an oxide, a nitride, an oxynitride, a nitride oxide, a metal oxide, a metal oxynitride, and a metal nitride oxide, each of which has an insulating property, can be used.

As miniaturization and high integration of the transistor progress, for example, a problem such as leakage current may arise because of a thinner gate insulating layer. When a high-k material is used for the insulating layer functioning as the gate insulating layer, voltage during operation of the transistor can be reduced while the physical thickness of the gate insulating layer is maintained. In contrast, when a material with low relative permittivity is used for the insulating layer functioning as an interlayer film, parasitic capacitance generated between wirings can be reduced. Thus, a material is preferably selected depending on the function of an insulating layer.

Examples of an insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of an insulator with low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulating layer having a function of inhibiting passage of oxygen and impurities such as hydrogen, the transistor can have stable electrical characteristics. As the insulating layer having a function of inhibiting passage of oxygen and impurities such as hydrogen, a single layer or stacked layers of an insulating film containing, for example, boron, carbon, nitrogen, oxygen, fluorine, magnesium, aluminum, silicon, phosphorus, chlorine, gallium, germanium, yttrium, zirconium, lanthanum, neodymium, hafnium, or tantalum are used. Specifically, as the insulating layer having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

Note that in this specification and the like, for example, silicon oxynitride refers to a silicon compound that contains more oxygen than nitrogen, and silicon nitride oxide refers to a silicon compound that contains more nitrogen than oxygen. Also in this specification and the like, for example, aluminum oxynitride refers to an aluminum compound that contains more oxygen than nitrogen, and aluminum nitride oxide refers to an aluminum compound that contains more nitrogen than oxygen.

In the case where an oxide semiconductor is used as the semiconductor layer 112, it is preferable that the insulating layer adjacent to the semiconductor layer 112 be an insulating layer including a region containing oxygen released by heating. For example, when a structure in which silicon oxide or silicon oxynitride including a region containing oxygen released by heating is in contact with the semiconductor layer 112 is employed, oxygen vacancies included in the semiconductor layer 112 can be compensated for.

As the insulating layer, a single layer of an insulating film formed using the above material may be used, or a stack of a plurality of insulating layers formed using the above material may be used.

For example, in the case where an insulating layer is provided in contact with a conductive layer, an insulating layer that has a function of inhibiting passage of oxygen may be used as the insulating layer in order to prevent oxidation of the conductive layer. For example, hafnium oxide, aluminum oxide, silicon nitride, or the like may be used as the insulating layer.

In the case where insulating layers are stacked adjacent to a conductive layer, an insulating layer that has a function of inhibiting passage of oxygen is preferably used as the insulating layer in contact with the conductive layer. For example, the insulating layer in contact with the conductive layer may be formed using hafnium oxide, and an insulating layer containing silicon oxynitride may be formed in contact with the insulating layer.

<Conductive Layer>

For the conductive layer, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electric conductivity, typified by polycrystalline silicon containing an impurity element such as phosphorus, or silicide such as nickel silicide may be used.

As the conductive layer, a single conductive layer formed using the above material may be used, or a stack of a plurality of conductive layers formed using the above material may be used. For example, a stacked-layer structure in which a material containing the above metal element and a conductive material containing oxygen are combined may be employed. Alternatively, a stacked-layer structure in which a material containing the above metal element and a conductive material containing nitrogen are combined may be employed. Alternatively, a stacked-layer structure in which a material containing the above metal element, a conductive material containing oxygen, and a conductive material containing nitrogen are combined may be employed.

<Oxide Semiconductor>

An oxide semiconductor, which is a kind of metal oxide, is preferably used as the semiconductor layer 112. An oxide semiconductor that can be used for the OS transistor will be described below.

The oxide semiconductor preferably contains at least indium or zinc. In particular, indium and zinc are preferably contained. In addition, aluminum, gallium, yttrium, tin, or the like is preferably contained. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide that contains indium, the element M, and zinc is considered. Note that the element M is one or more elements selected from aluminum, gallium, yttrium, and tin. Other elements that can be applied to the element M include boron, titanium, iron, nickel, germanium, zirconium, molybdenum, lanthanum, cerium, neodymium, hafnium, tantalum, tungsten, magnesium, cobalt, and the like. Note that a plurality of above elements may be combined as the element M in some cases. Typical examples of the In-M-Zn oxide include an In—Ga—Zn oxide (also referred to as IGZO), an In—Sn—Zn oxide, and an In—Al—Zn oxide (also referred to as IAZO).

<Classification of Crystal Structures>

First, classification of the crystal structures of an oxide semiconductor is described with reference to FIG. 17A. FIG. 17A is a diagram showing the classification of crystal structures of an oxide semiconductor, typically IGZO (a metal oxide containing In, Ga, and Zn).

As shown in FIG. 17A, an oxide semiconductor is roughly classified into "Amorphous," "Crystalline", and "Crystal". In addition, the term "Amorphous" includes completely amorphous. Furthermore, the term "Crystalline" includes CAAC (c-axis-aligned crystalline), nc (nanocrystalline), and CAC (cloud-aligned composite) (excluding single crystal and poly crystal). Note that in classification of "Crystalline," single crystal, poly crystal, and completely amorphous are excluded. Moreover, the term "Crystal" includes single crystal and poly crystal.

The structures shown in the thick frame in FIG. 17A are in an intermediate state between "Amorphous" and "Crystal", and belong to a new crystalline phase. That is, these structures can be rephrased as structures completely different from "Amorphous", which is energetically unstable, and "Crystal".

A crystal structure of a film or a substrate can be evaluated with an X-ray diffraction (XRD) spectrum. Here, FIG. 17B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 17B and obtained by GIXD measurement is hereinafter simply referred to as an XRD spectrum. The CAAC-IGZO film shown in FIG. 17B has a composition in the neighborhood of In:Ga:Zn=4:2:3 [atomic ratio]. The thickness of the CAAC-IGZO film shown in FIG. 17B is 500 nm.

As shown in FIG. 17B, a clear peak (Intensity) indicating crystallinity is detected in the XRD spectrum of the CAAC-IGZO film. Specifically, a peak indicating c-axis alignment is detected at 2θ of around 31° in the XRD spectrum of the CAAC-IGZO film. Note that as shown in FIG. 17B, the peak at 2θ of around 31° is asymmetric with respect to the axis of an angle at which peak intensity is detected.

A crystal structure of a film or a substrate can also be evaluated with a diffraction pattern observed by a nanobeam electron diffraction (NBED) method (such a pattern is also referred to as a nanobeam electron diffraction pattern). FIG. 17C shows a diffraction pattern of the CAAC-IGZO film. FIG. 17C shows a diffraction pattern observed by NBED in which an electron beam is incident in a direction parallel to the substrate. Note that the CAAC-IGZO film shown in FIG. 17C has a composition in the vicinity of In:Ga:Zn=4:2:3 [atomic ratio]. Furthermore, in the nanobeam electron diffraction method, electron diffraction is performed with a probe diameter of 1 nm.

As shown in FIG. 17C, a plurality of spots indicating c-axis alignment are observed in the diffraction pattern of the CAAC-IGZO film.

<Structure of Oxide Semiconductor>

Note that oxide semiconductors might be classified in a manner different from that in FIG. 17A when classified in terms of the crystal structure. Oxide semiconductors are classified into a single crystal oxide semiconductor and a non-single-crystal oxide semiconductor, for example. Examples of the non-single-crystal oxide semiconductor include a CAAC-OS (C Axis Aligned Crystalline Oxide Semiconductor) and an nc-OS (nanocrystalline Oxide Semiconductor). Other examples of the non-single-crystal oxide semiconductor include a polycrystalline oxide semiconductor, an amorphous-like oxide semiconductor (a-like OS), an amorphous oxide semiconductor, and the like.

Next, the CAAC-OS, the nc-OS, and the a-like OS are described in detail.

<CAAC-OS>

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having periodic atomic arrangement. Note that when atomic arrangement is regarded as lattice arrangement, the crystal region also refers to a region with uniform lattice arrangement. Furthermore, the CAAC-OS has a region where a plurality of crystal regions are connected in an a-b plane direction, and the region has distortion in some cases. Note that distortion refers to a portion where the direction of lattice arrangement changes between a region with uniform lattice arrangement and another region with uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. Alternatively, in the case where the crystal region is formed of a large number of fine crystals, the size of the crystal region is sometimes approximately several tens of nanometers.

In an In-M-Zn oxide (the element M is one or more kinds selected from aluminum, gallium, yttrium, and tin), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) might change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, lattice arrangement in the crystal region is basically hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear grain boundary cannot be observed even in the vicinity of the distortion in the CAAC-OS. That is, it is found that formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, it can be said that a reduction in electron mobility due to the grain boundary is unlikely to occur. In addition, entry of impurities, formation of defects, or the like might decrease the crystallinity of an oxide semiconductor. This means that the CAAC-OS can also be referred to as an oxide semiconductor having small amounts of impurities and defects (oxygen vacancies or the like). Therefore, physical properties of an oxide semiconductor including the CAAC-OS become stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

<nc-OS>

In the nc-OS, a microscopic region (e.g., a region greater than or equal to 1 nm and less than or equal to 10 nm, in particular, a region greater than or equal to 1 nm and less than or equal to 3 nm) has periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. In addition, there is no regularity of crystal orientation between different nanocrystals in the nc-OS. Hence, the orientation in the whole film is not observed. Accordingly, in some cases, the nc-OS cannot be distinguished from an a-like OS, an amorphous oxide semiconductor, or the like depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are obtained in the observed electron diffraction pattern when the nc-OS film is subjected to electron diffraction (also referred to as nanobeam electron diffraction) using an electron beam with a probe diameter close to or smaller than the size of a nanocrystal (e.g., greater than or equal to 1 nm and less than or equal to 30 nm).

<a-Like OS>

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<Composition of Oxide Semiconductor>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region contains indium oxide, indium zinc oxide, or the like as its main component. In addition, the second region contains gallium oxide, gallium zinc oxide, or the like as its main component. That is, the first region can be referred to as a region containing In as its main component. Furthermore, the second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

Oxide semiconductors have various structures and each have different properties. Two or more kinds among the amorphous oxide semiconductor, the polycrystalline oxide semiconductor, the a-like OS, the CAC-OS, the nc-OS, and the CAAC-OS may be included in an oxide semiconductor according to one embodiment of the present invention.

<Transistor Including Oxide Semiconductor>

Next, the case where the oxide semiconductor is used for a transistor is described.

When the oxide semiconductor is used for a transistor, a transistor with high field-effect mobility can be achieved. In addition, a highly reliable transistor can be achieved.

An oxide semiconductor having a low carrier concentration is preferably used for a channel formation region of the transistor. For example, the carrier concentration of an oxide semiconductor in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, and yet still further preferably lower than $1 \times 10^{12}$ cm$^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor. In addition, a highly purified intrinsic or substantially highly purified intrinsic state is sometimes referred to as an i-type or a substantially i-type.

A highly purified intrinsic or substantially highly purified intrinsic oxide semiconductor film has a low density of defect states and accordingly has a low density of trap states in some cases.

Charge captured by the trap states in an oxide semiconductor takes a long time to disappear and might behave like fixed charge. Thus, a transistor whose channel formation region is formed in an oxide semiconductor having a high density of trap states has unstable electrical characteristics in some cases.

Accordingly, in order to stabilize electrical characteristics of the transistor, reducing the impurity concentration in the oxide semiconductor is effective. In order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in a channel formation region of the oxide semiconductor and the concentration of silicon or carbon in the vicinity of an interface with the channel formation region of the oxide semiconductor (the concentration obtained by secondary ion mass spectrometry (SIMS)) are each set lower than or equal to $2 \times 10^{18}$ atoms/ $cm^3$, preferably lower than or equal to $2 \times 10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the channel formation region of the oxide semiconductor that is obtained by SIMS is lower than or equal to $1 \times 10^{18}$ atoms/$cm^3$, preferably lower than or equal to $2 \times 10^{16}$ atoms/$cm^3$.

An oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. Alternatively, when nitrogen is contained in the oxide semiconductor, a trap state is sometimes formed. This might make the electrical characteristics of the transistor unstable. Therefore, the concentration of nitrogen in the channel formation region of the oxide semiconductor that is obtained by SIMS is set lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, and still further preferably lower than or equal to $5 \times 10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor that contains hydrogen tends to have normally-on characteristics. For this reason, hydrogen in the channel formation region of the oxide semiconductor is preferably reduced as much as possible. Specifically, the hydrogen concentration in the channel formation region of the oxide semiconductor that is obtained by SIMS is set lower than $1 \times 10^{20}$ atoms/$cm^3$, preferably lower than $5 \times 10^{19}$ atoms/$cm^3$, further preferably lower than $1 \times 10^{19}$ atoms/$cm^3$, still further preferably lower than $5 \times 10^{18}$ atoms/$cm^3$, and yet still further preferably lower than $1 \times 10^{18}$ atoms/$cm^3$.

When an oxide semiconductor with sufficiently reduced impurities is used for a channel formation region in a transistor, the transistor can have stable electrical characteristics.

<Other Semiconductor Materials>

Semiconductor materials that can be used for the semiconductor layer 112 are not limited to the above oxide semiconductors. A semiconductor material having a bandgap (a semiconductor material that is not a zero-gap semiconductor) may be used for the semiconductor layer 112. For example, a single element semiconductor such as silicon, a compound semiconductor such as gallium arsenide, or a layered substance (also referred to as an atomic layered substance, a two-dimensional material, or the like) may be used as a semiconductor material. In particular, a layered substance functioning as a semiconductor is preferably used as a semiconductor material.

In this specification and the like, the layered substance is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered substance has high electrical conductivity in a monolayer, that is, high two-dimensional electrical conductivity. When a material functioning as a semiconductor and having high two-dimensional electrical conductivity is used for a channel formation region, a transistor having high on-state current can be provided.

Examples of the layered substance include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As a semiconductor material used in a semiconductor device according to one embodiment of the present invention, for example, transition metal chalcogenide functioning as a semiconductor may be used. Specific examples include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

<Deposition Method>

The conductive layers, insulating layers, and semiconductor layers can be formed by a sputtering method, a CVD method, a molecular beam epitaxy (MBE) method, a pulsed laser deposition (PLD) method, an atomic layer deposition (ALD) method, or the like.

Note that the CVD method can be classified into a plasma enhanced CVD (PECVD) method utilizing plasma, a thermal CVD (TCVD) method utilizing heat, a photo CVD method utilizing light, and the like. Moreover, the CVD method can be classified into a metal CVD (MCVD) method and a metal organic CVD (MOCVD) method depending on a source gas to be used.

The plasma CVD method enables a high-quality film to be obtained at a comparatively low temperature. In addition, a thermal CVD method is a deposition method that does not use plasma and thus causes less plasma damage to an object to be processed. For example, a wiring, an electrode, an element (a transistor, a capacitor, or the like), or the like included in a semiconductor device might be charged up by receiving charge from plasma. In that case, accumulated charge might break the wiring, the electrode, the element, or the like included in the semiconductor device. In contrast, in the case of a thermal CVD method not using plasma, such plasma damage is not caused and the yield of the semiconductor device can be increased. Furthermore, a film with few defects can be obtained by a thermal CVD method because plasma damage during deposition is not caused.

An ALD method is also a deposition method that causes less plasma damage to an object to be processed. Furthermore, an ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of an object to be processed.

Thus, the CVD method and the ALD method are deposition methods that enable good step coverage almost regardless of the shape of an object to be processed. In particular, the ALD method enables excellent step coverage and excellent thickness uniformity and thus is suitably used to cover a surface of an opening with a high aspect ratio, for example. Meanwhile, the ALD method has a comparatively low deposition rate, and thus is preferably used in combination with another deposition method with a high deposition rate, such as the CVD method, in some cases.

The CVD method and the ALD method enable the composition of a film to be obtained to be controlled by the flow rate ratio of source gases. For example, by the CVD method and the ALD method, a film with a certain composition can be deposited depending on the flow rate ratio of the source gases. Moreover, for example, by the CVD method and the ALD method, a film whose composition is continuously changed can be deposited by changing the flow rate ratio of the source gases during deposition. In the case of depositing a film while changing the flow rate ratio of the source gases, as compared with the case of depositing a film using a plurality of deposition chambers, the time taken for deposition can be shortened because the time taken for transfer and pressure adjustment is omitted. Thus, the productivity of the semiconductor device can be increased in some cases.

Deposition by an ALD method may be performed in such a manner that pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust film thickness and is thus suitable for manufacturing a minute FET.

A variety of films such as metal films, semiconductor films, and inorganic insulating films can be formed by a thermal CVD method such as a MOCVD method or an ALD method. For example, trimethylindium (In(CH$_3$)$_3$), trimethylgallium (Ga(CH$_3$)$_3$), and dimethylzinc (Zn(CH$_3$)$_2$) are used to deposit an In—Ga—Zn—O film. Without limitation to the above combination, triethylgallium (Ga(C$_2$H$_5$)$_3$) can also be used instead of trimethylgallium and diethylzinc (Zn(C$_2$H$_5$)$_2$) can also be used instead of dimethylzinc.

For example, in the case where a hafnium oxide film is formed by a deposition apparatus utilizing ALD, two kinds of gases, ozone (O$_3$) as an oxidizer and a source gas that is obtained by vaporizing liquid containing a solvent and a hafnium precursor compound (hafnium alkoxide or hafnium amide such as tetrakis(dimethylamide)hafnium (TDMAH, Hf[N(CH$_3$)$_2$]$_4$)), are used. Examples of another material include tetrakis(ethylmethylamide)hafnium.

For example, in the case where an aluminum oxide film is formed by a deposition apparatus utilizing ALD, two kinds of gases, H$_2$O as an oxidizer and a source gas that is obtained by vaporizing liquid containing a solvent and an aluminum precursor compound (trimethylaluminum (TMA, Al(CH$_3$)$_3$) or the like) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus utilizing ALD, hexachlorodisilane is adsorbed on a surface on which a film is to be formed, and radicals of an oxidizing gas (O$_2$ or dinitrogen monoxide) are supplied to react with the adsorbate.

For example, in the case where a tungsten film is deposited by a deposition apparatus utilizing ALD, a WF$_6$ gas and a B$_2$H$_6$ gas are sequentially and repeatedly introduced to form an initial tungsten film, and then a WF$_6$ gas and an H$_2$ gas are sequentially and repeatedly introduced to form a tungsten film. Note that an SiH$_4$ gas may be used instead of a B$_2$H$_6$ gas.

For example, in the case where an oxide semiconductor film, e.g., an In—Ga—Zn—O film, is deposited by a deposition apparatus utilizing ALD, an In(CH$_3$)$_3$ gas and an O$_3$ gas) are sequentially and repeatedly introduced to form an In—O layer, a Ga(CH$_3$)$_3$ gas and an O$_3$ gas) are sequentially and repeatedly introduced to form a GaO layer, and then a Zn(CH$_3$)$_2$ gas and an O$_3$ gas) are sequentially and repeatedly introduced to form a ZnO layer. Note that the order of these layers is not limited to this example. A mixed oxide layer such as an In—Ga—O layer, an In—Zn—O layer, or a Ga—Zn—O layer may be formed by using these gases. Note that although an H$_2$O gas that is obtained by bubbling water with an inert gas such as Ar may be used instead of an O$_3$ gas), it is preferable to use an O$_3$ gas), which does not contain H. Furthermore, instead of an In(CH$_3$)$_3$ gas, an In(C$_2$H$_5$)$_3$ gas may be used. Furthermore, instead of a Ga(CH$_3$)$_3$ gas, a Ga(C$_2$H$_5$)$_3$ gas may be used. Furthermore, instead of a Zn(CH$_3$)$_2$ gas, a Zn(C$_2$H$_5$)$_2$ gas may be used.

A deposition method by an ALD method and a deposition apparatus are described below more specifically.

The ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition.

In the ALD method, a first source gas (also referred to as a precursor) for reaction and a second source gas (also referred to as an oxidizing gas) for reaction are alternately introduced into a chamber and repetitive introduction of these source gases forms a film. When the precursor or the oxidizing gas is introduced, N$_2$, Ar, or the like may be introduced into a reaction chamber as a carrier purge gas, together with the precursor or the oxidizing gas. By using the carrier purge gas, the precursor or the oxidizing gas can be inhibited from being adsorbed on an inner side of a pipe or an inner side of a valve and can be introduced into the reaction chamber (also referred to as a carrier gas). Furthermore, the precursor or the oxidizing gas remaining in the reaction chamber can be exhausted quickly (also referred to as a purge gas). Thus, the carrier purge gas can be so called because the gas has two functions of introduction (carrier) and exhaustion (purge). Using the carrier purge gas is preferable to improve the uniformity of the formed film.

Figure 18A:
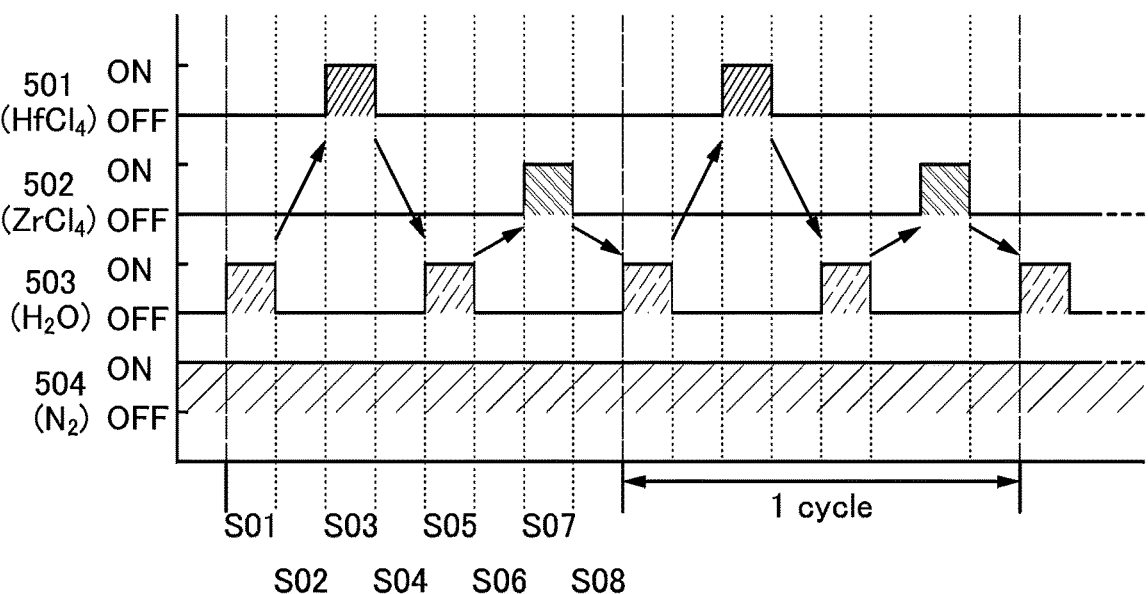
FIG. 18A and FIG. 18C are diagrams each showing a deposition sequence of a metal oxide film.

FIG. 18A illustrates a deposition sequence of a film of the material that can exhibit ferroelectricity (hereinafter referred to as a ferroelectric layer) by an ALD method. An example of depositing a ferroelectric layer containing hafnium oxide and zirconium oxide is described below.

As a precursor 501, a precursor that contains hafnium and any one or more selected from chlorine, fluorine, bromine, iodine, and hydrogen can be used. Furthermore, as a precursor 502, a precursor that contains zirconium and any one or more selected from chlorine, fluorine, bromine, iodine, and hydrogen can be used. Here, $HfCl_4$ is used as the precursor 501 containing hafnium, and $ZrCl_4$ is used as the precursor 502 containing zirconium.

Note that the precursor 501 and the precursor 502 are formed by gasifying a liquid source material or a solid source material by heating. The precursor 501 is formed from a solid source material of $HfCl_4$, and the precursor 502 is formed of a solid source material of $ZrCl_4$. Impurities are preferably reduced in the precursor 501 and the precursor 502 and also in the solid source materials thereof. Examples of the impurities include Ba, Cd, Co, Cr, Cu, Fe, Ga, Li, Mg, Mn, Na, Ni, Sr, V, and Zn. In the solid source material of $HfCl_4$ and the solid source material of $ZrCl_4$, the above-described impurities preferably exist at less than 1000 wppb. Here, wppb is a unit representing the concentration of impurities converted by mass in parts per billion.

As an oxidizing gas 503, any one or more selected from $O_2$, $O_3$, $N_2O$, $NO_2$, $H_2O$, and $H_2O_2$ can be used. Here, a gas containing $H_2O$ is used as the oxidizing gas 503. Furthermore, as a carrier purge gas 504, any one or more selected from Na, He, Ar, Kr, and Xe can be used. Here, Na is used as the carrier purge gas 504.

First, the oxidizing gas 503 is introduced into a reaction chamber (Step S01). Next, the introduction of the oxidizing gas 503 is stopped, so that only the carrier purge gas 504 is left to purge the oxidizing gas 503 remaining in the reaction chamber (Step S02). Next, the precursor 501 and the carrier purge gas 504 are introduced into the reaction chamber, and the pressure in the reaction chamber is kept constant (Step S03). In this way, the precursor 501 is adsorbed on the formation surface. Next, the introduction of the precursor 501 is stopped, so that only the carrier purge gas 504 is left to purge the precursor 501 remaining in the reaction chamber (Step S04). Next, the oxidizing gas 503 is introduced into the reaction chamber. The introduction of the oxidizing gas 503 causes oxidation of the precursor 501 to form hafnium oxide (Step S05). Next, the introduction of the oxidizing gas 503 is stopped, so that only the carrier purge gas 504 is left to purge the oxidizing gas 503 remaining in the reaction chamber (Step S06).

Next, the precursor 502 and the carrier purge gas 504 are introduced into the reaction chamber, and the pressure in the reaction chamber is kept constant (Step S07). In this way, the precursor 502 is adsorbed on an oxygen layer of the hafnium oxide. Next, the introduction of the precursor 502 is stopped, so that only the carrier purge gas 504 is left to purge the precursor 502 remaining in the reaction chamber (Step S08). Next, the process returns to Step S01, and the oxidizing gas 503 is introduced into the reaction chamber. The introduction of the oxidizing gas 503 causes oxidation of the precursor 502 to form zirconium oxide on hafnium oxide. Step S01 to Step S08 described above are defined as one cycle, and the cycle is repeated until a desired thickness is obtained. Note that Step S01 to Step S08 are each performed within a temperature range that is higher than or equal to 250° C. and lower than or equal to 450° C., preferably a temperature range that is higher than or equal to 350° C. and lower than or equal to 400° C.

By the deposition by the ALD method in the above-described manner, a layered crystal structure in which a hafnium layer, an oxygen layer, a zirconium layer, and an oxygen layer are repeated can be formed. Furthermore, by the deposition using the precursors with reduced impurities in the above-described manner, hindrance to the formation of the layered crystal structure due to impurity entry during the deposition can be inhibited. Such a layered crystal structure with high crystallinity achieves high ferroelectricity.

Figure 18B:
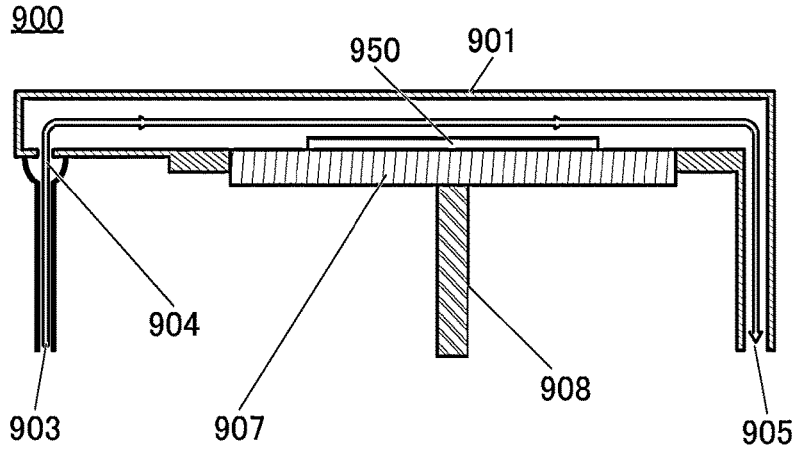
FIG. 18B is a cross-sectional view of a manufacturing apparatus of the metal oxide film.

Next, a manufacturing apparatus used for deposition by the above-described ALD method is described with reference to FIG. 18B. FIG. 18B is a schematic diagram of a manufacturing apparatus 900 that is used for the ALD method.

As illustrated in FIG. 18B, the manufacturing apparatus 900 includes a reaction chamber 901, a gas inlet 903, a reaction chamber entrance 904, an exhaust port 905, a wafer stage 907, and a shaft 908. In FIG. 18B, a wafer 950 is placed on the wafer stage 907.

A heater system for heating the inside of the reaction chamber 901, the precursor 501, the precursor 502, the oxidizing gas 503, and the carrier purge gas 504 may be placed in the reaction chamber 901. Furthermore, the wafer stage 907 may be provided with a heater system for heating the wafer 950. Moreover, the wafer stage 907 may be provided with a rotation mechanism which rotates horizontally with the shaft 908 as a rotation axis. Although not shown, a gas supply system for introducing each of the precursor 501, the precursor 502, the oxidizing gas 503, and the carrier purge gas 504 into the gas inlet 903 with an appropriate timing for an appropriate time at an appropriate flow rate is placed upstream from the gas inlet. Furthermore, although not shown, an exhaust system including a vacuum pump is placed downstream from the exhaust port 905.

The manufacturing apparatus 900 illustrated in FIG. 18B is what is called a crossflow ALD apparatus. The flow of the precursor 501, the precursor 502, the oxidizing gas 503, and the carrier purge gas 504 in the crossflow type is described below. The precursor 501, the precursor 502, the oxidizing gas 503, and the carrier purge gas 504 flow from the gas inlet 903 to the reaction chamber 901 through the reaction chamber entrance 904, reach the wafer 950, and are exhausted through the exhaust port 905. An arrow illustrated in FIG. 8 schematically indicates the gas flow direction.

As described above, in Step S05 of introducing the oxidizing gas 503 into the reaction chamber 901, which is illustrated in FIG. 18A, the precursor 501 adsorbed on the wafer 950 is oxidized by the oxidizing gas 503 to form hafnium oxide. Owing to the structure of the crossflow manufacturing apparatus 900, the oxidizing gas 503 reaches the wafer 950 after being exposed to a heated component in the reaction chamber for a long time. Thus, in the case of using $O_3$ as the oxidizing gas 503, for example, the oxidizing gas 503 reacts with the high-temperature solid surface before reaching the wafer 950 and is decomposed to have lower oxidizability. For this reason, the deposition rate of hafnium oxide depends on the distance the oxidizing gas flows to reach the wafer 950 from the reaction chamber entrance 904. In the case where the wafer stage 907 is rotated horizontally with the shaft 908 as a center, the periphery of the wafer 950 first reaches the oxidizing gas 503; therefore, the thickness of hafnium oxide becomes larger toward the periphery of the wafer 950 and smaller in the center portion than in the periphery.

Thus, to inhibit the oxidizing gas 503 from being decomposed and having reduced oxidizability, the heating temperature of the reaction chamber needs to be set at an appropriate temperature. Although the description has been made by giving oxidation of the precursor 501 as an example, the same applies to oxidation of the precursor 502.

In the above manner, hafnium oxide with excellent thickness uniformity in the substrate plane can be formed. The uniformity in the substrate plane is preferably less than or equal to ±1.5%, further preferably less than or equal to ±1.0%. Here, the substrate plane refers to the range of a square with a side of five inches. Furthermore, when (the maximum thickness in the substrate plane)–(the minimum thickness in the substrate plane) is defined as RANGE and the thickness uniformity in the substrate plane is defined as ±PNU (Percent Non Uniformity) (%), the thickness uniformity in the substrate plane can be calculated from ±PNU (%)=(RANGE×100)/(2×the average thickness in the substrate plane).

When an oxygen layer with excellent uniformity is formed with the use of the oxidizing gas 503, a layered crystal structure with higher regularity can be formed, achieving high ferroelectricity.

As another example of the deposition method of an oxide by an ALD method, a deposition method of an In-M-Zn oxide is described with reference to FIG. 18C.

Figure 18C:
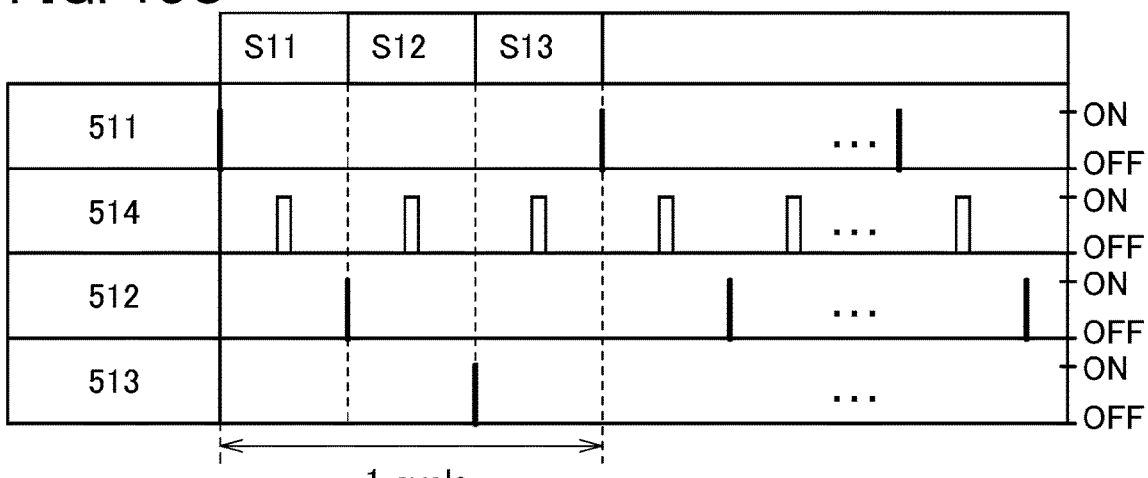

FIG. 18C shows an example of a deposition sequence using a precursor 511 to a precursor 513 and an oxidizing gas 514. Note that the deposition sequence includes Step S11 to Step S13.

A precursor containing indium can be used as the precursor 511. A precursor containing the element M can be used as the precursor 512. A precursor containing zinc can be used as the precursor 513. Note that a precursor formed with an inorganic material (referred to as an inorganic precursor in some cases) or a precursor formed with an organic material (referred to as an organic precursor in some cases) may be used as each of the precursor 511 to the precursor 513. As the oxidizing gas 514, a gas that can be used for the oxidizing gas 503 described in the above embodiment can be used.

First, Step S11 is performed. In Step S11, the following steps are performed in sequence: the step of introducing the precursor 511 and adsorbing a precursor containing indium on a formation surface; the step of stopping the introduction of the precursor 511 to purge the surplus precursor 511 in the chamber; the step of introducing the oxidizing gas 514 to oxidize the precursor 511 and form an In layer; and the step of stopping the introduction of the oxidizing gas 514 to purge the surplus oxidizing gas 514 in the chamber.

Next, Step S12 is performed. In Step S12, the following steps are performed in sequence: the step of introducing the precursor 512 and adsorbing a precursor containing the element M on a surface of the In layer; the step of stopping the introduction of the precursor 512 to purge the surplus precursor 512 in the chamber; the step of introducing the oxidizing gas 514 to oxidize the precursor 512 and form an M layer; and the step of stopping the introduction of the oxidizing gas 514 to purge the surplus oxidizing gas in the chamber.

Next, Step S13 is performed. In Step S13, the following steps are performed in sequence: the step of introducing the precursor 513 and adsorbing a precursor containing zinc on a surface of the M layer; the step of stopping the introduction of the precursor 513 to purge the surplus precursor 513 in the chamber; the step of introducing the oxidizing gas 514 to oxidize the precursor 513 and form a Zn layer; and the step of stopping the introduction of the oxidizing gas 514 to purge the surplus oxidizing gas 514 in the chamber.

Step S11 to Step S13 are defined as one cycle and the cycle is repeated, so that an In-M-Zn oxide with a desired thickness can be formed. Note that the element M or Zn enters the In layer in some cases by heat treatment during deposition or after deposition. In or Zn enters the M layer in some cases. In or M enters the Zn layer in some cases.

The number of times of Step S11 to Step S13 in one cycle is not limited to one. The number of times of Step S11 to Step S13 in one cycle may be determined so that an In-M-Zn oxide with a desired composition can be obtained. For example, in the case where an In-M-Zn oxide with In:M:Zn=1:1:2 [atomic ratio] is deposited, Step S11, Step S13, Step S12, and Step S13 are defined as one cycle and the cycle can be repeated. For another example, an In—Zn oxide can be deposited by repeating a cycle including Step S11 and Step S12. For another example, the precursor 513 may be introduced in the step of introducing the precursor 512 in Step S12, so that an (M, Zn) layer is formed in Step S12. For another example, the precursor 512 or the precursor 513 may be introduced in the step of introducing the precursor 511 in Step S11, so that and In layer containing the element M or Zn is formed in Step S11. A desired oxide can be deposited by combining these examples as appropriate.

Two or more manufacturing apparatuses used for deposition by the ALD method may be incorporated in a multi-chamber deposition apparatus. In that case, when an In-M-Zn oxide and a ferroelectric layer are set to be deposited in different manufacturing apparatuses, the In-M-Zn oxide and the ferroelectric layer can be successively deposited without changing the precursor and the oxidizing gas.

At least part of this embodiment can be implemented in combination with the other embodiments described in this specification as appropriate.

Embodiment 2

In this embodiment, a semiconductor device 400 including a memory device or a semiconductor device according to one embodiment of the present invention is described.

Figure 19:
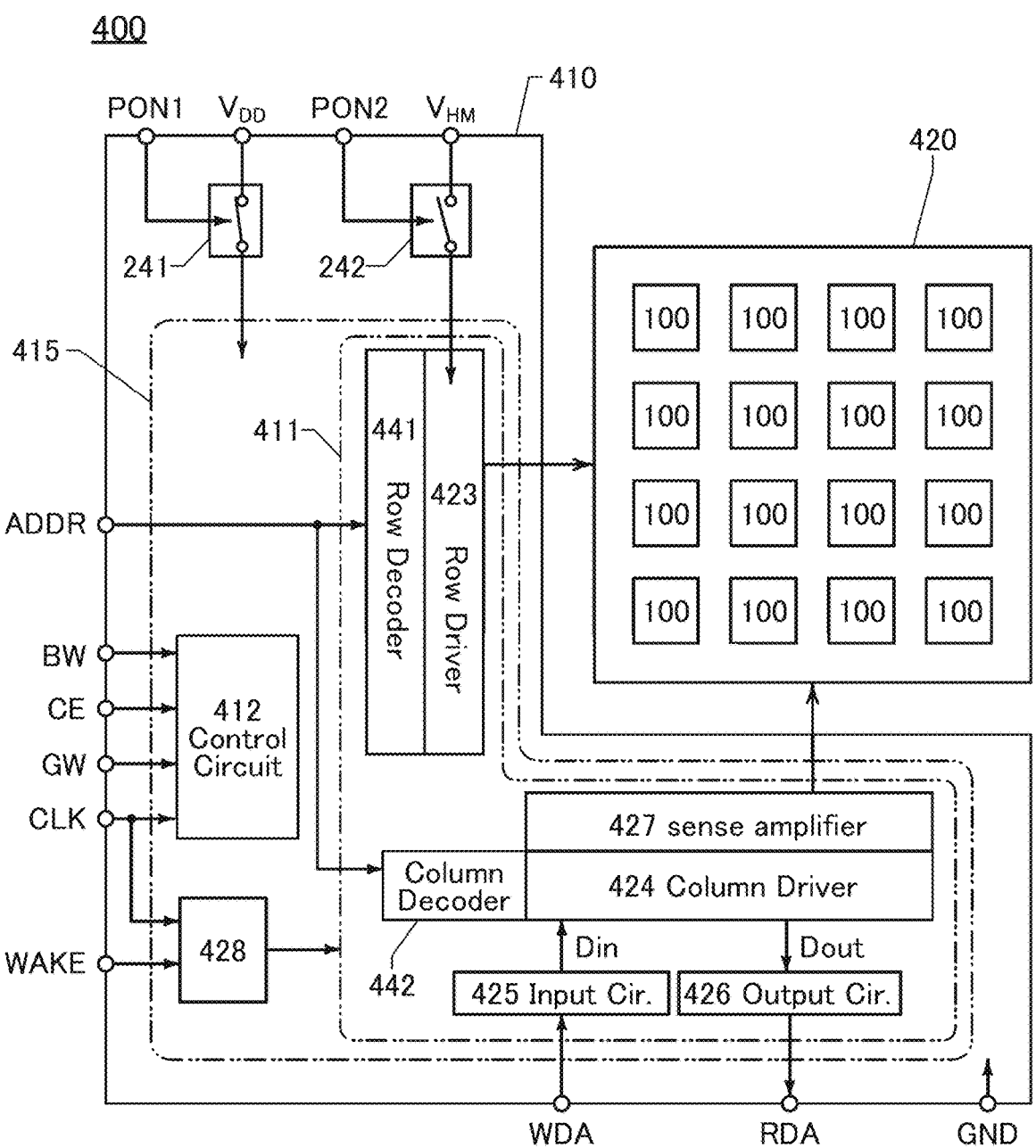
FIG. 19 is a block diagram illustrating a structure example of a semiconductor device.

FIG. 19 illustrates a block diagram illustrating a structure example of the semiconductor device 400. The semiconductor device 400 illustrated in FIG. 19 includes a driver circuit 410 and a memory array 420. The memory array 420 includes at least one memory string 100. FIG. 19 illustrates an example in which the memory array 420 includes a plurality of memory strings 100 arranged in a matrix.

The driver circuit 410 includes a PSW 241 (a power switch), a PSW 242, and a peripheral circuit 415. The peripheral circuit 415 includes a peripheral circuit 411, a control circuit 412, and a voltage generation circuit 428.

In the semiconductor device 400, each circuit, each signal, and each voltage can be appropriately selected as needed. Alternatively, another circuit or another signal may be added. Signals BW, CE, GW, CLK, WAKE, ADDR, WDA, PON1, and PON2 are signals input from the outside, and a signal RDA is a signal output to the outside. The signal CLK is a clock signal.

The signals BW and CE and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 412.

The control circuit 412 is a logic circuit having a function of controlling the overall operation of the semiconductor device 400. For example, the control circuit performs logical operation on the signal CE, the signal GW, and the signal BW to determine an operation mode of the semiconductor device 400 (e.g., write operation or read operation). Alternatively, the control circuit 412 generates a control signal for the peripheral circuit 411 so that the operation mode is executed.

The voltage generation circuit 428 has a function of generating negative voltage. The WAKE has a function of controlling the input of the CLK to the voltage generation circuit 428. For example, when an H-level signal is supplied as the WAKE, the signal CLK is input to the voltage generation circuit 428, and the voltage generation circuit 428 generates negative voltage.

The peripheral circuit 411 is a circuit for writing and reading data to and from the memory string 100. The peripheral circuit 411 includes a row decoder 441, a column decoder 442, a row driver 423, a column driver 424, an input circuit 425 (Input Cir.), an output circuit 426 (Output Cir.), and a sense amplifier 427.

The row decoder 441 and the column decoder 442 have a function of decoding the signal ADDR. The row decoder 441 is a circuit for specifying a row to be accessed, and the column decoder 442 is a circuit for specifying a column to be accessed. The row driver 423 has a function of selecting the wiring CG specified by the row decoder 441. The column driver 424 has a function of writing data to the memory string 100, a function of reading data from the memory string 100, a function of retaining the read data, and the like.

The input circuit 425 has a function of retaining the signal WDA. Data retained by the input circuit 425 is output to the column driver 424. Data output from the input circuit 425 is data (Din) to be written to the memory string 100. Data (Dout) read from the memory string 100 by the column driver 424 is output to the output circuit 426. The output circuit 426 has a function of retaining Dout. In addition, the output circuit 426 has a function of outputting Dout to the outside of the semiconductor device 400. Data output from the output circuit 426 is the signal RDA.

The PSW 241 has a function of controlling the supply of $V_{DD}$ to the peripheral circuit 415. The PSW 242 has a function of controlling the supply of $V_{HM}$ to the row driver 423. Here, in the semiconductor device 400, a high power supply voltage is $V_{DD}$ and a low power supply voltage is GND (a ground potential). In addition, $V_{HM}$ is a high power supply voltage used to set a word line at a high level and is higher than $V_{DD}$. The on/off of the PSW 241 is controlled by the signal PON1, and the on/off of the PSW 242 is controlled by the signal PON2. The number of power domains to which $V_{DD}$ is supplied is one in the peripheral circuit 415 in FIG. 19 but can be two or more. In this case, a power switch is provided for each power domain.

Figure 20:
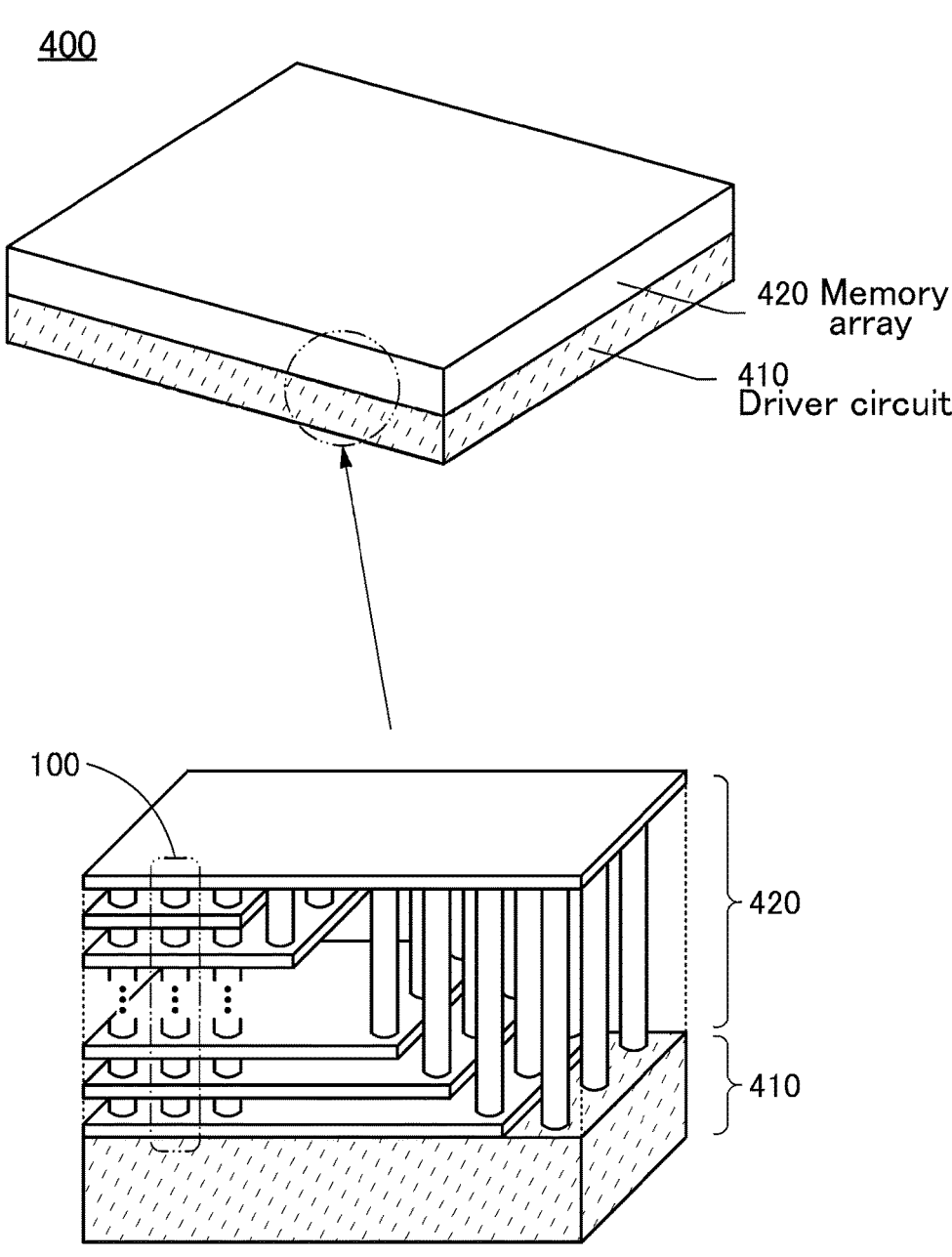
FIG. 20 is a diagram illustrating a structure example of a semiconductor device.

The driver circuit 410 and the memory array 420 that are included in the semiconductor device 400 may be provided on the same plane. As illustrated in FIG. 20, the driver circuit 410 and the memory array 420 may be provided to overlap with each other. When the driver circuit 410 and the memory array 420 are provided to overlap with each other, the signal transmission distance can be shortened. FIG. 20 illustrates a perspective view in which part of the semiconductor device 400 is enlarged.

In the semiconductor device 400, an arithmetic processing unit such as a CPU (Central Processing Unit) or a GPU (Graphics Processing Unit) may be used for the control circuit 412 included in the driver circuit 410. With the use of the CPU and/or the GPU or the like, the semiconductor device 400 that has an arithmetic processing function can be achieved.

With the use of the memory string 100 according to one embodiment of the present invention, part of the memory array 420 can function as a main memory, a cache memory, or the like. In addition, the memory string 100 can function as a flash memory. Thus, part of the memory array 420 can function as a flash memory. The semiconductor device 400 according to one embodiment of the present invention can function as a universal memory.

According to one embodiment of the present invention, functions of a CPU, a cache memory, and a storage can be achieved on the same chip.

The semiconductor device 400 illustrated in FIG. 20 includes the driver circuit 410 including a CPU and a 3D OS NAND memory device according to one embodiment of the present invention in the memory array 420. The 3D OS NAND memory device according to one embodiment of the present invention has a function of a cache memory and a function of a storage.

Figure 21:
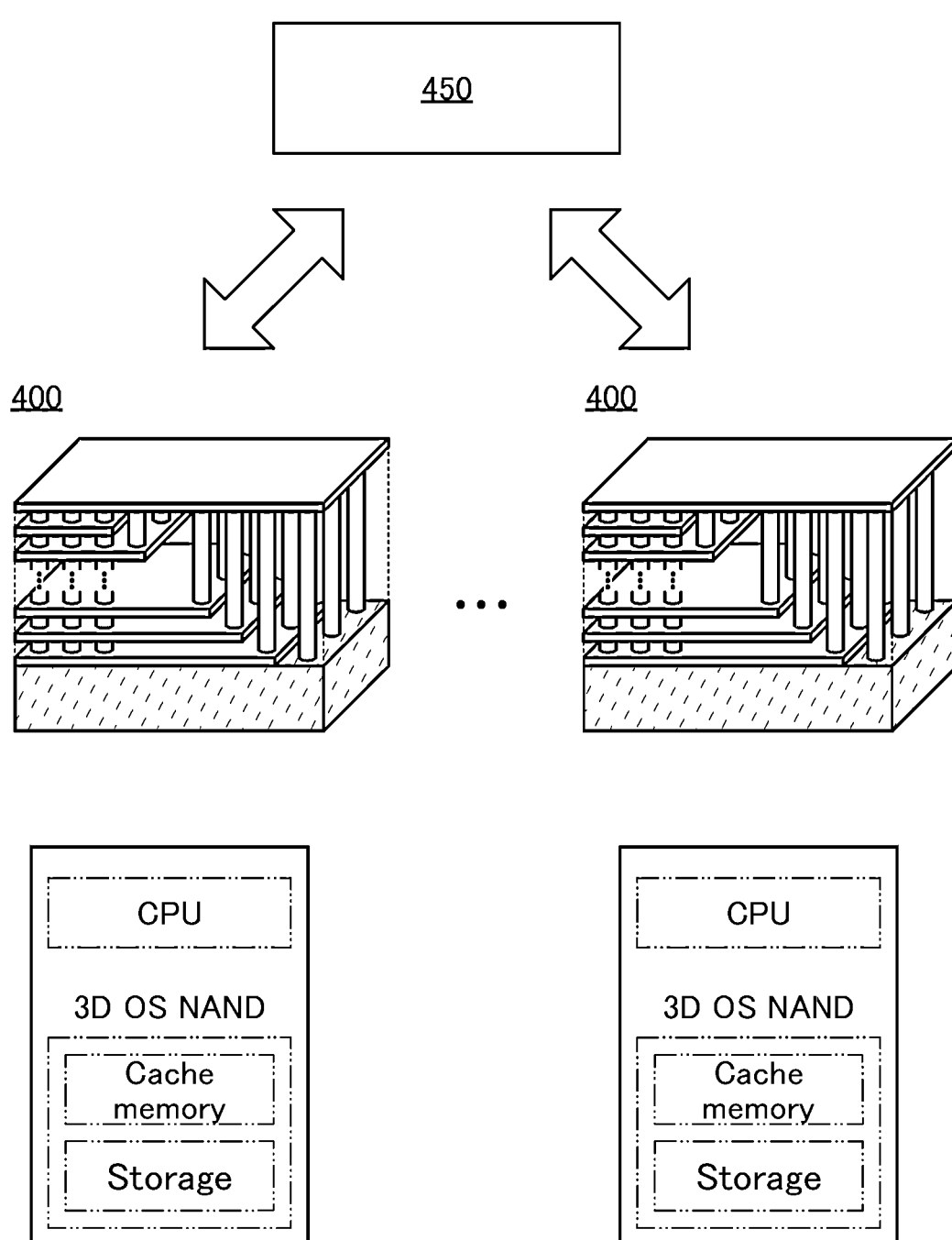
FIG. 21 is a diagram illustrating an information processing system configured with a plurality of memory devices.

FIG. 21 illustrates a state where a host 450 controls a plurality of semiconductor devices 400. Each of the semiconductor devices 400 has an arithmetic processing function, and writing to and reading from a cache memory and a storage can be parallelized. When the host 450 controls the plurality of semiconductor devices 400, an information processing system that achieves non-von Neumann computing can be constructed.

This embodiment can be combined as appropriate with any of the other embodiments and the like described in this specification.

Embodiment 3

In this embodiment, an example of an arithmetic processing unit that can include the semiconductor device such as the memory device described in the above embodiment is described.

Figure 23:
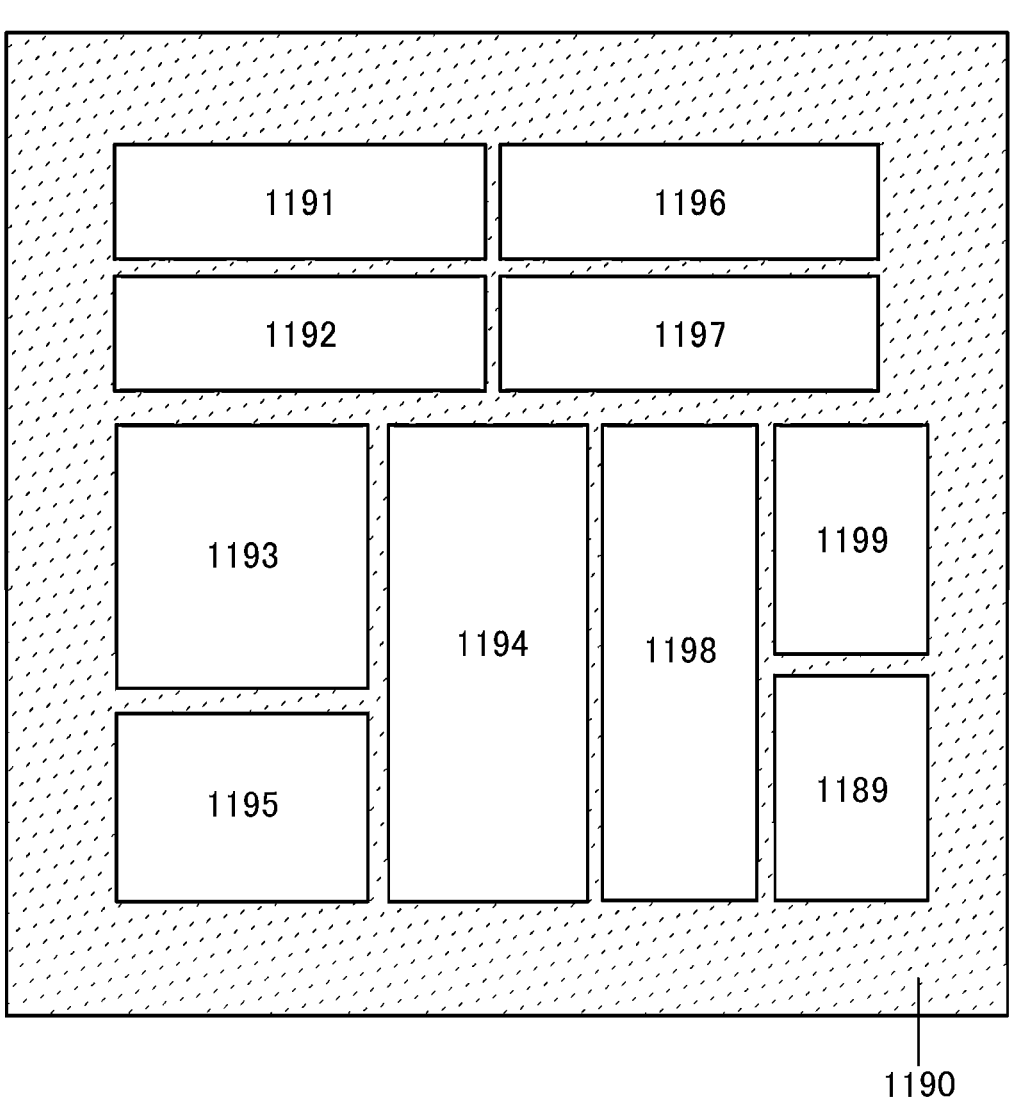
FIG. 23 is a block diagram illustrating a CPU.

FIG. 23 illustrates a block diagram of an arithmetic processing unit 1100. FIG. 23 illustrates a structure example of a CPU as a structure example that can be used for the arithmetic processing unit 1100.

The arithmetic processing unit 1100 illustrated in FIG. 23 includes, over a substrate 1190, an ALU 1191 (Arithmetic logic unit, arithmetic circuit), an ALU controller 1192, an instruction decoder 1193, an interrupt controller 1194, a timing controller 1195, a register 1196, a register controller 1197, a bus interface 1198), a cache 1199, and a cache interface 1189. A semiconductor substrate, an SOI substrate, a glass substrate, or the like is used as the substrate 1190. The arithmetic processing unit 1100 may include a rewritable ROM and a ROM interface. In addition, the cache 1199 and the cache interface 1189 may be provided in a separate chip.

The cache 1199 is connected via the cache interface 1189 to a main memory provided in another chip. The cache interface 1189 has a function of supplying part of data retained in the main memory to the cache 1199. The cache 1199 has a function of retaining the data.

The arithmetic processing unit 1100 illustrated in FIG. 23 is only an example with a simplified structure, and the actual arithmetic processing unit 1100 has a variety of structures depending on the application. For example, the arithmetic processing unit 1100 may have a structure in which a structure including the arithmetic processing unit 1100 illustrated in FIG. 23 or an arithmetic circuit is considered as one core, a plurality of cores are included, and the cores operate in parallel, namely a structure like that of a GPU. In addition, the number of bits that the arithmetic processing unit 1100 can process in an internal arithmetic circuit or in a data bus can be 8 bits, 16 bits, 32 bits, 64 bits, or the like, for example.

An instruction that is input to the arithmetic processing unit 1100 through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the arithmetic processing unit 1100 is executing a program, the interrupt controller 1194 judges an interrupt request from an external input/output device or a peripheral circuit on the basis of its priority or a mask state, and processes the request. The register controller 1197 generates an address of the register 1196, and reads or writes data from/to the register 1196 in accordance with the state of the arithmetic processing unit 1100.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator portion for generating an internal clock signal based on a reference clock signal, and supplies the internal clock signal to the above various circuits.

In the arithmetic processing unit 1100 illustrated in FIG. 23, a memory device is provided in the register 1196 and the cache 1199. As the memory device, the memory device described in the above embodiment, or the like can be used, for example.

In the arithmetic processing unit 1100 illustrated in FIG. 23, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. In the case where data retention by the flip-flop is selected, power supply voltage is supplied to the memory cell in the register 1196. In the case where data retention by the capacitor is selected, the data is rewritten into the capacitor, and supply of power supply voltage to the memory cell in the register 1196 can be stopped.

Note that the arithmetic processing unit 1100 is not limited to a CPU and may be a GPU, a DSP (Digital Signal Processor), an FPGA (Filed-Programmable Gate Array), or the like.

Figure 22A:
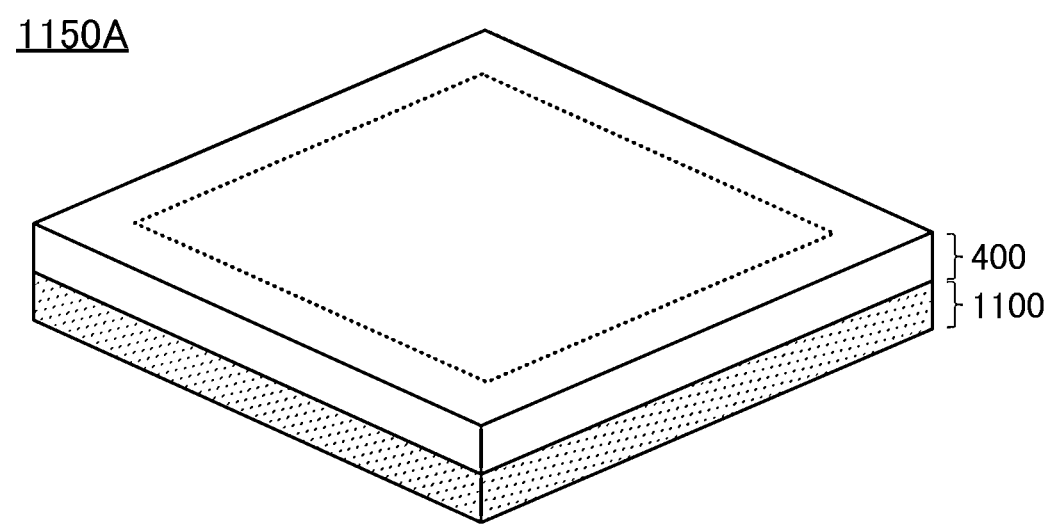
FIG. 22A and FIG. 22B are perspective views of a semiconductor device.
Figure 22B:
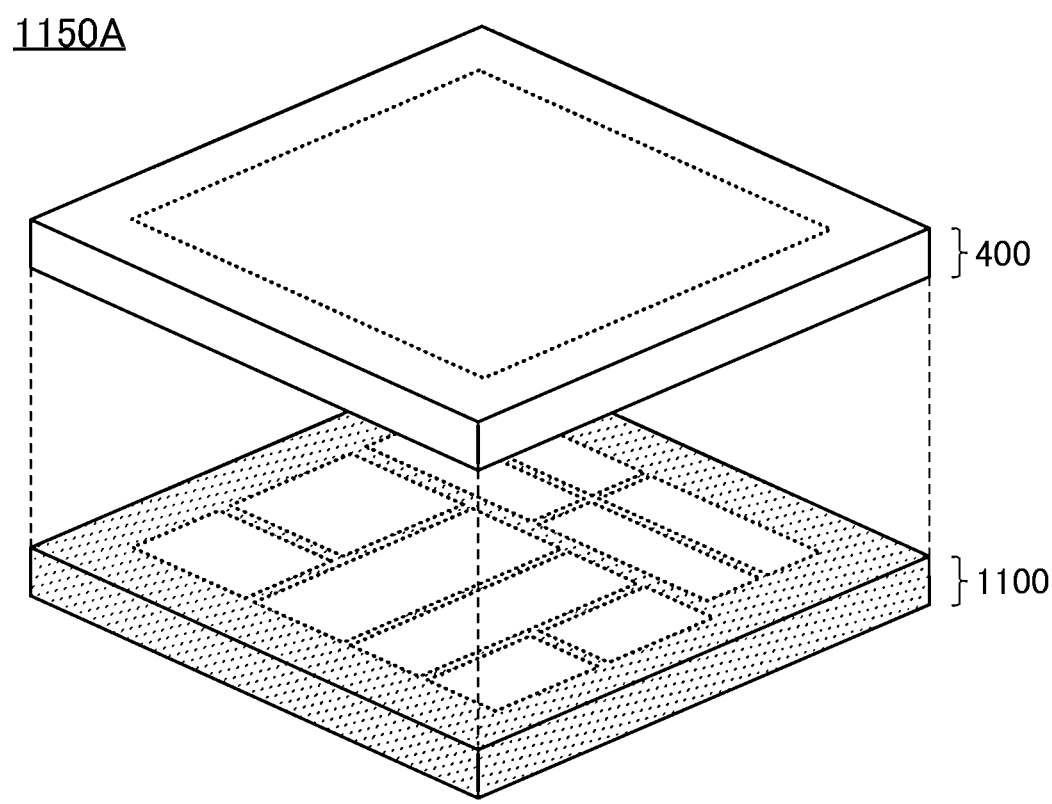

The semiconductor device 400 described in the above embodiment and the arithmetic processing unit 1100 can be provided to overlap with each other. FIG. 22(A) and FIG. 22(B) illustrate perspective views of a semiconductor device 1150A. The semiconductor device 1150A includes the semiconductor device 400 functioning as a memory device over the arithmetic processing unit 1100. The arithmetic processing unit 1100 and the semiconductor device 400 have an overlap region. For easy understanding of the structure of the semiconductor device 1150A, the arithmetic processing unit 1100 and the semiconductor device 400 are separately illustrated in FIG. 23(B).

Overlapping the semiconductor device 400 and the arithmetic processing unit 1100 can shorten the connection distance therebetween. Accordingly, the communication speed therebetween can be increased. Moreover, since the connection distance is short, power consumption can be reduced.

Figure 24A:
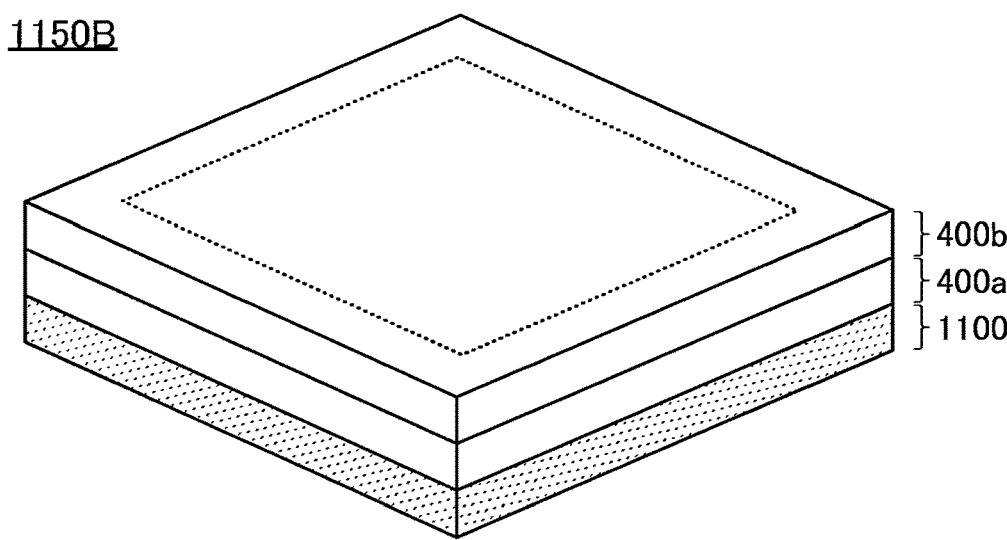
FIG. 24A and FIG. 24B are perspective views of a semiconductor device.
Figure 24B:
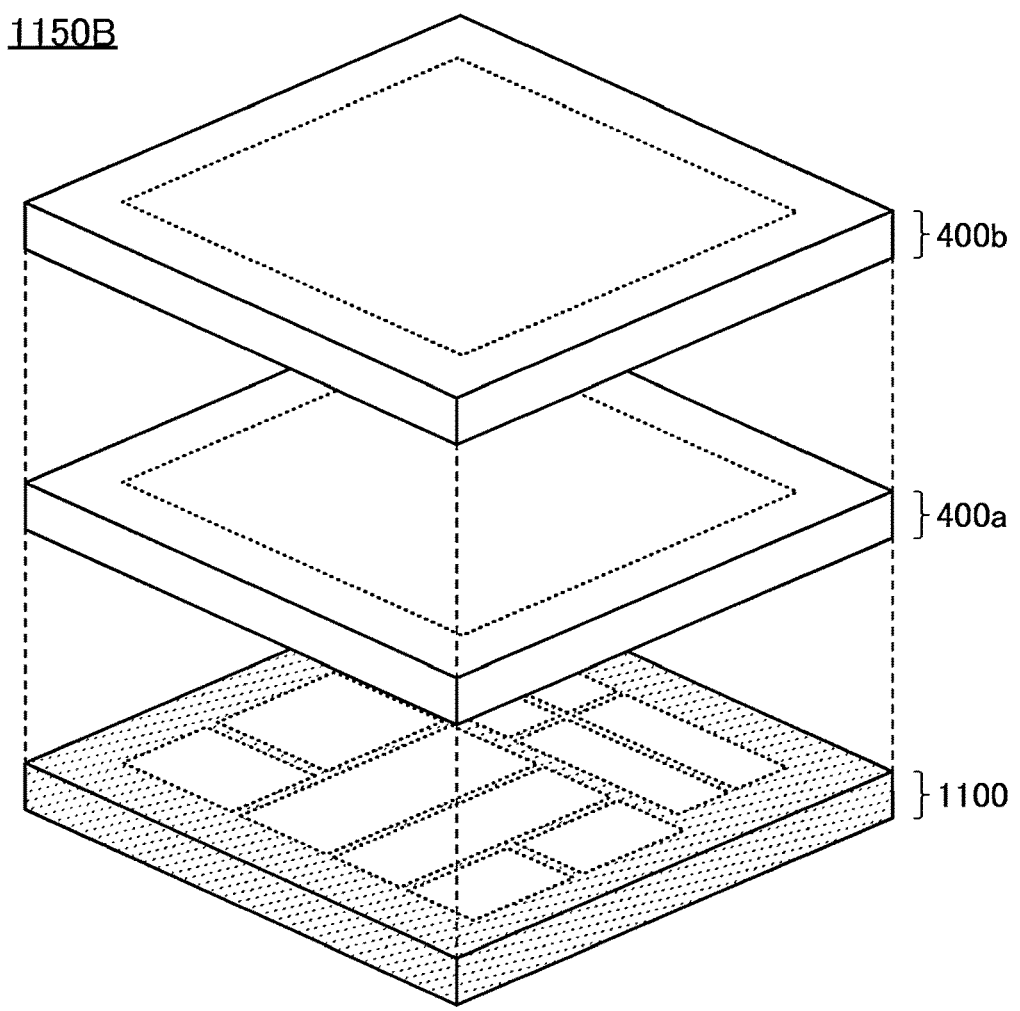

In addition, a plurality of semiconductor devices 400 may be provided to overlap with the arithmetic processing unit 1100. FIG. 24A and FIG. 24B illustrate perspective views of a semiconductor device 1150B. The semiconductor device 1150B includes a semiconductor device 400a and a semiconductor device 400b over the arithmetic processing unit 1100. The arithmetic processing unit 1100, the semiconductor device 400a, and the semiconductor device 400b have an overlap region. For easy understanding of the structure of the semiconductor device 1150B, the arithmetic processing unit 1100, the semiconductor device 400a, and the semiconductor device 400b are separately illustrated in FIG. 24B.

The semiconductor device 400a and the semiconductor device 400b function as memory devices. For example, a NOR memory device may be used for one of the semiconductor device 400a and the semiconductor device 400b, and a NAND memory device may be used for the other thereof. Both the semiconductor device 400a and the semiconductor device 400b may be NAND memory devices. Examples of the NOR memory device include a DRAM and an SRAM. A NOR memory device can operate at higher speed than a NAND memory device; thus, for example, part of the semiconductor device 400a can also be used as the main memory and/or the cache 1199. Note that the stacking order of the semiconductor device 400a and the semiconductor device 400b may be reverse.

Figure 25A:
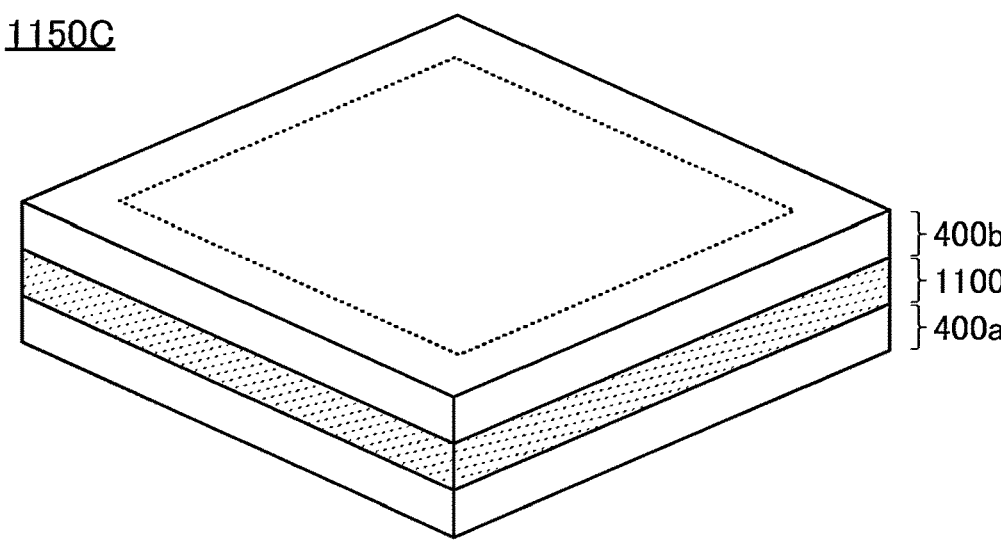
FIG. 25A and FIG. 25B are perspective views of a semiconductor device.
Figure 25B:
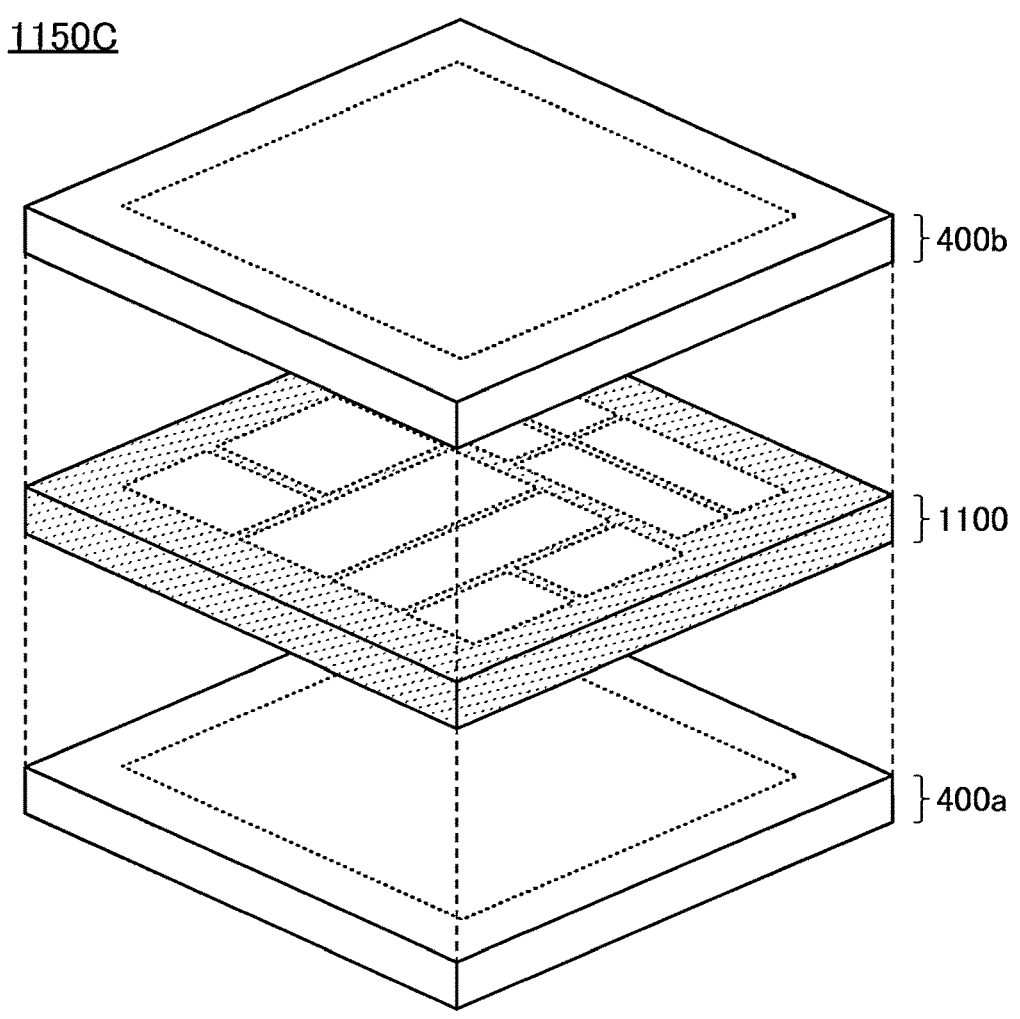

FIG. 25A and FIG. 25B illustrate perspective views of a semiconductor device 1150C. The semiconductor device 1150C has a structure in which the arithmetic processing unit 1100 is sandwiched between the semiconductor device 400a and the semiconductor device 400b. The arithmetic processing unit 1100, the semiconductor device 400a, and the semiconductor device 400b have an overlap region. For easy understanding of the structure of the semiconductor device 1150C, the arithmetic processing unit 1100, the semiconductor device 400a, and the semiconductor device 400b are separately illustrated in FIG. 25B.

With the structure of the semiconductor device 1150C, the communication speed between the semiconductor device 400a and the arithmetic processing unit 1100 and the communication speed between the semiconductor device 400b and the arithmetic processing unit 1100 can be both increased. Moreover, power consumption can be reduced compared to the semiconductor device 1150B.

This embodiment can be combined as appropriate with any of the other embodiments and the like described in this specification.

Embodiment 4

In this embodiment, examples of a semiconductor wafer where the semiconductor device or the like described in the above embodiment is formed and electronic components incorporating the semiconductor device are described.

<Semiconductor Wafer>

First, an example of a semiconductor wafer where a semiconductor device or the like is formed is described using FIG. 26A.

A semiconductor wafer 4800 illustrated in FIG. 26A includes a wafer 4801 and a plurality of circuit portions 4802 provided on a top surface of the wafer 4801. Note that a portion without the circuit portion 4802 on the top surface of the wafer 4801 is a spacing 4803 that is a region for dicing.

The semiconductor wafer 4800 can be manufactured by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. Dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

With the dicing step, a chip 4800a as illustrated in FIG. 26B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate according to one embodiment of the present invention is not limited to the shape of the semiconductor wafer 4800 illustrated in FIG. 26A. The element substrate may be a rectangular semiconductor wafer, for example. The shape of the element substrate can be changed as appropriate, depending on a manufacturing process of an element and an apparatus for manufacturing the element.

<Electronic Component>

FIG. 26C illustrates a perspective view of an electronic component 4700 and a substrate (a mounting board 4704) on which the electronic component 4700 is mounted. The electronic component 4700 illustrated in FIG. 26C includes a chip 4800a in a mold 4711. As the chip 4800a, the memory device or the like according to one embodiment of the present invention can be used.

To illustrate the inside of the electronic component 4700, some portions are omitted in FIG. 26C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

FIG. 26D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor device 4710 include the chip 4800a, the semiconductor device described in the above embodiment, and a high bandwidth memory (HBM). In addition, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. Furthermore, a through electrode is provided in the interposer 4731 and the through electrode is used to electrically connect an integrated circuit and the package substrate 4732 in some cases. Moreover, in the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In addition, in a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 26D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be combined as appropriate with any of the other embodiments and the like described in this specification.

Embodiment 5

In this embodiment, application examples of the memory device according to one embodiment of the present invention are described.

The memory device according to one embodiment of the present invention can be applied to, for example, memory devices of a variety of electronic devices (e.g., information terminals, computers, smartphones, e-book readers, digital still cameras, video cameras, video recording/reproducing devices, navigation systems, game machines, and the like). In addition, the memory device can also be used for image sensors, IoT (Internet of Things), healthcare, and the like. Note that here, the computers refer not only to tablet computers, laptop computers, and desktop computers, but also to large computers such as server systems.

An example of an electronic device including a memory device according to one embodiment of the present invention is described. Note that FIG. 27A to FIG. 27J and FIG. 28A to FIG. 28E each illustrate a state where the electronic component 4700 or the electronic component 4730, each of which includes the memory device, is included in an electronic device.

[Cellular Phone]

An information terminal 5500 illustrated in FIG. 27A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

By using the memory device according to one embodiment of the present invention, the information terminal 5500 can retain a temporary file generated at the time of executing an application (e.g., a web browser's cache or the like).

[Wearable Terminal]

In addition, FIG. 27B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by using the memory device according to one embodiment of the present invention.

[Information Terminal]

In addition, FIG. 27C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application by using the memory device according to one embodiment of the present invention.

Although the smartphone, the wearable terminal, and the desktop information terminal are respectively illustrated in FIG. 27A to FIG. 27C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

FIG. 27D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The memory device according to one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, the memory device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machine]

In addition, FIG. 27E illustrates a portable game machine 5200 as an example of a game machine. The portable game machine 5200 includes a housing 5201, a display portion 5202, a button 5203, and the like.

In addition, FIG. 27F illustrates a stationary game machine 7500 as another example of a game machine. The stationary game machine 7500 includes a main body 7520 and a controller 7522. Note that the controller 7522 can be connected to the main body 7520 with or without a wire. Although not illustrated in FIG. 27F, the controller 7522 can include a display portion that displays a game image, and an input interface besides a button, such as a touch panel, a stick, a rotating knob, or a sliding knob, for example. The shape of the controller 7522 is not limited to that illustrated in FIG. 27F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

By using the memory device described in the above embodiment, the portable game machine 5200 or the stationary game machine 7500 can achieve low power consumption.

Moreover, heat generation from a circuit can be reduced owing to low power consumption; thus, the influence of heat generation on the circuit itself, a peripheral circuit, and a module can be reduced.

Moreover, by using the memory device described in the above embodiment, the portable game machine 5200 or the stationary game machine 7500 can retain a temporary file necessary for arithmetic operation that occurs during game play.

As an example of a game machine, FIG. 27E illustrates a portable game machine. In addition, FIG. 27F illustrates a home-use stationary game machine. Note that an electronic device according to one embodiment of the present invention is not limited thereto. Examples of the electronic device according to one embodiment of the present invention include an arcade game machine installed in entertainment facilities (a game center, an amusement park, and the like), a throwing machine for batting practice installed in sports facilities, and the like.

[Moving Vehicle]

The memory device described in the above embodiment can be used for a motor vehicle, which is a moving vehicle, and around the driver's seat in a motor vehicle.

FIG. 27G illustrates a motor vehicle 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the motor vehicle 5700. In addition, a display device showing the above information may be provided around the driver's seat.

In particular, the display device can compensate for the view obstructed by a pillar or the like, blind areas for the driver's seat, and the like by displaying a video from an imaging device (not illustrated) provided for the motor vehicle 5700, which can increase safety. That is, display of an image from an imaging device provided on the outside of the motor vehicle 5700 can fill in blind areas and increase safety.

The memory device described in the above embodiment can temporarily retain data; thus, the memory device can be used to retain temporary data necessary in an automatic driving system for the motor vehicle 5700 and a system for navigation and risk prediction, for example. The display device may be configured to display temporary information regarding navigation, risk prediction, or the like. Moreover, the memory device may be configured to retain a video of a driving recorder provided in the motor vehicle 5700.

Although a motor vehicle is described above as an example of a moving vehicle, the moving vehicle is not limited to a motor vehicle. Examples of moving vehicles include a train, a monorail train, a ship, and a flying object (a helicopter, an unmanned aircraft (a drone), an airplane, and a rocket).

[Camera]

The memory device described in the above embodiment can be used in a camera.

FIG. 27H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Although the digital camera 6240 is configured here such that the lens

6246 is detachable from the housing 6241 for replacement, the lens 6246 may be integrated with the housing 6241. In addition, the digital camera 6240 can be additionally equipped with a stroboscope, a viewfinder, or the like.

When the memory device described in the above embodiment is used in the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The memory device described in the above embodiment can be used in a video camera.

FIG. 27I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. By using the above memory device, the video camera 6300 can retain a temporary file generated in encoding.

[ICD]

The memory device described in the above embodiment can be used in an implantable cardioverter-defibrillator (ICD).

FIG. 27J is a schematic cross-sectional view showing an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor or the like, the number of times the treatment with pacing is performed, and the time taken for the treatment, for example, can be stored in the electronic component 4700.

The antenna 5404 can receive power, and the battery 5401 is charged with the power. Furthermore, when the ICD main unit 5400 includes a plurality of batteries, safety can be increased. Specifically, even when some of the batteries in the ICD main unit 5400 are dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The memory device described in the above embodiment can be used in a calculator such as a PC (Personal Computer) and an expansion device for an information terminal.

Figure 28A:
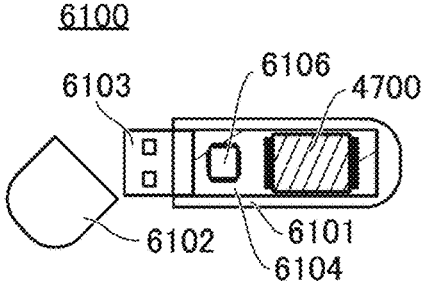
FIG. 28A to FIG. 28E are each a perspective view or a schematic view illustrating an example of an electronic device.

FIG. 28A illustrates, as an example of the expansion device, a portable expansion device 6100 that includes a chip capable of retaining information and is externally provided on a PC. The expansion device 6100 can store information using the chip when connected to a PC with a USB (Universal Serial Bus) or the like, for example. Note that FIG. 28A illustrates the portable expansion device 6100; however, the expansion device according to one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

[SD Card]

The memory device described in the above embodiment can be used in an SD card that can be attached to an electronic device such as an information terminal or a digital camera.

Figure 28B:
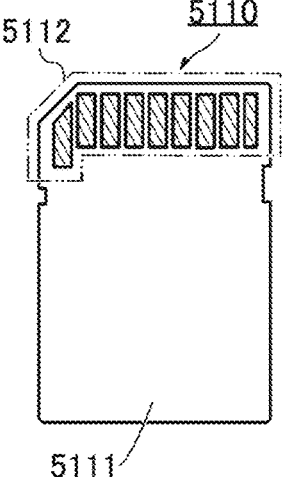
Figure 28C:
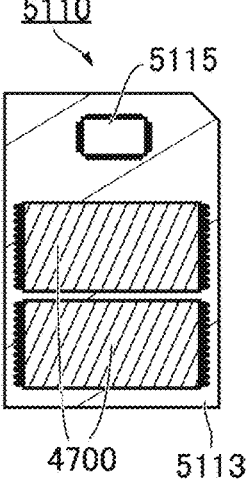

FIG. 28B is a schematic external view of an SD card, and FIG. 28C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The memory device described in the above embodiment can be used in an SSD (Solid State Drive) that can be attached to an electronic device such as an information terminal.

Figure 28D:
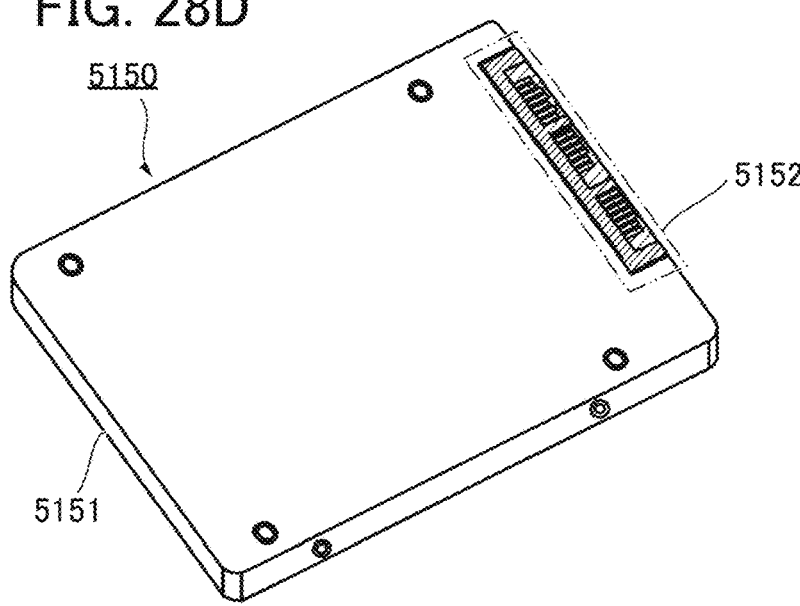
Figure 28E:
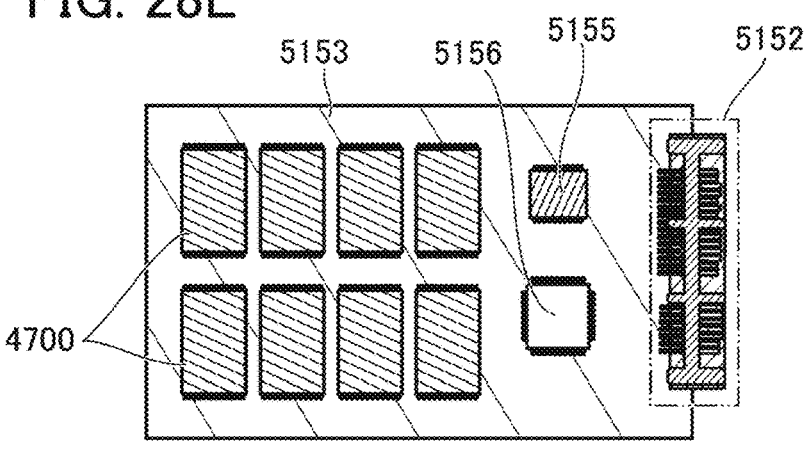

FIG. 28D is a schematic external view of an SSD, and FIG. 28E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 4700, the memory chip 5155, and the controller chip 5115 are not limited to those described above, and the circuit structures can be changed as appropriate according to circumstances. For example, a memory functioning as a work memory may also be provided in the controller chip 5156.

[Computer]

Figure 29A:
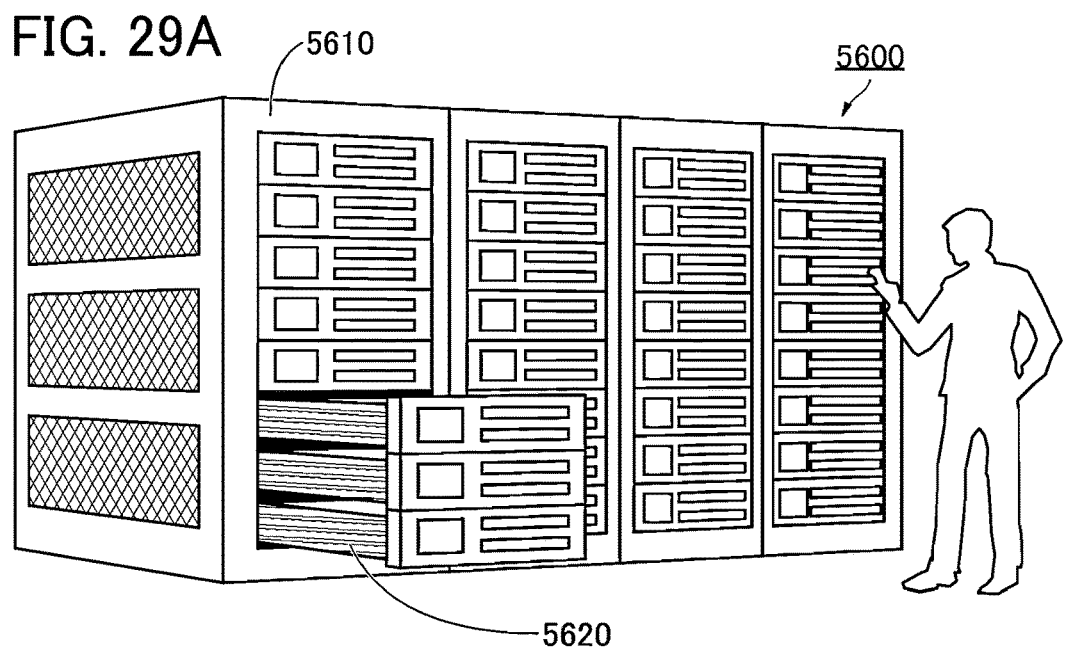
FIG. 29A to FIG. 29C are diagrams each illustrating an example of an electronic device.

A computer 5600 illustrated in FIG. 29A is an example of a large computer. In the computer 5600, a plurality of rack mount computers 5620 are stored in a rack 5610.

Figure 29B:
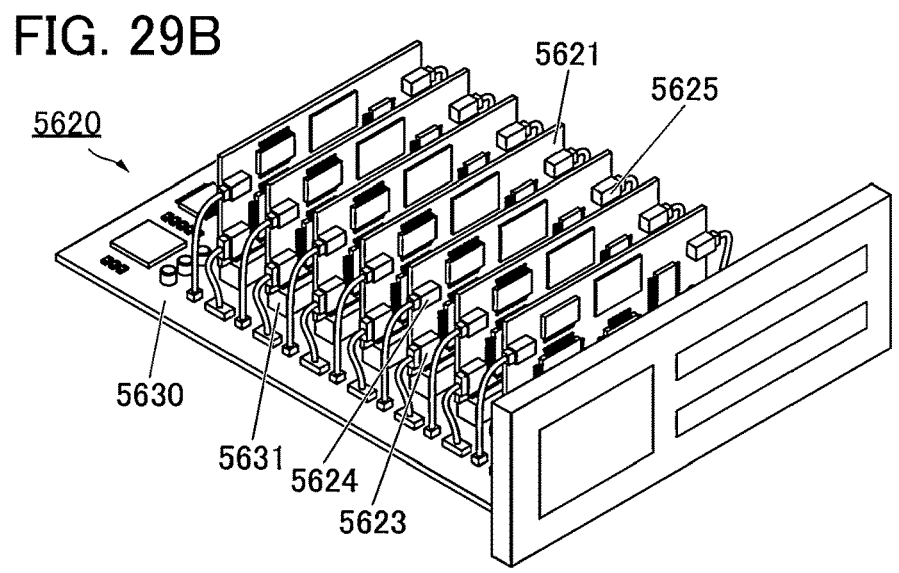

The computer 5620 can have a structure in a perspective view illustrated in FIG. 29B, for example. In FIG. 29B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 29C:
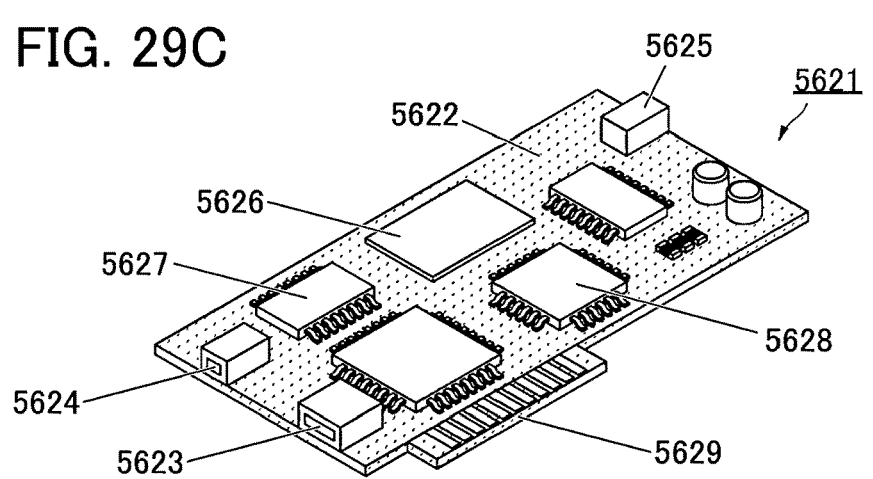

The PC card 5621 illustrated in FIG. 29C is an example of a processing board provided with a CPU, a GPU, a memory device, and the like. The PC card 5621 includes a board 5622. The board 5622 includes a connection terminal 5623, a connection terminal 5624, a connection terminal 5625, a semiconductor device 5626, a semiconductor device 5627, a semiconductor device 5628, and a connection terminal 5629. Note that FIG. 29C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device or the like. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device according to one embodiment of the present invention is used in a variety of electronic devices or the like described above, so that a reduction in size, an increase in speed, or a reduction in power consumption of the electronic device can be achieved. In addition, since the semiconductor device according to one embodiment of the present invention has low power consumption, heat generation from a circuit can be reduced. Accordingly, it is possible to reduce adverse effects of the heat generation on the circuit itself, a peripheral circuit, and a module. Furthermore, the use of the semiconductor device according to one embodiment of the present invention can achieve an electronic device that operates stably even in a high temperature environment. Thus, the reliability of the electronic devices can be increased.

Figure 30:
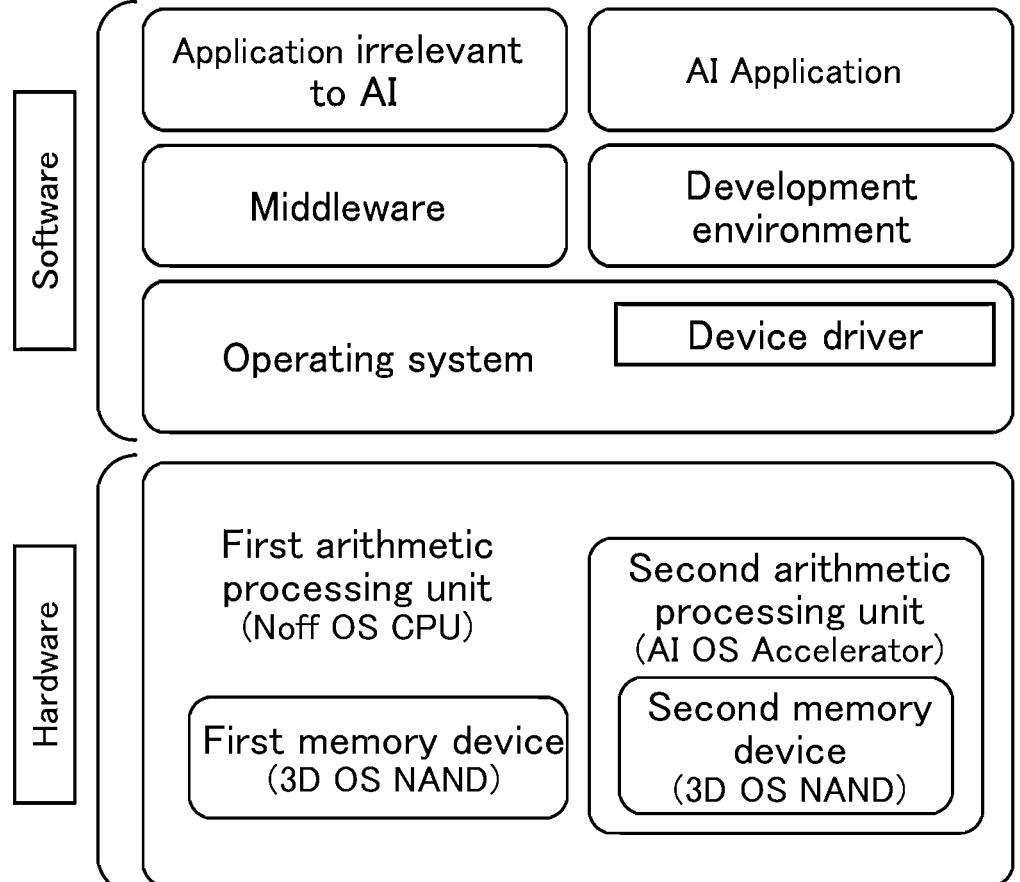
FIG. 30 is a diagram showing a structure example of a computer system.

Next, a structure example of a computer system that can be used for the computer 5600 is described. FIG. 30 is a diagram illustrating a structure example of a computer system 700. The computer system 700 is made of software and hardware. Note that the hardware included in the computer system is sometimes referred to as an information processing device.

Examples of the software included in the computer system 700 include operating systems including device drivers, middleware, a variety of development environments, application programs related to AI (AI Application), and application programs irrelevant to AI (Application).

The device drivers include, for example, application programs for controlling externally connected devices such as an auxiliary memory device, a display device, and a printer.

The hardware included in the computer system 700 includes a first arithmetic processing unit, a second arithmetic processing unit, a first memory device, and the like. In addition, the second arithmetic processing unit includes a second memory device.

As the first arithmetic processing unit, a central processing unit such as an Noff OS CPU is preferably used, for example. The Noff OS CPU includes a memory means using OS transistors (e.g., a nonvolatile memory), and has a function of storing necessary data in the memory means and stopping power supply to the central processing unit when it does not need to operate. The use of the Noff OS CPU as the first arithmetic processing unit can reduce the power consumption of the computer system 700.

As the second arithmetic processing unit, a GPU, an FPGA, or the like can be used, for example. Note that as the second arithmetic processing unit, an AI OS Accelerator is preferably used. The AI OS Accelerator is composed of OS transistors and includes an arithmetic means such as a product-sum operation circuit. The power consumption of the AI OS Accelerator is lower than that of a common GPU or the like. The use of the AI OS Accelerator as the second arithmetic processing unit can reduce the power consumption of the computer system 700.

As the first memory device and the second memory device, the memory device according to one embodiment of the present invention is preferably used. For example, the 3D OS NAND memory device is preferably used. The 3D OS NAND memory device can function as a cache, a main memory, and storage. In addition, the use of the 3D OS NAND memory device facilitates fabrication of a non-von Neumann computer system.

The power consumption of the 3D OS NAND memory device is lower than that of a 3D NAND memory device using Si transistors. The use of the 3D OS NAND memory device as the memory devices can reduce the power consumption of the computer system 700. In addition, the 3D OS NAND memory device can function as a universal memory, so that the number of components included in the computer system 700 can be reduced.

When the semiconductor device constituting the hardware is configured with a semiconductor device including OS transistors, the hardware including the central processing unit, the arithmetic processing unit, and the memory device can be easily monolithic. Making the hardware monolithic facilitates a further reduction in power consumption as well as a reduction in size, weight, and thickness.

This embodiment can be combined as appropriate with any of the other embodiments and the like described in this specification.

Embodiment 6

A normally-off CPU (also referred to as "Noff-CPU") can be achieved using the OS memory described in this specification and the like. Note that the Noff-CPU is an integrated circuit including a normally-off transistor, which is in a non-conducting state (also referred to as an off state) even when gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain information necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

The Noff-CPU can be suitably used for a small-scale system such as an IoT (Internet of Things) end device (also referred to as an "endpoint microcomputer") 803 in the IoT field, for example.

Figure 31:
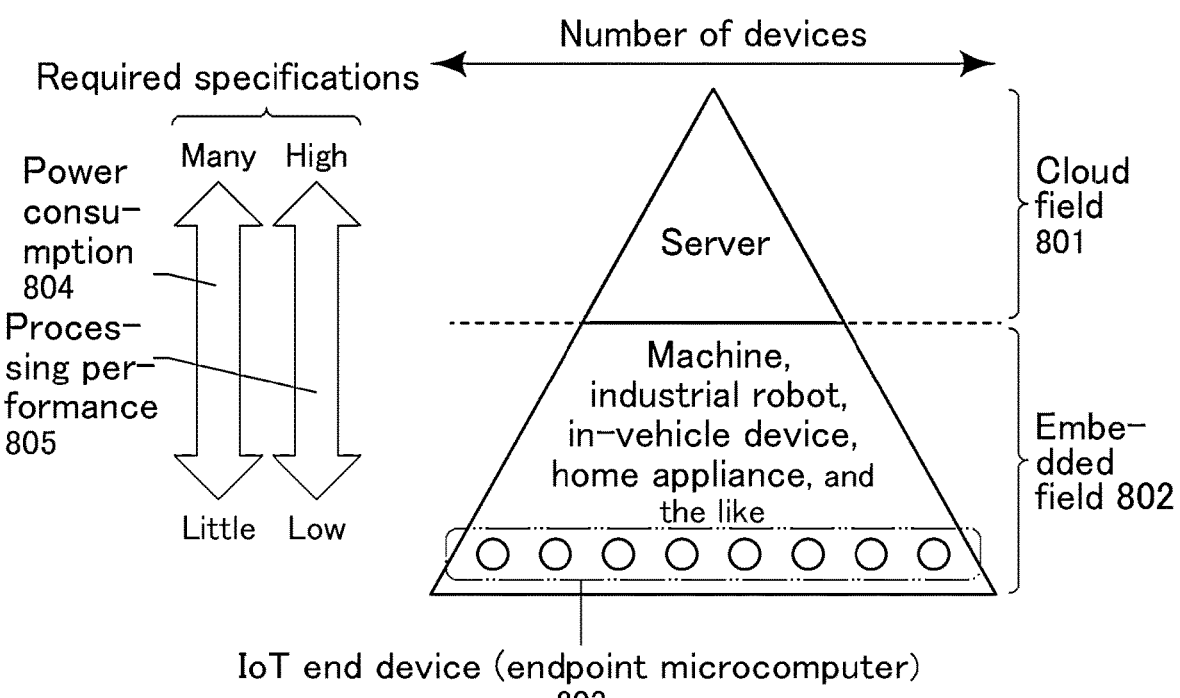
FIG. 31 is a diagram illustrating a hierarchical structure of an IoT network and tendencies of required specifications.

FIG. 31 shows a hierarchical structure of an IoT network and tendencies of required specifications. FIG. 31 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased. The semiconductor device according to one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 32:
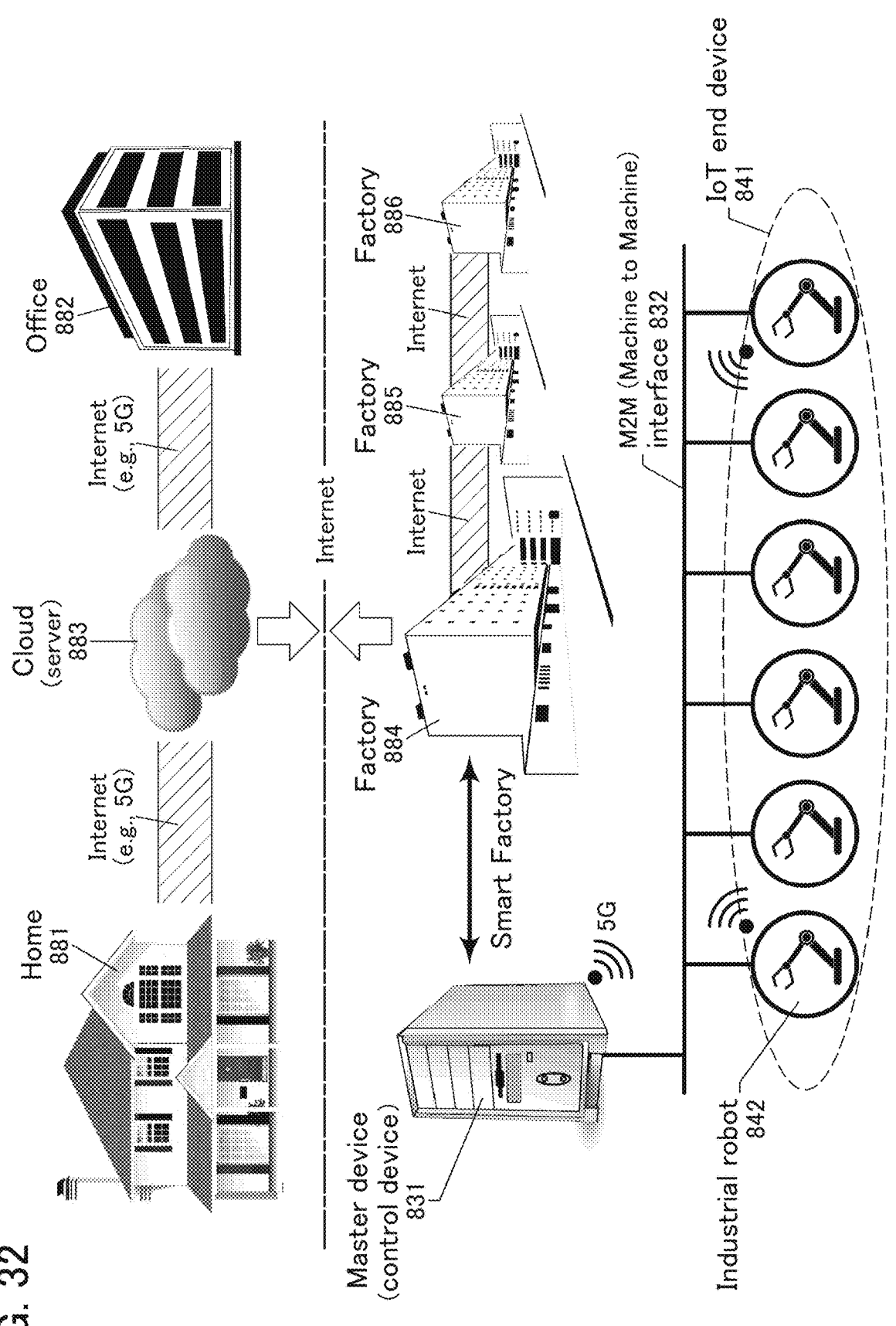
FIG. 32 is a conceptual diagram of factory automation.

FIG. 32 shows an image diagram of factory automation as an application example of the endpoint microcomputer. A factory 884 is connected to a cloud 883 through Internet connection. In addition, the cloud 883 is connected to a home 881 and an office 882 through Internet connection (Internet). The Internet connection may be either wired communication or wireless communication. In the case of wireless communication, for example, wireless communication based on a communication standard such as the fourth-generation mobile communication system (4G) or the fifth-generation mobile communication system (5G) can be performed using the semiconductor device according to one embodiment of the present invention for a communication device. Furthermore, the factory 884 may be connected to a factory 885 and a factory 886 through Internet connection.

The factory 884 includes a master device (control device) 831. The master device 831 is connected to the cloud 883 and has a function of transmitting and receiving information. The master device 831 is also connected to a plurality of industrial robots 842 included in an IoT end device 841 through a M2M (Machine to Machine) interface 832. As the M2M interface 832, for example, industrial Ethernet ("Ethernet" is a registered trademark), which is a kind of wired communication, or local 5G, which is a kind of wireless communication, may be used.

A manager of the factory can know the operation status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures or prediction of abnormality, for example.

The total power consumption of a small-scale system such as an endpoint microcomputer during operation is often small; thus, the proportion of the power consumption of the CPU tends to be large. For that reason, for a small-scale system such as an endpoint microcomputer, a power reduction effect in a standby operation by the Noff-CPU becomes large. Meanwhile, the embedded field of IoT sometimes requires quick response, and the use of the Noff-CPU achieves high-speed return from a standby state.

Note that this embodiment can be combined as appropriate with any of the other embodiments and the like described in this specification.

REFERENCE NUMERALS

100: memory string, 100A to 100D: memory string, 101: conductive layer, 102: insulating layer, 103: conductive layer, 103a, 103b: conductive layer, 104: conductive layer, 105: insulating layer, 106: conductive layer, 110: structure body, 110A: structure body, 111: insulating layer, 112: semiconductor layer, 114: functional layer, 115: insulating layer, 116: insulating layer, 117: insulating layer, 118: insulating layer, 121: insulating layer, 131: central axis, 132: region, 141: conductive layer, 142: insulating layer, 145: opening, 150: memory cell, 151: transistor, 152: capacitor, 160: transistor, 170: memory element

The invention claimed is:

1. A semiconductor device comprising:
   a first conductive layer extending in a first direction;
   a structure body extending in a second direction intersecting with the first direction; and
   a first insulating layer and a second insulating layer,
   wherein the structure body comprises a functional layer, a seventh insulating layer, a semiconductor layer, a third insulating layer, and a second conductive layer,
   wherein in an intersection portion of the first conductive layer and the structure body, the third insulating layer, the semiconductor layer, and the functional layer are placed concentrically around the second conductive layer in this order,
   wherein the first insulating layer and the second insulating layer are stacked in the second direction,
   wherein the seventh insulating layer, the functional layer, and the first conductive layer are placed between the first insulating layer and the second insulating layer,
   wherein the seventh insulating layer is provided in contact with a top surface, a bottom surface, and a side surface of the functional layer,
   wherein the seventh insulating layer comprises a portion in contact with the first conductive layer, and
   wherein the second conductive layer, the third insulating layer, and the semiconductor layer comprise a portion positioned inside a first opening provided in the first insulating layer and a portion positioned inside a second opening provided in the second insulating layer.

2. A semiconductor device comprising:
   a first conductive layer extending in a first direction;
   a structure body extending in a second direction intersecting with the first direction; and
   a first insulating layer and a second insulating layer,
   wherein the structure body comprises a functional layer, a third conductive layer, and a fourth insulating layer,
   wherein in an intersection portion of the first conductive layer and the structure body, the third conductive layer and the functional layer are placed concentrically around the fourth insulating layer in this order,
   wherein the first insulating layer and the second insulating layer are stacked in the second direction, wherein the functional layer and the first conductive layer are placed between the first insulating layer and the second insulating layer, wherein the functional layer comprises a portion in contact with the third conductive layer, and wherein the third conductive layer and the fourth insulating layer comprise a portion positioned inside a first opening provided in the first insulating layer and a portion positioned inside a second opening provided in the second insulating layer.

3. A semiconductor device comprising:

a first conductive layer and a fourth conductive layer extending in a first direction;

a structure body extending in a second direction intersecting with the first direction; and a first insulating layer, a second insulating layer, and a fifth insulating layer, wherein the structure body comprises a first portion and a second portion, wherein the first portion comprises a functional layer, a semiconductor layer, a third insulating layer, and a second conductive layer, wherein the second portion comprises a sixth insulating layer, the semiconductor layer, the third insulating layer, and the second conductive layer, wherein in an intersection portion of the first conductive layer, the fourth conductive layer, and the structure body, the third insulating layer, the semiconductor layer, and the functional layer are placed concentrically around the second conductive layer in this order in the first portion; and the third insulating layer, the semiconductor layer, and the sixth insulating layer are placed concentrically around the second conductive layer in this order in the second portion, wherein the functional layer and the first conductive layer are placed between the first insulating layer and the second insulating layer, wherein the fourth conductive layer is placed between the second insulating layer and the fifth insulating layer, and wherein the second conductive layer, the third insulating layer, and the semiconductor layer comprise a portion positioned inside a first opening provided in the first insulating layer, a portion positioned inside a second opening provided in the second insulating layer, and a portion positioned inside a third opening provided in the fifth insulating layer.

4. The semiconductor device according to claim 1, further comprising an eighth insulating layer, wherein the eighth insulating layer is placed between the semiconductor layer and the functional layer.

5. The semiconductor device according to claim 4, wherein the eighth insulating layer comprises silicon and nitrogen.

6. The semiconductor device according to claim 1, wherein the first direction is orthogonal to the second direction.

7. The semiconductor device according to claim 1, wherein the intersection portion functions as a memory cell.

8. The semiconductor device according to claim 1, wherein the semiconductor layer comprises at least one of indium and zinc.

9. The semiconductor device according to claim 1, wherein the functional layer exhibits ferroelectricity or anti-ferroelectricity.

10. The semiconductor device according to claim 1, wherein the functional layer comprises one or both of hafnium oxide and zirconium oxide.

* * * * *